US012615480B2

(12) United States Patent
Mawatari et al.

(10) Patent No.: US 12,615,480 B2
(45) Date of Patent: Apr. 28, 2026

(54) PIEZOELECTRIC ACCOUSTIC SENSOR WITH MULTIPLE VIBRATING AREAS

(71) Applicant: DENSO CORPORATION, Kariya-city (JP)

(72) Inventors: Kazuaki Mawatari, Kariya-city (JP); Minekazu Sakai, Kariya-city (JP); Yuuji Koyama, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 1007 days.

(21) Appl. No.: 17/716,259

(22) Filed: Apr. 8, 2022

(65) Prior Publication Data

US 2022/0232328 A1    Jul. 21, 2022

Related U.S. Application Data

(63) Continuation of application No. PCT/JP2020/044651, filed on Dec. 1, 2020.

(30) Foreign Application Priority Data

Dec. 25, 2019    (JP) ................................. 2019-235224
Jul. 24, 2020    (JP) ................................. 2020-125990

(Continued)

(51) Int. Cl.
*H04R 17/02*        (2006.01)
*B81B 3/00*        (2006.01)

(Continued)

(52) U.S. Cl.
CPC ............... *H04R 17/02* (2013.01); *B81B 3/00* (2013.01); *H04R 1/04* (2013.01); *H04R 3/00* (2013.01);

(Continued)

(58) Field of Classification Search
CPC .................................................... H10B 41/42
See application file for complete search history.

(56) References Cited

U.S. PATENT DOCUMENTS 5,289,721 A        3/1994    Tanizawa et al.
5,856,620 A    *    1/1999    Okada ..................... G01P 15/18
                                                    73/514.32

(Continued)

FOREIGN PATENT DOCUMENTS

CN        207854171 U        9/2018
CN        109286883 A    *    1/2019    ............. H04R 19/04

(Continued)

*Primary Examiner* — Peter Bradford
(74) *Attorney, Agent, or Firm* — Posz Law Group, PLC

(57) ABSTRACT

A piezoelectric element includes: a vibration unit that outputs a pressure detection signal according to a pressure; a support member; and an improvement unit for improving a detection accuracy of the pressure detection signal. The vibration unit on the support member includes a piezoelectric film and an electrode film in a support region and vibration regions. Each vibration region has one end portion as a fixed end and an other end portion as a free end. A part of each vibration region on a one end portion side is a first region, and another part of each vibration region on an other end portion side is a second region. The electrode film is disposed in the first region.

24 Claims, 34 Drawing Sheets

(30) Foreign Application Priority Data

| | | |
|---|---|---|
| Oct. 22, 2020 | (JP) | ................................ 2020-177170 |
| Oct. 28, 2020 | (WO) | ................. PCT/JP2020/040471 |

(51) Int. Cl.

| | |
|---|---|
| *H04R 1/04* | (2006.01) |
| *H04R 3/00* | (2006.01) |
| *H04R 7/06* | (2006.01) |
| *H04R 7/18* | (2006.01) |
| *H04R 29/00* | (2006.01) |
| *H04R 31/00* | (2006.01) |
| *H10N 30/30* | (2023.01) |
| *H10N 30/88* | (2023.01) |
| *G01K 7/16* | (2006.01) |

(52) U.S. Cl.

CPC ................. *H04R 7/06* (2013.01); *H04R 7/18* (2013.01); *H04R 29/004* (2013.01); *H04R 31/003* (2013.01); *H04R 31/006* (2013.01); *H10N 30/306* (2023.02); *H10N 30/88* (2023.02); *G01K 7/16* (2013.01)

(56) References Cited

U.S. PATENT DOCUMENTS

| | | | |
|---|---|---|---|
| 5,877,039 | A | 3/1999 | Tanizawa |
| 6,240,782 | B1 | 6/2001 | Kato et al. |
| 6,450,031 | B1 | 9/2002 | Sakai et al. |
| 9,055,372 | B2 | 6/2015 | Grosh et al. |
| 10,170,685 | B2 | 1/2019 | Grosh et al. |
| 10,284,960 | B2 | 5/2019 | Grosh et al. |
| 10,349,184 | B2 | 7/2019 | Kuntzman et al. |
| 2007/0023851 | A1 | 2/2007 | Hartzell et al. |
| 2007/0077727 | A1 | 4/2007 | Huang et al. |
| 2009/0129611 | A1 | 5/2009 | Leidl et al. |
| 2010/0038734 | A1 | 2/2010 | Kasai et al. |
| 2010/0195851 | A1 | 8/2010 | Buccafusca |
| 2010/0208914 | A1 | 8/2010 | Ohtsuka |
| 2010/0254547 | A1 | 10/2010 | Grosh et al. |
| 2010/0307242 | A1 | 12/2010 | Sakai et al. |
| 2012/0053393 | A1 | 3/2012 | Kaltenbacher et al. |
| 2012/0250909 | A1 | 10/2012 | Grosh et al. |
| 2012/0257777 | A1 | 10/2012 | Tanaka et al. |
| 2013/0329920 | A1 | 12/2013 | Grosh et al. |
| 2014/0339657 | A1 | 11/2014 | Grosh et al. |
| 2015/0271606 | A1 | 9/2015 | Grosh et al. |
| 2015/0350792 | A1 | 12/2015 | Grosh et al. |
| 2017/0217761 | A1* | 8/2017 | Chung .................. H04R 19/04 |
| 2018/0052042 | A1* | 2/2018 | Dehe ................... H10N 30/506 |
| 2018/0138391 | A1 | 5/2018 | Grosh et al. |
| 2019/0281393 | A1 | 9/2019 | Grosh et al. |
| 2020/0100033 | A1* | 3/2020 | Stoppel ............... H04R 31/003 |
| 2020/0148532 | A1 | 5/2020 | Grosh et al. |
| 2021/0051413 | A1* | 2/2021 | Hui ...................... H10N 30/302 |
| 2021/0273152 | A1 | 9/2021 | Grosh et al. |
| 2022/0408208 | A1* | 12/2022 | Chen ..................... H04R 17/02 |

FOREIGN PATENT DOCUMENTS

| | | | |
|---|---|---|---|
| CN | 109495829 A | | 3/2019 |
| JP | H05-79813 A | | 3/1993 |
| JP | 2005340961 A | | 12/2005 |
| JP | 2006-158112 A | | 6/2006 |
| JP | 2016-86599 A | | 5/2016 |
| JP | 2017220935 A | | 12/2017 |
| JP | 2018-026445 A | | 2/2018 |
| JP | 2018-133647 A | | 8/2018 |
| JP | 2018133384 A | * | 8/2018 |
| JP | 2018137297 A | | 8/2018 |
| JP | 2018137927 A | | 8/2018 |
| JP | 2018-157347 A | | 10/2018 |
| JP | 2018170697 A | | 11/2018 |
| JP | 2019140638 A | * | 8/2019 |
| JP | 2019-161030 A | | 9/2019 |
| KR | 10-2011-0065919 A | | 6/2011 |
| WO | 2010/002887 A2 | | 1/2010 |

* cited by examiner

LARGE STRESS

SMALL STRESS 22a     22

REGION AT WHICH VALUE OF "$C \times \sigma^2$" IS MAXIMIZED $$Y = -0.0011X^2 + 1.0387X - 41.657$$

PIEZOELECTRIC ACCOUSTIC SENSOR WITH MULTIPLE VIBRATING AREAS

CROSS REFERENCE TO RELATED APPLICATION

The present application is a continuation application of International Patent Application No. PCT/JP2020/044651 filed on Dec. 1, 2020, which designated the U.S. and claims the benefit of priority from Japanese Patent Applications No. 2019-235224 filed on Dec. 25, 2019, No. 2020-125990 filed on Jul. 24, 2020 and No. 2020-177170 filed on Oct. 22, 2020 and International Patent Application No. PCT/JP2020/040471 filed on Oct. 28, 2020. The entire disclosures of all of the above applications are incorporated herein by reference.

TECHNICAL FIELD

The present disclosure relates to a piezoelectric element, a piezoelectric device, and a method for manufacturing a piezoelectric element, in which the vibration region is cantilevered.

BACKGROUND

Conventionally, a piezoelectric element in which the vibration region is cantilevered is proposed in a conceivable technique. Specifically, the vibration region is configured to have a piezoelectric film and an electrode film connected to the piezoelectric film. In such a piezoelectric element, the piezoelectric film is deformed and electric charges are generated in the piezoelectric film when the vibration region vibrates due to acoustic pressure (hereinafter, also simply referred to as sound pressure) or the like. Therefore, the sound pressure applied to the vibration region is detected by extracting the electric charge generated in the piezoelectric film through the electrode film.

SUMMARY

According to an example, a piezoelectric element may include: a vibration unit that outputs a pressure detection signal according to a pressure; a support member; and an improvement unit for improving a detection accuracy of the pressure detection signal. The vibration unit on the support member includes a piezoelectric film and an electrode film in a support region and vibration regions. Each vibration region has one end portion as a fixed end and an other end portion as a free end. A part of each vibration region on a one end portion side is a first region, and another part of each vibration region on an other end portion side is a second region. The electrode film is disposed in the first region.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
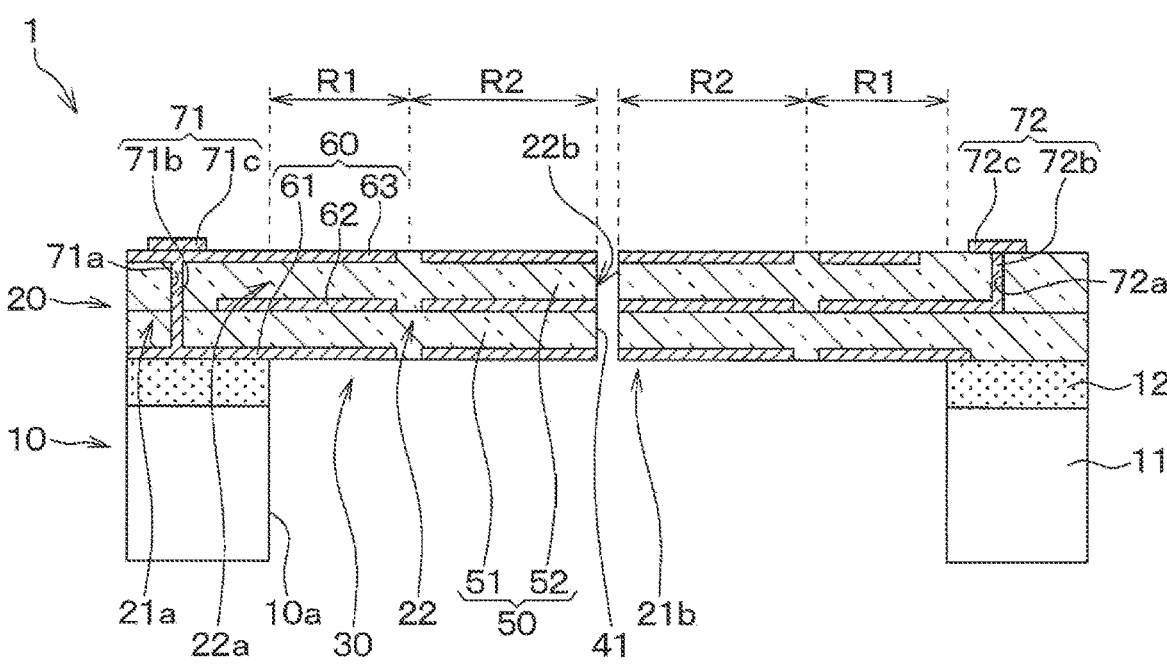
FIG. 1 is a cross-sectional view of a piezoelectric element according to the first embodiment.

At present, it may be desired to improve the detection accuracy in a piezoelectric element having such a cantilever-supported vibration region.

A piezoelectric element, a piezoelectric device, and a method for manufacturing a piezoelectric element, which can improve detection accuracy, are provided in the present embodiments.

According to one of the present embodiments, the piezoelectric element includes: a support member; a piezoelectric film arranged on the support member; an electrode film connected to the piezoelectric film and extracting an electric charge generated by a deformation of the piezoelectric film; a support region supported by the support member; a plurality of vibration regions connected to the support region and floated from the support member; and a vibration unit for outputting a pressure detection signal based on the electric charge. The plurality of vibration regions are provided with one end portion as a fixed end and the other end portion as a free end, which provide a boundary with the support region. A region on a one end portion side is defined as a first region, and a region on an other end portion side is defined as a second region. The electrode film is formed in the first region, and an improvement unit for improving the detection accuracy of the pressure detection signal is formed therein.

According to this, since the improvement unit for improving the accuracy of the pressure detection signal is formed, the detection accuracy can be improved.

Further, according to another of the present embodiments, the piezoelectric element includes: a support member; a piezoelectric film arranged on the support member; an electrode film connected to the piezoelectric film and extracting an electric charge generated by a deformation of the piezoelectric film; a support region supported by the support member; a plurality of vibration regions connected to the support region and floated from the support member; and a vibration unit for outputting a pressure detection signal based on the electric charge. The plurality of vibration regions are provided with one end portion as a fixed end and the other end portion as a free end, which provide a boundary with the support region. A region on a one end portion side is defined as a first region, and a region on an other end portion side is defined as a second region. Resonance frequencies in at least a part of the vibration regions are formed so as to be different from each other, and the electrode film is arranged in the first region.

According to this, since the resonance frequencies are set to different values in at least a part of the vibration regions, the relationship between the frequency and the sensitivity becomes a different waveform. Therefore, by appropriately switching the vibration regions used for pressure detection, the frequency at which the detection sensitivity is high can be widened, and the detection sensitivity of a low frequency noise such as road noise can also be high. Therefore, the detection accuracy can be improved.

Further, according to another of the present embodiments, a piezoelectric device includes: the above described piezoelectric element; a mount member on which the piezoelectric element is mounted; a lid portion fixed to the mount member in a state of accommodating the piezoelectric element; and a casing in which a through hole is formed to communicate with an outside and to introduce pressure.

According to this, since the piezoelectric device is provided with the piezoelectric element having the improvement unit, the accuracy of the pressure detection signal can be improved.

Further, according to another of the present embodiments, a manufacturing method of a piezoelectric element includes: preparing a support member; forming a vibration unit on the support member. The forming of the vibration unit includes: forming a recess in the support member to float the vibration region.

According to this, since the piezoelectric element in which the improvement unit is formed is manufactured, the piezoelectric element capable of improving the detection accuracy is manufactured.

The reference numerals in parentheses attached to the components and the like indicate an example of correspondence between the components and the like and specific components and the like in an embodiment to be described below.

Hereinafter, embodiments of the present disclosure will be described with reference to the drawings. In each embodiment described below, same or equivalent parts are designated with the same reference numerals.

First Embodiment

Figure 2:
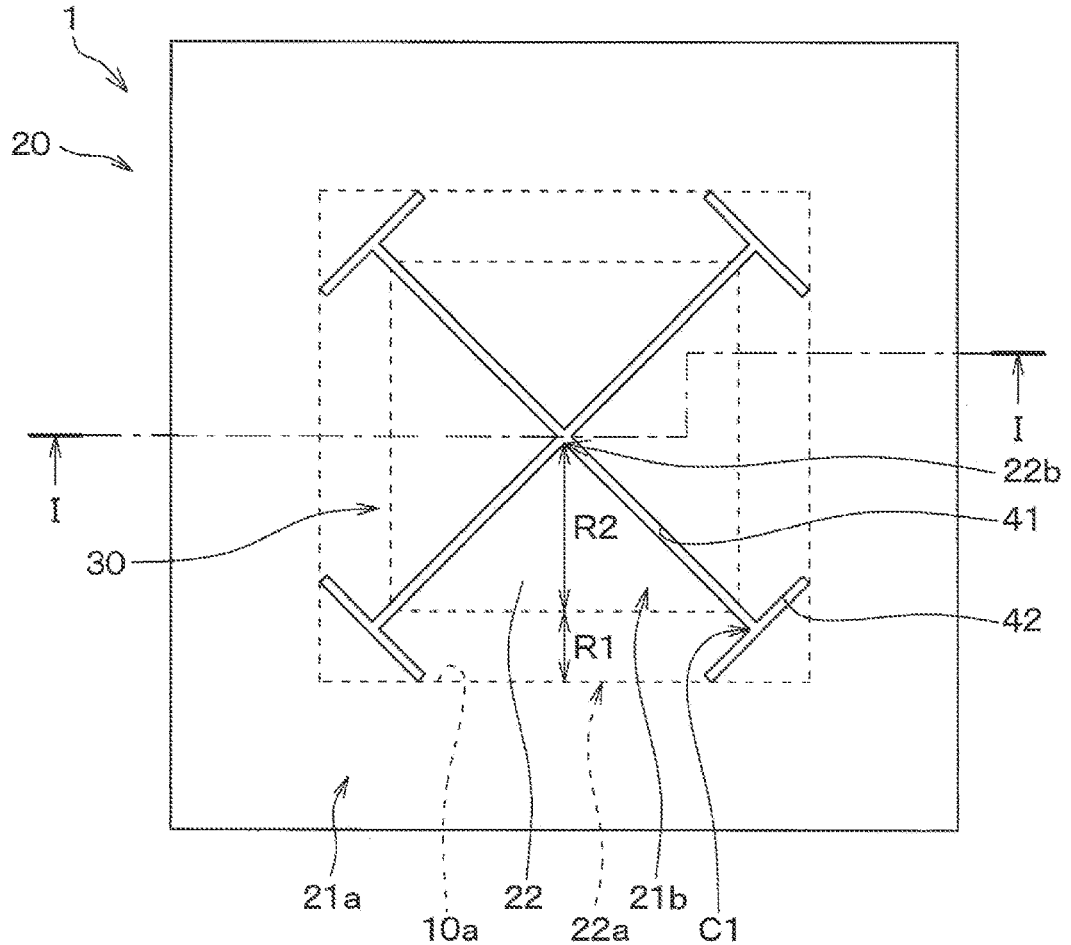
FIG. 2 is a plan view of the piezoelectric element shown in FIG. 1.

The piezoelectric element 1 of the first embodiment will be described with reference to FIGS. 1 and 2. The piezoelectric element 1 of the present embodiment may be suitable for use as, for example, a microphone. Further, FIG. 1 corresponds to a cross-sectional view taken along the line I-I in FIG. 2. In FIG. 2, the first electrode portion 71, the second electrode portion 72, and the like, which will be described later, are omitted. Further, in each drawing corresponding to FIG. 2, the first electrode portion 71, the second electrode portion 72, and the like are appropriately not shown.

The piezoelectric element 1 of the present embodiment includes a support member 10 and a vibration unit 20. The support member 10 has a support substrate 11 and an insulation film 12 formed on the support substrate 11. The support substrate 11 is made of, for example, a silicon substrate, and the insulation film 12 is made of an oxide film or the like.

The vibration unit 20 constitutes a sensing unit 30 that outputs a pressure detection signal corresponding to a pressure such as sound pressure, and is arranged on the support member 10. In the support member 10, a recess 10a is formed for floating an inner edge side of the vibration unit 20. Therefore, the vibration unit 20 has a structure with a support region 21a arranged on the support member 10 and a floating region 21b connected to the support region 21a and floating on the recess portion 10a. The recess portion 10a has a flat rectangular shape at the opening end on the vibration unit 20 side (hereinafter, also simply referred to as the opening end of the recess portion 10a). Therefore, the floating region 21b has a substantially rectangular shape in a plane.

The floating region 21b of the present embodiment is divided into a separation slit 41 and a stress increasing slit 42 so that four vibration regions 22 are configured. In the present embodiment, two separation slits 41 are formed so as to pass through the substantially center of the floating region 21b and extend toward the opposite corners of the floating region 21b. Here, the separation slit 41 of the present embodiment is terminated in the floating region 21b. The floating region 21b, which will be described in detail later, is divided into four vibration regions 22 since the stress increasing slit 42 is connected to the separation slit 41 and extends to the end on the support region 21a side in the floating region. Although not particularly limited, in the present embodiment, the distance between the vibration regions 22 (that is, the width of the separation slit 41) is about 1 μm.

Since each vibration region 22 is configured by dividing the floating region 21b as described above, one end portion 22a thereof is regarded as a fixed end supported by the support member 10 (that is, the support region 21a), and the other end portion thereof on the other end portion 22b side is regarded as a free end. That is, each vibration region 22 is in a state of being connected to the support region 21a and in a state of being cantilevered. The one end portion 22a in each vibration region 22 is a portion that coincides with the open end of the recess 10a in the normal direction (hereinafter, also simply referred to as the normal direction) with respect to the surface direction of the vibration unit 20, and further a portion that is a boundary with the support region 21a. Therefore, the shape of one end portion 22a in each vibration region 22 depends on the open end of the recess 10a.

The vibration unit 20 is configured to have a piezoelectric film 50 and an electrode film 60 connected to the piezoelectric film 50. Specifically, the piezoelectric film 50 has a lower piezoelectric film 51 and an upper piezoelectric film 52 stacked on the lower piezoelectric film 51. Further, the electrode film 60 includes: a lower electrode film 61 arranged below the lower piezoelectric film 51; an intermediate electrode film 62 arranged between the lower piezoelectric film 51 and the upper piezoelectric film 52; and an upper electrode film 63 arranged on the upper piezoelectric film 52. That is, in the vibration unit 20, the lower layer piezoelectric film 51 is sandwiched between the lower electrode film 61 and the intermediate electrode film 62, and the upper layer piezoelectric film 52 is sandwiched between the intermediate electrode film 62 and the upper electrode film 63. The piezoelectric film 50 is formed by a sputtering method or the like.

Further, each vibration region 22 has a fixed end side as a first region R1 and a free end side as a second region R2. The lower electrode film 61, the intermediate electrode film 62, and the upper electrode film 63 are formed in the first region R1 and the second region R2, respectively. Here, the lower electrode film 61, the intermediate electrode film 62, and the upper electrode film 63 formed in the first region R1 and the lower electrode film 61, the intermediate electrode film 62, and the upper electrode film 63 formed in the second region R2 are separated and insulated from each other. Further, the lower electrode film 61, the intermediate electrode film 62, and the upper electrode film 63 formed in the first region R1 are appropriately extended to the support region 21a.

In the support region 21a of the vibration unit 20, the first electrode portion 71 electrically connected to the lower electrode film 61 and the upper electrode film 63 formed in the first region R1 and the second electrode portion 72 electrically connected to the intermediate electrode film 62 formed in the first region R1 are arranged. Note that FIG. 1 is a cross-sectional view taken along the line I-I in FIG. 2, showing a cross section of the vibration region 22 on the right side of the drawing which is different from a cross section of the vibration region 22 on the left side of the drawing. Then, in the support region 21a, the first electrode portion 71 electrically connected to the lower electrode film 61 and the upper electrode film 63 formed in the first region R1, and the second electrode portion 72 electrically connected to the intermediate electrode film 62 formed in the first region R1 are arranged.

The first electrode portion 71 is formed in a hole portion 71a that penetrates the upper electrode film 63, the upper piezoelectric film 52, and the lower piezoelectric film 51 to expose the lower electrode film 61, and includes a through hole electrode 71b electrically connected to the lower electrode film 61 and the upper electrode film 63. Further, the first electrode portion 71 has a pad portion 71c formed on the through hole electrode 71b and electrically connected to the through hole electrode 71b. The second electrode portion 72 has a through hole electrode 72b formed in a hole portion 72a that penetrates the upper piezoelectric film 52 and exposes the intermediate electrode film 62, and the through hole electrode 72b is electrically connected to the intermediate electrode film 62. Further, the second electrode portion 72 has a pad portion 72c formed on the through hole electrode 72b and electrically connected to the through hole electrode 72b.

The sensing unit 30 of the present embodiment is configured to output the change in electric charge in the four vibration regions 22 as one pressure detection signal. That is, the four vibration regions 22 are electrically connected in series. More specifically, each vibration region 22 has a bimorph structure, and each lower electrode film 61, each intermediate electrode film 62, and each upper electrode film 63 formed in each vibration region 22 are connected in parallel to each other, and the vibration regions 22 are connected in series.

Further, the lower electrode film 61, the intermediate electrode film 62, and the upper electrode film 63 formed in the second region R2 are not electrically connected to the respective electrode portions 71 and 72, and are in a floating state. Therefore, the lower electrode film 61, the intermediate electrode film 62, and the upper electrode film 63 formed in the second region R2 may not be always necessary. In the present embodiment, they are formed so as to protect portions of the lower piezoelectric film 51 and the upper piezoelectric film 52 arranged in the second region R2.

In the present embodiment, the lower piezoelectric film 51 and the upper piezoelectric film 52 are made of lead-free piezoelectric ceramics such as scandium nitride aluminum (ScAlN), aluminum nitride (AlN), and the like. The lower electrode film 61, the intermediate electrode film 62, the upper electrode film 63, the first electrode portion 71, the second electrode portion 72, and the like are made of molybdenum, copper, platinum, platinum, titanium, or the like.

The above is the basic configuration of the piezoelectric element 1 in this embodiment. In such a piezoelectric element 1, when sound pressure is applied to each vibration region 22 (that is, the sensing unit 30), each vibration region 22 vibrates. In this case, for example, when the other end portion 22b side (that is, the free end side) of the vibration region 22 is displaced upward, tensile stress is generated in the lower piezoelectric film 51 and compression stress is generated in the upper piezoelectric film 52. Therefore, the sound pressure is detected by extracting the electric charge from the first electrode portion 71 and the second electrode portion 72.

At this time, the stress generated in the vibration region 22 (that is, the piezoelectric film 50) is larger on the fixed end side than on the free end side because the stress is released on the free end side (that is, the other end portion side). That is, on the free end side, the generation of electric charges is small, and the SN ratio, which is the ratio of the signal to the noise, may tend to be small. Therefore, in the piezoelectric element 1 of the present embodiment, as described above, each vibration region 22 is divided into a first region R1 in which the stress may tend to be large and a second region R2 in which the stress may tend to be small. In the piezoelectric element 1, the lower electrode film 61, the upper electrode film 63, and the intermediate electrode film 62 arranged in the first region R1 are connected to the first and second electrode portions 71 and 72 to extract the electric charge generated in the lower piezoelectric film 51 and upper piezoelectric film 52 disposed in the first region R1. As a result, it is possible to suppress the influence of noise from becoming large.

In the present embodiment, each vibration region 22 is formed with a deformation promoting structure that promotes the deformation of the piezoelectric film 50 located in the first region R1 when the sound pressure is applied. In this embodiment, the deformation promoting structure corresponds to the improvement unit.

In the present embodiment, each vibration region 22 is formed with a stress increasing slit 42 for increasing the stress generated in the first region R1 when the sound pressure is applied. Specifically, the stress increasing slit 42 is formed so as to be connected to the separation slit 41 in the first region R1 and to form a corner portion C1 at the connecting portion with the separation slit 41. Therefore, in the vibration region 22, the corner portion C1 is formed in the portion of the first region R1 floating from the support member 10, and the stress may tend to be concentrated on the corner portion C1 and the stress may tend to be increased. As a result, in the vibration region 22, the stress that can be generated on the one end portion 22a side also increases, and the overall deformation becomes large. Therefore, the pressure detection signal can be increased by increasing the deformation of the piezoelectric film 50, and the detection sensitivity can be improved. The corner portion C1 formed at the connecting portion between the separation slit 41 and the stress increasing slit 42 may have an acute angle formed between the separation slit 41 and the stress increasing slit 42. Alternatively, it may be an obtuse angle or a right angle.

In the present embodiment described above, in the vibration region 22, the corner portion C1 is formed in a portion of the first region R1 floating from the support member 10. Then, in the corner portion C1, the stress may tend to be concentrated and the stress may tend to increase. Therefore, the deformation of the first region R1 in the vibration region 22 can be promoted, and the pressure detection signal can be increased. Therefore, the detection sensitivity can be improved and the detection accuracy can be improved.

Here, in the vibration region 22 that is cantilevered as described above, the one end portion 22a supported by the support member 10 is supported and restrained by the support member 10. Therefore, the stress generated in the vibration region 22 may tend to be the largest in the region of the portion slightly shifted to the inner periphery side from the one end portion 22a. Alternatively, by forming the corner portion C1 in the vibration region 22 as described above, the portion where the stress is maximized may be shifted to the one end portion 22a side. Therefore, also in this respect, in the present embodiment, the deformation of the entire vibration region 22 can be increased, and the detection sensitivity can be improved.

Modification of First Embodiment

Figure 3:
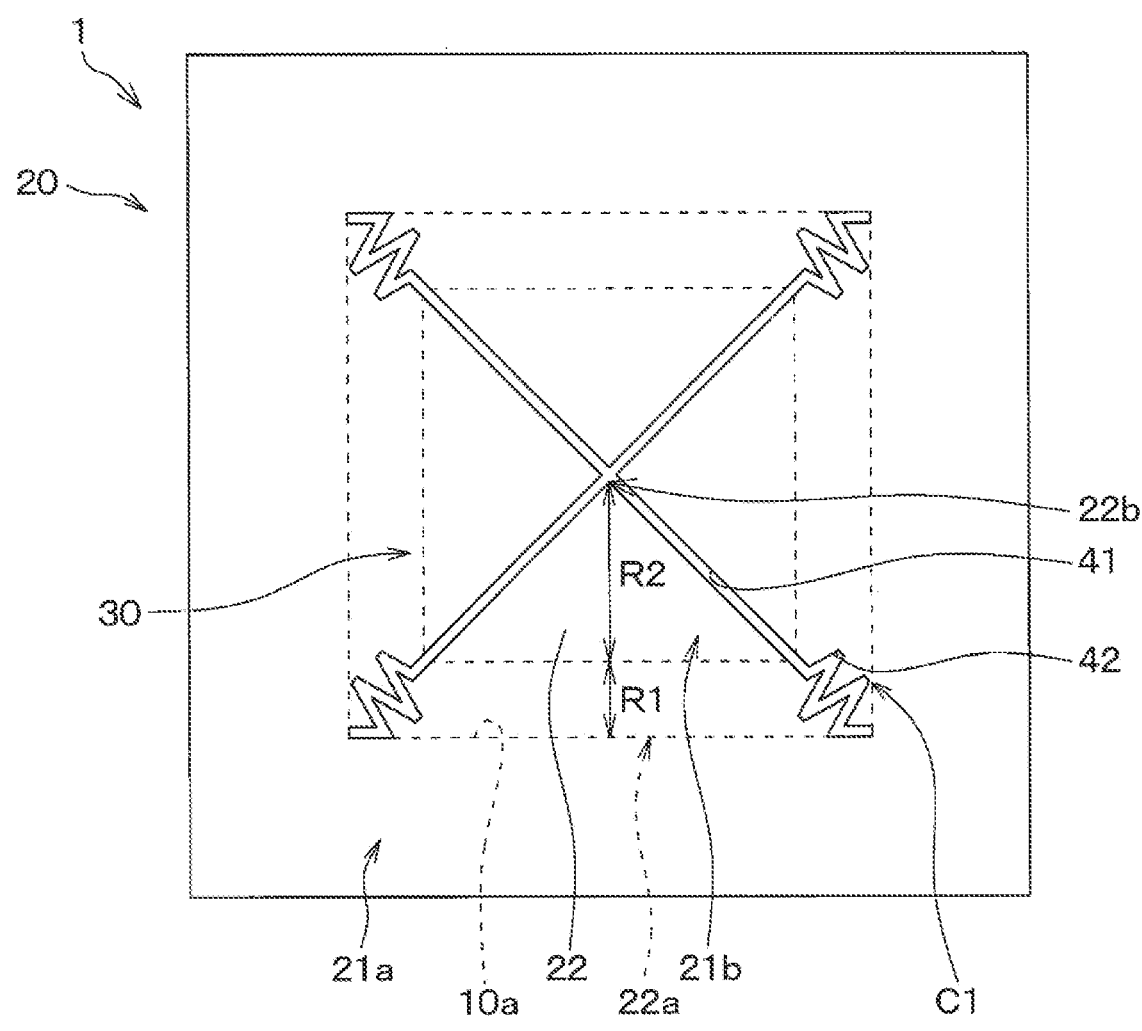
FIG. 3 is a plan view of a piezoelectric element in a modified example of the first embodiment.

The modification of the first embodiment will be described below. In the first embodiment, as shown in FIG. 3, the stress increasing slit 42 may be extended along the extending direction of the separation slit 41, and the corner portion C1 may be formed by only the stress increasing slit 42, so that the stress increasing slit 42 has a bent shape. That is, the stress increasing slit 42 may have a so-called wavy shape.

Further, in the stress increasing slit 42, when the stress generated in the corner portion C1 formed by the stress increasing slit 42 becomes too large and the vibration unit 20 may be destroyed, the corner portion C1 may have a curved shape having a curvature.

Second Embodiment

A second embodiment will be described. This embodiment is a modification of the first embodiment in which the configuration of the deformation promoting structure is changed. The remaining configuration is similar to that according to the first embodiment and will thus not be described repeatedly.

Figure 4:
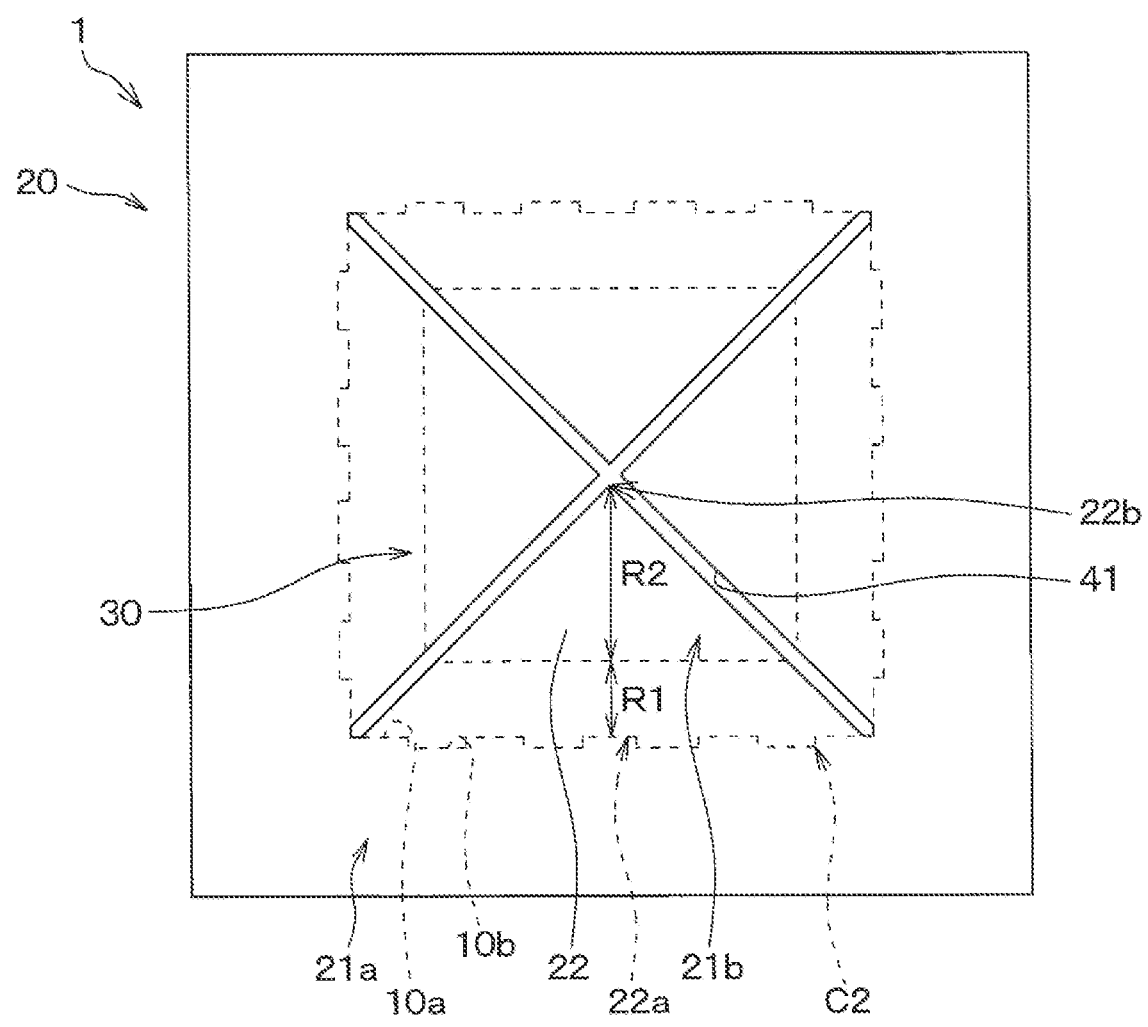
FIG. 4 is a plan view of a piezoelectric element according to a second embodiment.

In the present embodiment, as shown in FIG. 4, the stress increasing slit 42 is not formed in the vibration region 22, and the separation slit 41 is formed so as to reach the corner portion of the floating region 21*b*. That is, the floating region 21*b* of the present embodiment is divided into four vibration regions 22 only by the separation slit 41. In each vibration region 22, a corner portion C2 is formed at one end portion 22*a*. In this embodiment, the corner portion C2 corresponds to the deformation promoting structure.

Specifically, in the present embodiment, the open end of the recess 10*a* in the support member 10 provides a recess portion 10*b* that is located between both ends of the one end portion 22*a* of the vibration region 22, and is formed by recessing the open end on an outer periphery side of the support member 10. Both ends of the one end portion 22*a* of the vibration region 22 are, in other words, the portions of the one end portion 22*a* that the separation slit 41 reaches.

The open end of the recess portion 10*a* is in a state in which a concave-convex structure is formed by the recess portion 10*b* in the direction along the open end. As a result, the one end portion 22*a* of the vibration region 22 has a concave-convex structure depending on the shape of the open end of the recess portion 10*a*, so that the corner portion C2 is formed.

In the present embodiment described above, since the corner portion C2 is configured in the one end portion 22*a* of the vibration region 22, the stress of the one end portion 22*a* becomes large. Therefore, it is possible to promote the deformation of the one end portion 22*a* in the vicinity of the corner portion C2 in the vibration region 22, and it is possible to increase the pressure detection signal. Therefore, the sensitivity can be improved.

Modification of Second Embodiment

The modification of the second embodiment will be described below. In the second embodiment, the corner portion C2 may be configured such that a convex portion is formed at the open end of the recess portion 10*a* so that the open end protrudes toward the inner periphery side of the support member 10. That is, in the second embodiment, when the corner portion C2 is formed at one end portion 22*a* which is disposed in the first region R1 of the vibration region 22, the shape of the recess 10*a* on the open end side can be appropriately changed.

Further, also in the second embodiment, as in the modification of the first embodiment, if the stress generated in the corner portion C2 becomes too large and the vibration unit 20 may be destroyed, the corner portion C2 may have a curved shape having a curvature.

Third Embodiment

A third embodiment will be described. This embodiment is a modification of the first embodiment in which the configuration of the deformation promoting structure is changed. The remaining configuration is similar to that according to the first embodiment and will thus not be described repeatedly.

Figure 5:
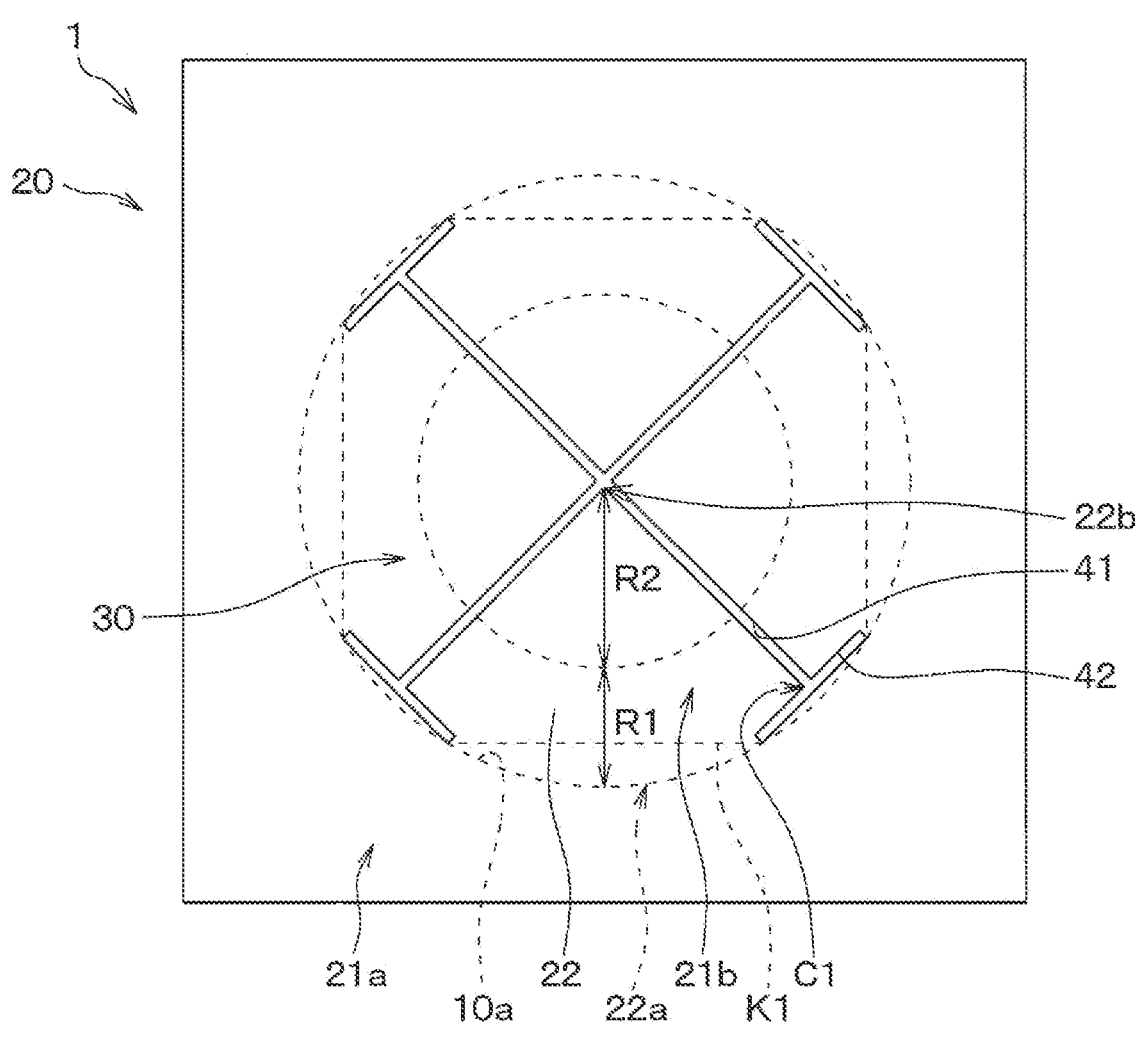
FIG. 5 is a plan view of a piezoelectric element according to a third embodiment.

In the present embodiment, as shown in FIG. 5, the open end of the recess portion 10*a* formed in the support member 10 has a planar circular shape with a center of the intersection of the two separation slits 41. Further, the open end of the recess 10*a* is formed so as to intersect both ends of the stress increasing slit 42 in the extending direction in the normal direction.

Therefore, the two ends of the vibration region 22 on the support region 21*a* side in the outline of the floating region are in a state of reaching the one end portion 22*a*. The vibration region 22 has a shape in which the one end portion 22*a* expands on the opposite side of the other end portion 22*b* with respect to the virtual line K1 connecting the two ends. In the present embodiment, since the open end of the recess portion 10*a* has a planar circular shape, the one end portion 22*a* of the vibration region 22 has an arc shape. Therefore, in each vibration region 22 of the present embodiment, the open end of the recess portion 10*a* has a rectangular shape as in the first embodiment, and the first region R1 is large, compared with a case where the one end portion 22*a* coincides with the virtual line K1.

The outline of the vibration region 22 is an end line that forms the outline of the vibration region 22. The outline of the floating region in the vibration region 22 is a line of the portion of the outline of the vibration region 22 excluding the one end portion 22*a* supported by the support member 10. Further, in the present embodiment, the shape of one end portion 22*a* corresponds to the deformation promoting structure.

In the present embodiment described above, since the vibration region 22 has a shape in which the one end portion 22*a* has a shape with a portion expanding on the opposite side of the other end portion 22*b* from the virtual line K1, the first region R1 can be made larger than a case where the open end of the recess portion 10*a* has a rectangular shape. Further, as described above, since the deformation of the portion of the vibration region 22 inside the one end portion 22*a* may tend to be slightly larger, the deformation in the vicinity of the virtual line K1 can also be large. That is, when the open end of the recess portion 10*a* has a rectangular shape, the deformation of the one end portion 22*a* can be increased. Therefore, the pressure detection signal can be increased and the sensitivity can be improved.

Fourth Embodiment

A fourth embodiment will be described. This embodiment is a modification of the third embodiment in which the configuration of the deformation promoting structure is changed. Other configurations are the same as those of the third embodiment, and therefore a description of the same configurations will be omitted.

Figure 6:
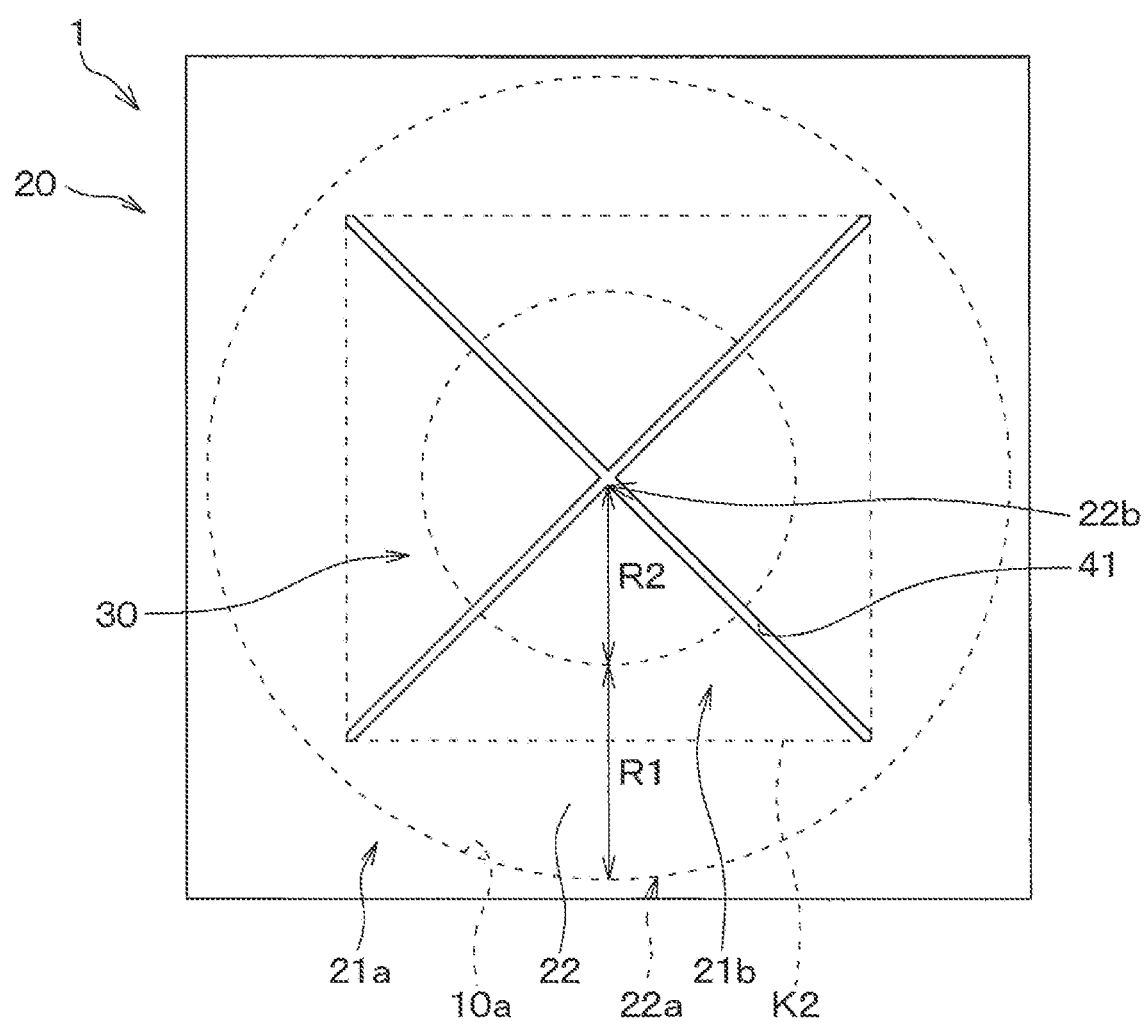
FIG. 6 is a plan view of a piezoelectric element according to a fourth embodiment.

In the present embodiment, as shown in FIG. 6, the stress increasing slit 42 is not formed in the vibration unit 20. The open end of the recess portion 10*a* formed in the support member 10 has a planar circular shape with the intersection of the two separation slits 41 as a center. Here, in the present embodiment, the open end of the recess portion 10*a* is formed so as not to intersect with the separation slit 41.

That is, the two ends of the vibration region 22 on the support region 21*a* side in the outline of the floating region are in a state of being terminated by the floating region, respectively. Therefore, in the present embodiment, each vibration region 22 is in a state where the portions of the vibration regions 22 on the one end portion 22*a* side are connected to each other.

The vibration region 22 has a shape in which the one end portion 22*a* expands on the opposite side of the other end portion 22*b* with respect to the virtual line K2 connecting the two ends. Therefore, in each vibration region 22 of the present embodiment, the open end of the recess portion 10*a* has a rectangular shape as in the first embodiment, and the first region R1 is large, compared with a case where the one end portion 22a coincides with the virtual line K2. Further, in the present embodiment, the shape of one end portion 22a corresponds to the deformation promoting structure.

In the present embodiment described above, since the vibration region 22 has a shape in which the one end portion 22a has a shape with a portion expanding on the opposite side of the other end portion 22b from the virtual line K2, the first region R1 can be made larger than a case where the open end of the recess portion 10a has a rectangular shape. For that reason, the same effects as those of the third embodiment can be obtained.

Fifth Embodiment

A fifth embodiment will be described. This embodiment is a modification of the first embodiment in which the configuration of the deformation promoting structure is changed. The remaining configuration is similar to that according to the first embodiment and will thus not be described repeatedly.

Figure 7:
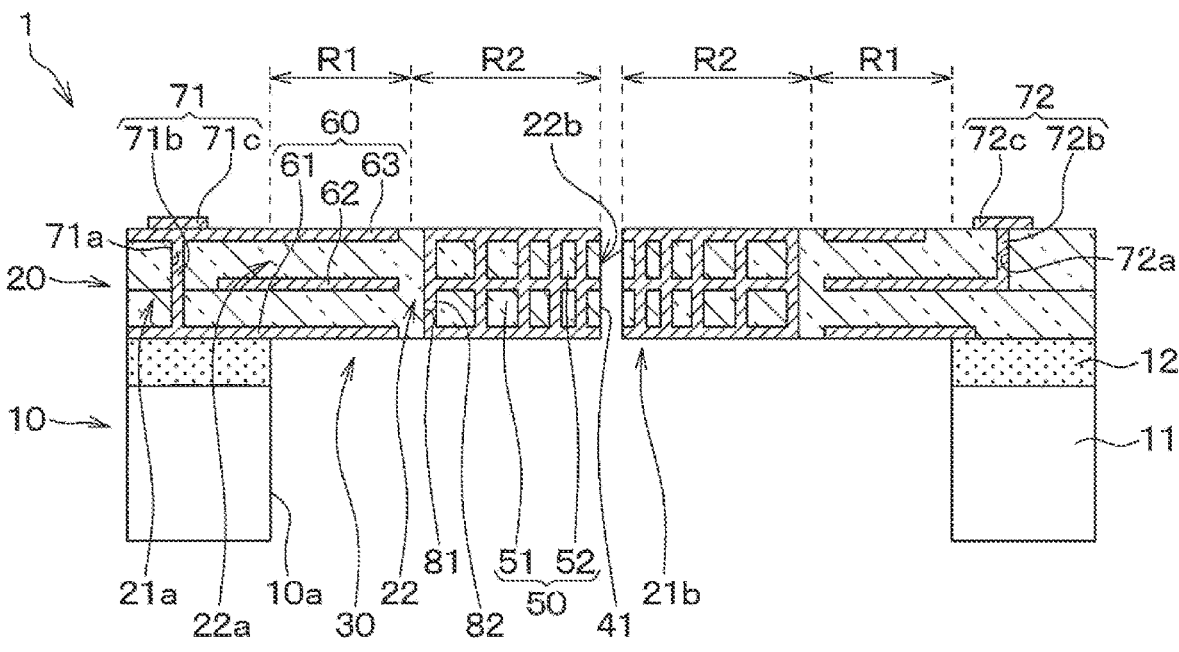
FIG. 7 is a cross-sectional view of a piezoelectric element according to a fifth embodiment.

In the present embodiment, as shown in FIG. 7, in the second region R2, the hole portion 81 is formed to penetrate the upper electrode film 63, the upper piezoelectric film 52, the intermediate electrode film 62, and the lower piezoelectric film 51 and to reach the lower electrode film 61. A hard film 82 having a Young's modulus higher than that of the piezoelectric film 50 is embedded in the hole portion 81.

In the present embodiment, the hard film 82 is made of the same material as the first and second electrode portions 71 and 72 and the electrode film 60. Since the lower electrode film 61, the intermediate electrode film 62, and the upper electrode film 63 formed in the second region R2 are not electrically connected to the first and second electrode portions 71 and 72, there is no difficulty even if they are connected to each other. And in this embodiment, the hard film 82 corresponds to the deformation promoting structure.

Further, in the present embodiment, the hole portion 81 and the hard film 82 are formed in the second region R2 so that their density on the other end portion 22b side is denser than the first region R1 side. More specifically, in the present embodiment, the hard film 82 is formed in the second region R2 so as to gradually become denser from the first region R1 side toward the other end portion 22b side.

As described above, in the present embodiment, the hard film 82 is arranged in the second region R2. Therefore, as compared with the case where the hard film 82 is not arranged in the second region R2, when the sound pressure is applied, the second region R2 is hardened, so that the second region R2 is less likely to be deformed. Therefore, in the present embodiment, the stress is likely to be concentrated on the first region R1 and the first region R1 is easily deformed. Therefore, the pressure detection signal can be increased and the sensitivity can be improved.

Further, in the present embodiment, the hard film 82 is formed so that the other end 22b side is denser than the first region R1 side in the second region R2. Therefore, for example, compared with a case where the hard film 82 is formed so that the other end 22b side is sparser than the first region R1 side in the second region R2, it is possible to suppress the inhibition of the deformation of the first region R1 by the hard film 82. Therefore, it is possible to easily obtain the effect of arranging the hard film 82.

Further, the hard film 82 is made of the same material as the first and second electrode portions 71 and 72 and the electrode film 60. Therefore, for example, the hard film 82 can be formed at the same time when the first and second through electrodes 71b and 72b are formed, and the manufacturing process can be simplified.

Sixth Embodiment

A sixth embodiment will be described. This embodiment provides a temperature detection element and a heat generation element in each vibration region 22 as compared with the first embodiment. The remaining configuration is similar to that according to the first embodiment and will thus not be described repeatedly.

First, the piezoelectric element 1 as described above may be used in a state of being exposed to the outside air or a state of being exposed to a predetermined oil. In this case, when the usage environment is low temperature, there may be a possibility such that the vibration of the vibration region 22 may be deteriorated since the vibration region 22 may be frozen when the element 1 is exposed to the outside air, or the viscosity of the oil in contact with the vibration region 22 may be reduced. That is, the piezoelectric element 1 as described above may have a possibility of reduction of the detection sensitivity when the usage environment is low temperature.

Figure 8:
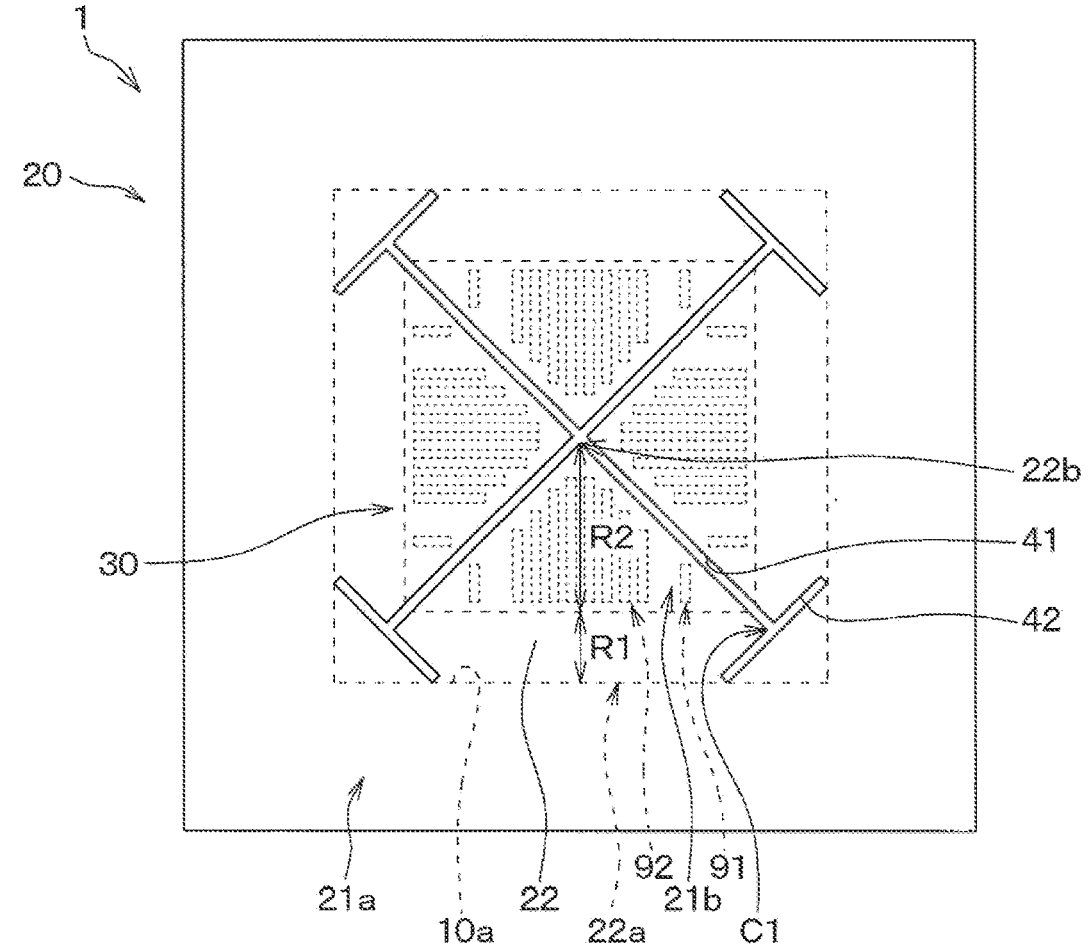
FIG. 8 is a plan view of a piezoelectric element according to a sixth embodiment.

Therefore, in the present embodiment, as shown in FIG. 8, in each vibration region 22, a temperature detection element 91 that outputs a temperature detection signal according to the temperature and a heat generation element 92 that generates heat when energized are provided. In the present embodiment, the temperature detection element 91 and the heat generation element 92 are formed in the second region R2 in each vibration region 22. More specifically, in the present embodiment, the intermediate electrode film 62 is not formed in the second region R2. The temperature detection element 91 and the heat generating element 92 are formed in a portion located between the lower piezoelectric film 51 and the upper piezoelectric film 52. That is, the temperature detection element 91 and the heat generation element 92 are formed in the portion where the intermediate electrode film 62 in the first embodiment is formed.

Further, although not particularly shown, a leader wiring electrically connected to the temperature detection element 91 and the heat generation element 92 is formed in the first region R1 and the support region 21a. An electrode portion electrically connected to the leader wiring is formed in the support region 21a. As a result, the temperature detection element 91 and the heat generation element 92 are connected to the external circuit.

In the second region R2, the lower electrode film 61 and the upper electrode film 63 are formed so as to sandwich the piezoelectric film 50 therebetween, as in the first embodiment. Further, the temperature detection element 91 is configured by using a temperature sensitive resistor whose resistance value changes according to the temperature, and the heat generating element 92 is configured by using a heat generating resistor that generates heat when energized. In the present embodiment, the temperature detection element 91 and the heat generation element 92 are made of, for example, platinum. Further, in the present embodiment, temperature detection element 91 and the heat generation element 92 correspond to the improvement unit.

In the present embodiment described above, the temperature detection element 91 and the heat generation element 92 are arranged. Therefore, the temperature of the vibration region 22 can be maintained at a predetermined temperature by adjusting the amount of energization to the heat generation element 92 based on the temperature detected by the temperature detection element 91. Therefore, it is possible to suppress the freezing of the vibration region 22 and the decrease in the viscosity of the oil in contact with the vibration region 22, and it is possible to suppress the decrease in the detection sensitivity. That is, it is possible to suppress a decrease in detection accuracy.

Further, the temperature detection element 91 and the heat generation element 92 are formed in the second region R2. Therefore, as compared with the case where the temperature detection element 91 and the heat generating element 92 are formed in the first region R1, it is possible to suppress a decrease in the portion where the intermediate electrode film 62 for extracting the electric charge is arranged, and it is possible to utilize the second region R2 effectively.

Further, the temperature detection element 91 and the heat generating element 92 are formed between the lower piezoelectric film 51 and the upper piezoelectric film 52, and are not exposed to the outside air. Therefore, the environmental resistance of the temperature detection element 91 and the heat generation element 92 can be improved.

The temperature detection element 91 and the heat generating element 92 are formed between the lower piezoelectric film 51 and the upper piezoelectric film 52, and the lower electrode film 61 and the upper electrode film 63 are formed to sandwich the piezoelectric film 50 as in the first embodiment. Therefore, it is possible to suppress the deterioration of the environmental resistance to the piezoelectric film 50.

Seventh Embodiment

A seventh embodiment will be described. In this embodiment, a plurality of sensing units 30 are formed with respect to the first embodiment. The remaining configuration is similar to that according to the first embodiment and will thus not be described repeatedly.

First, the piezoelectric element 1 as described above may leak the sound pressure through a portion for partitioning each vibration region 22 (that is, a separation slit 41 and a stress increasing slit 42), and the acoustic resistance of the separation slit 41 that is disposed in parallel to the acoustic impedance may tend to be small. Then, as the acoustic resistance decreases, the low frequency roll-off frequency increases, so that the sensitivity at low frequencies may tend to decrease.

Figure 9:
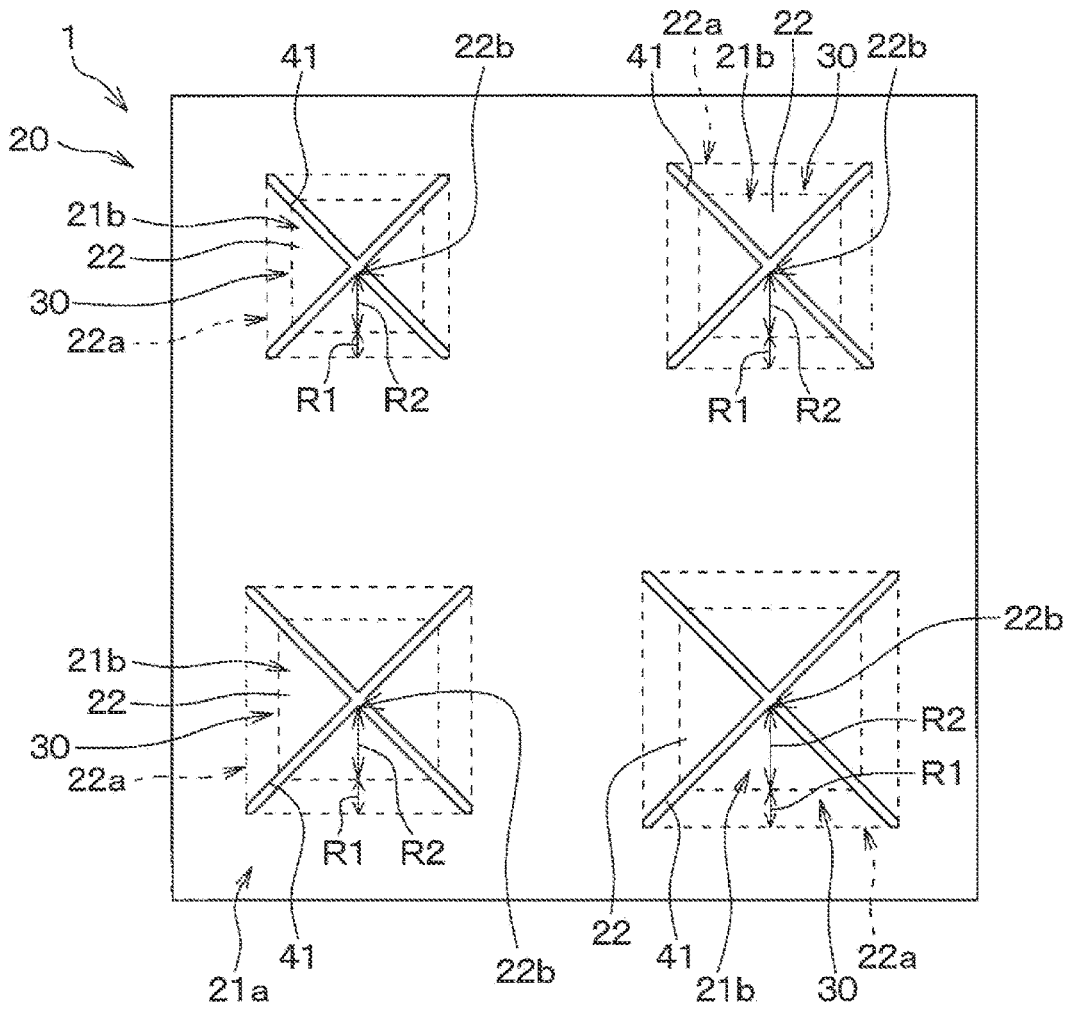
FIG. 9 is a plan view of a piezoelectric element according to a seventh embodiment.

Therefore, in the present embodiment, as shown in FIG. 9, the piezoelectric element 1 is configured by integrating a plurality of sensing units 30 (that is, the floating regions 21b). Specifically, the support member 10 of the present embodiment is formed with four recesses 10a for floating the inner periphery side of the vibration unit 20. That is, four floating regions 21b are formed in the vibration unit 20 of the present embodiment. Each of the floating regions 21b is separated into four vibration regions 22 by forming the separation slits 41, respectively.

In this embodiment, the stress increasing slit 42 is not formed. That is, in the present embodiment, the separation slit 41 is formed so as to reach the corner portion of the floating region 21b.

Figure 10:
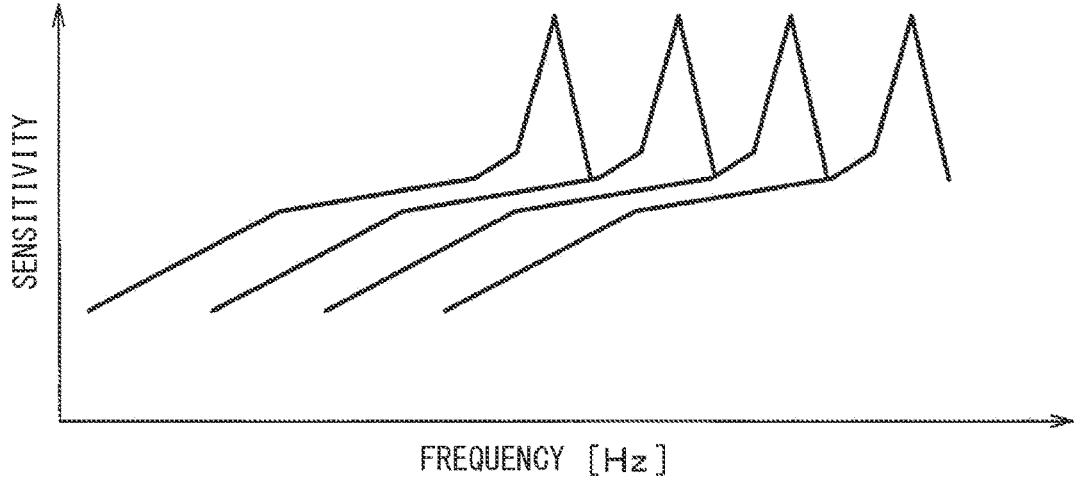
FIG. 10 is a diagram for explaining the relationship between the frequency and the sensitivity of each sensing unit.

Further, in the present embodiment, each vibration region 22 in each sensing unit 30 is configured to have a different resonance frequency. In the present embodiment, each vibration region 22 in each sensing unit 30 is formed so that the length between one end portion 22a and the other end portion 22b, that is, the length of the beam is different. Therefore, as shown in FIG. 10, the relationship between the frequency and the sensitivity of each sensing unit 30 has a different waveform for each sensing unit 30. In this embodiment, the configuration of the vibration regions 22 having different resonance frequencies corresponds to the improvement unit.

In the present embodiment described above, the piezoelectric element 1 is configured by forming a plurality of sensing units 30. Since the resonance frequency of each sensing unit 30 is set to a different value, the relationship between the frequency and the sensitivity has a different waveform. Therefore, according to the piezoelectric element 1 of the present embodiment, by appropriately switching the vibration region 22 used for detecting the sound pressure, the frequency at which the sensitivity becomes high can be widened, and for example, the detection sensitivity of the low frequency noise such as road noise can be increased.

Further, in the piezoelectric element 1 of the present embodiment, a plurality of sensing units 30 are formed, and the plurality of sensing units 30 are supported by a common support member 10. Therefore, for example, as compared with the case where a plurality of piezoelectric elements 1 in which one sensing unit 30 is formed are arranged, it becomes easier to narrow the distance between the adjacent sensing units 30. Here, for example, in the case of a sound wave of 20 kHz, the wavelength is about 17 mm. Therefore, by setting the plurality of sensing units 30 to be supported by the common support member 10 as in the present embodiment, it becomes easy to arrange the sensing units 30 even at intervals sufficiently narrower than the wavelength. Therefore, it is possible to suppress the attenuation of the sound pressure between the sensing units 30, and it is also possible to suppress the decrease in the detection sensitivity of the sound pressure in the high frequency region where the sound pressure is likely to be attenuated.

Further, each vibration region 22 has a different resonance frequency because the length between the one end portion 22a and the other end portion 22b is different. Here, each vibration region 22 is configured by etching the floating region 21b or the like. In this case, the length between the one end portion 22a and the other end portion 22b can be easily changed by changing the mask for etching. Therefore, according to the present embodiment, it is possible to easily form a plurality of vibration regions 22 having different resonance frequencies while suppressing the manufacturing process from becoming complicated.

Eighth Embodiment

An eighth embodiment will be described. In this embodiment, a protection film is arranged in the recess portion 10a of the support member 10 as compared with the first embodiment. The remaining configuration is similar to that according to the first embodiment and will thus not be described repeatedly.

First, in the piezoelectric element 1 as described above, the recess portion 10a formed in the support member 10 is formed by etching. For example, the recess portion 10a is formed by repeating a step of wet etching the support member 10, a step of forming a protection film for protecting the wet-etched wall surface, a step of further etching the wet-etched wall surface, and the like. In this case, the recess portion 10a may tend to have fine irregularities formed on the side surface. Therefore, in the piezoelectric element 1 as described above, the detection sensitivity may decrease due to the generation of turbulent flow due to the fine irregularities formed on the side surface of the recess portion 10a.

Figure 11:
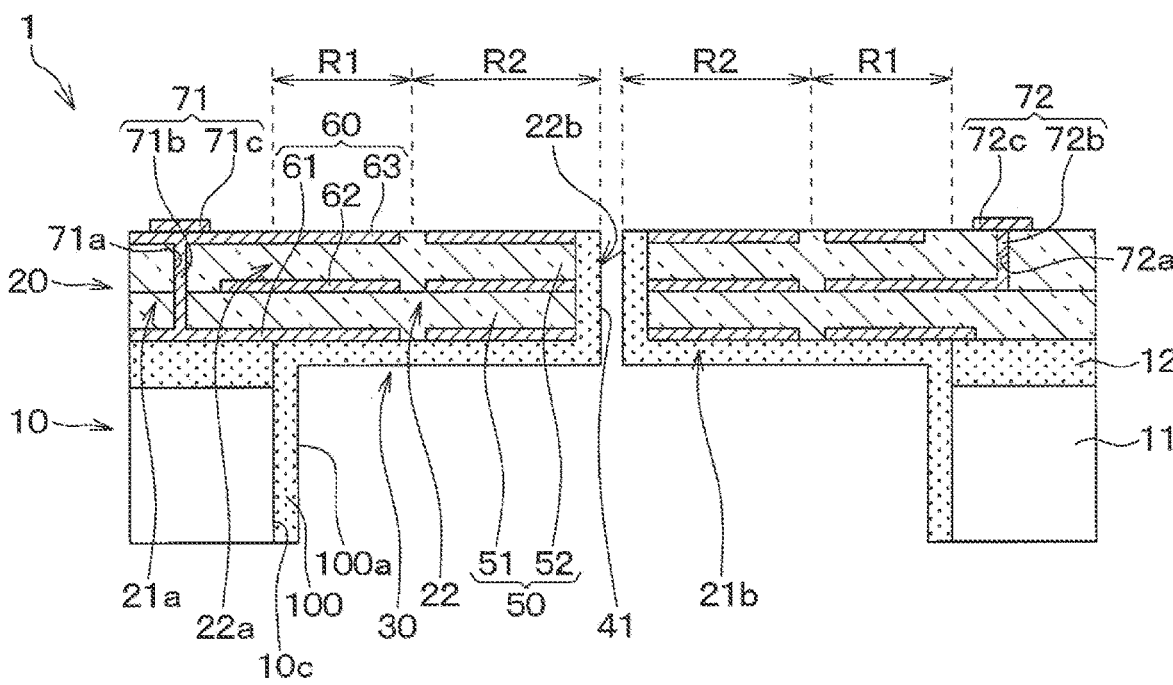
FIG. 11 is a cross-sectional view of a piezoelectric element according to an eighth embodiment.

Therefore, in the present embodiment, as shown in FIG. 11, in the support member 10, a protection film 100 is formed to embed the fine irregularities in the portion for forming the side surface 10c of the recess portion 10a, and to flatten the exposed surface 100a on the opposite side of the recess portion 10a, which is flatter than the side surface 10c of recess portion 10a. Further, in the present embodiment, the protection film 100 is also formed on a portion on the support member 10 side in each vibration region 22 and a portion facing the adjacent vibration region 22 in each vibration region 22.

In the present embodiment, the protection film 100 is made of a material having water repellency and oil repellency so that foreign substances such as water droplets and oil droplets are hard to adhere to, and is made of, for example, a fluorine-based polymer. Then, the protection film 100 is arranged in a portion including the side surface 10c of the recess portion 10a by a coating method, a dipping method, a vapor deposition method, or the like. As a result, the protection film 100 is arranged in a state where the exposed surface 100a is flatter than the side surface 10c of the recess portion 10a.

Further, it may be preferable that the protection film 100 is made of a material that does not easily inhibit the vibration of the vibration region 22. For example, when the piezoelectric film 50 is made of scandium aluminum nitride, Young's modulus is about 250 GPa. Therefore, it may be preferable to use a protection film 100 having a Young's modulus of about ⅕₀₀ or less, and it may be preferable to use a protection film having a Young's modulus of about 0.1 to 0.5 GPa.

In the present embodiment described above, the support member 10 is provided with a protection film 100 having an exposed surface 100a flatter than the side surface 10c of the recess portion 10a on the side surface 10c of the recess portion 10a. Therefore, it is possible to suppress the occurrence of turbulent flow in the recess portion 10a, and it is possible to suppress the deterioration of the detection accuracy.

Further, the protection film 100 is also formed in the vibration region 22, and is made of a material having water repellency and oil repellency. Therefore, it is possible to suppress the adhesion of foreign matter such as water to the protection film 100, and it is also possible to suppress the generation of turbulent flow due to the foreign matter.

Further, the protection film 100 is made of a material that does not easily inhibit the vibration of the vibration region 22. Therefore, by arranging the protection film 100, it is possible to suppress that the vibration region 22 is less likely to vibrate, and it is possible to suppress a decrease in detection sensitivity.

Ninth Embodiment

A ninth embodiment will be described. In this embodiment, the shape of the support member 10 is changed from that of the first embodiment. The remaining configuration is similar to that according to the first embodiment and will thus not be described repeatedly.

Figure 12:
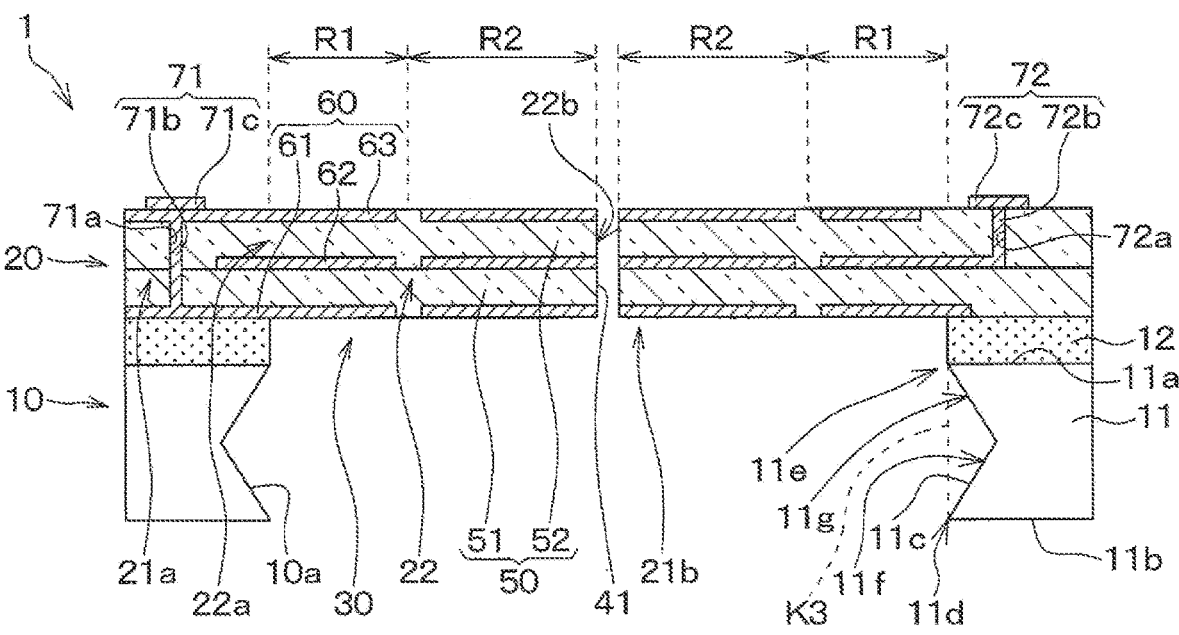
FIG. 12 is a cross-sectional view of a piezoelectric element according to a ninth embodiment.

In the present embodiment, the support substrate 11 is made of a silicon substrate as described above, and has one surface 11a on the insulation film 12 side and the other surface 11b on the opposite side to the one surface 11a. As shown in FIG. 12, the support substrate 11 has a recessed structure on the side surface 11c constituting the recess portion 10a. In this embodiment, the recessed structure of the side surface 11c corresponds to the improvement unit.

Specifically, the side surface 11c of the support substrate 11 has the following configuration. First, the opening on the opposite side of the insulation film 12 is referred to as the first opening 11d, and the opening on the insulation film 12 side is referred to as the second opening 11e. In this case, the side surface 11c has a structure such that a first taper portion 11f whose side surface is cut from the first opening 11d toward the second opening 11e and a second taper portion 11g whose side surface is cut from the second opening 11e toward the first opening 11d are connected to each other. That is, the side surface 11c of the support substrate 11 has a recess structure in which the portion between the first opening 11d and the second opening 11e is recessed with respect to the virtual line K3 connecting the first opening 11d and the second opening 11e.

In the present embodiment, the support substrate 11 has one surface 11a and the other surface 11b as the (100) surface, and the first opening 11d and the second opening 11e have a rectangular shape. The first taper portion 11f and the second taper portion 11g are each (111) plane.

The piezoelectric element 1 of the present embodiment does not have the stress increasing slit 42 formed as in the seventh embodiment. That is, in the present embodiment, the separation slit 41 is formed so as to reach the corner portion of the floating region 21b. Further, in each embodiment described later, an example in which the stress increasing slit 42 is not formed will be described. Here, also in this embodiment and each of the embodiments described later, the stress increasing slit 42 may be appropriately formed.

The above is the configuration of the piezoelectric element 1 in this embodiment. Next, the method of manufacturing the piezoelectric element 1 will be described with reference to FIGS. 13A and 13B.

Figure 13A:
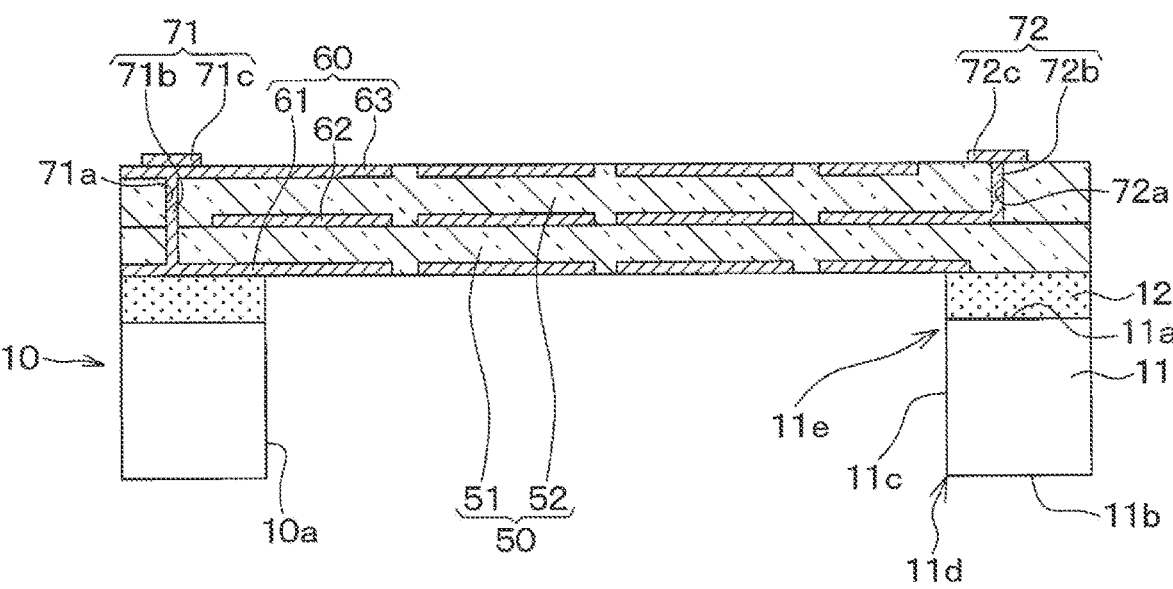
FIG. 13A is a cross-sectional view showing a manufacturing process of the piezoelectric element shown in FIG. 12.

First, as shown in FIG. 13A, it is prepared such that the insulation film 12 is arranged on the support substrate 11, and the piezoelectric film 50, the electrode film 60, the first electrode portion 71, the second electrode portion 72, and the like are formed on the insulation film 12. The support substrate 11 is made of a silicon substrate, and one surface 11a and the other surface 11b are designated as (100) surfaces. Further, the piezoelectric film 50, the electrode film 60, the first electrode portion 71, the second electrode portion 72, and the like are configured by appropriately performing a general sputtering method, an etching method, or the like.

Then, using a mask (not shown), anisotropic dry etching is performed so as to penetrate the insulation film 12 from the other surface 11b of the support substrate 11. After this step is completed, the side surface 11c of the support substrate 11 coincides with the virtual line K3 connecting the first opening 11d and the second opening 11e.

Figure 13B:
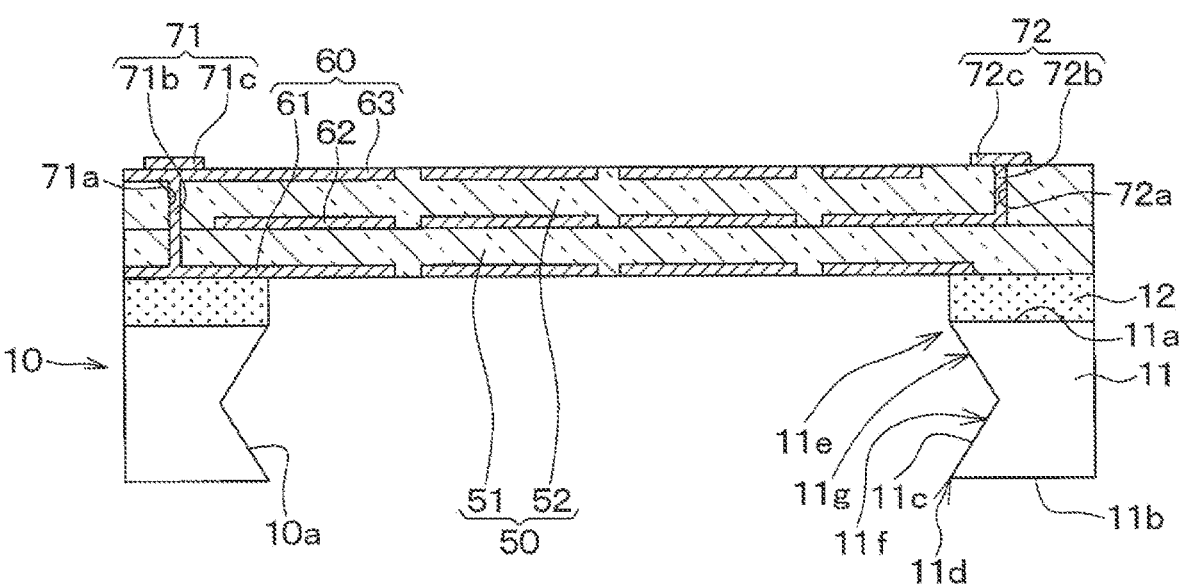
FIG. 13B is a cross-sectional view showing a manufacturing process of a piezoelectric element following FIG. 13A.

Subsequently, as shown in FIG. 13B, an anisotropic wet etching is performed on the side surface 11c of the support substrate 11 using a mask (not shown) to form a recessed structure on the side surface 11c of the support substrate 11. The support substrate 11 is made of a silicon substrate, and one surface 11a and the other surface 11b are designated as (100) surfaces. Therefore, by performing anisotropic wet etching, the first taper portion 11f and the second taper portion 11g formed of the (110) surface having the slowest etching rate in the surface orientation of silicon are formed.

After that, although not particularly shown, the piezoelectric element 1 shown in FIG. 12 is manufactured by appropriately forming the separation slit 41.

Figure 14:
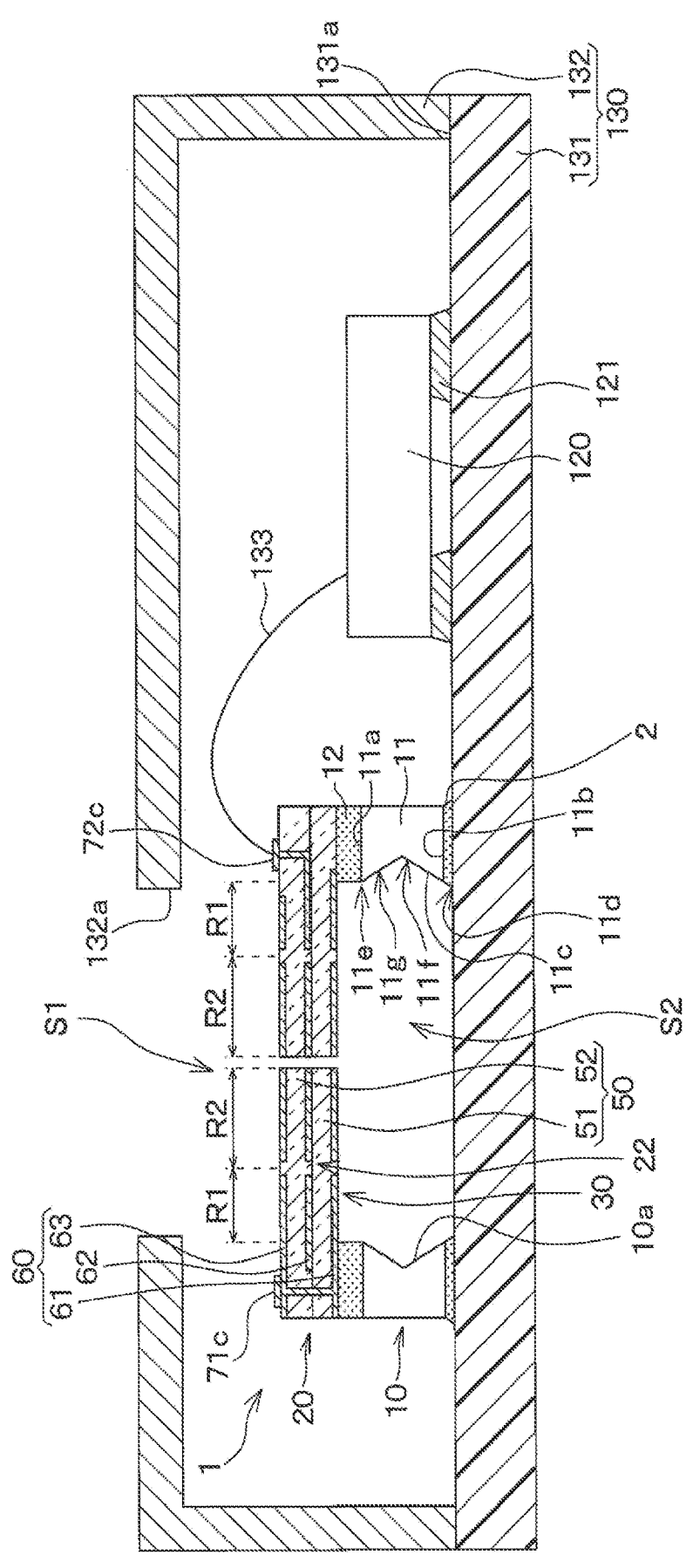
FIG. 14 is a cross-sectional view of a piezoelectric device according to a ninth embodiment.

Here, as shown in FIG. 14, the piezoelectric element 1 as described above is accommodated in the casing 130 to form a piezoelectric device. Specifically, the casing 130 includes: a printed circuit board 131 on which the piezoelectric element 1 and the circuit board 120 that performs predetermined signal processing and the like are mounted, and a lid portion 132 that is fixed to the printed circuit board 131 so as to accommodate the piezoelectric element 1 and the circuit board 120. In this embodiment, the printed circuit board 131 corresponds to the mount member.

Although not shown in particular, the printed circuit board 131 has a configuration in which wiring portions, through-hole electrodes, and the like are appropriately formed, and electronic components such as capacitors (not shown) are also mounted as needed. In the piezoelectric element 1, the other surface 11b of the support substrate 11 is mounted on one surface 131a of the printed circuit board 131 via a bonding member 2 such as an adhesive. The circuit board 120 is mounted on the one surface 131a of the printed circuit board 131 via a bonding member 121 made of a conductive member. The pad portion 72c of the piezoelectric element 1 and the circuit board 120 are electrically connected via the bonding wire 133. The pad portion 71c of the piezoelectric element 1 is electrically connected to the circuit board 120 via the bonding wire 133 in a cross section different from that of FIG. 14. The lid portion 132 is made of metal, plastic, resin, or the like, and is fixed to the printed circuit board 131 via a bonding member such as an adhesive (not shown) so as to accommodate the piezoelectric element 1 and the circuit board 120. Then, in the present embodiment, a through hole 132a is formed in a portion of the lid portion 132 facing the sensing portion 30.

In such a piezoelectric device, the sound pressure is detected by applying the sound pressure (that is, pressure) to the sensing unit 30 through the space between the sensing unit 30 and the lid unit 132 through the through hole 132a.

According to the present embodiment described above, the support substrate 11 has a recessed structure. Therefore, when the piezoelectric device as shown in FIG. 14 is configured, the detection accuracy can be improved.

That is, in the casing 130, the space between the portion where the through hole 132a for introducing the sound pressure is formed and the sensing portion 30 is referred to as the pressure receiving surface space S1. Further, the back space S2 includes a space located on the opposite side of the pressure receiving surface space S1 with the sensing unit 30 interposed therebetween, and is continuous with the space without passing through the separation slit 41. The back space S2 can be said to be a space inside the casing 130 that is different from the pressure receiving surface space S1, and can also be said to be a space excluding the pressure receiving surface space S1. In other words, the pressure receiving surface space S1 can be said to be a space that affects pressing the surface on the through hole 132a side formed in the casing 130 in the vibration region 22. It can be said that the back space S2 affects the pressing of the surface of the vibration region 22 on the side opposite to the through hole 132a formed in the casing 130.

In this case, the low frequency roll-off frequency in such a piezoelectric device is defined as $1/(2n \times Rg \times Cb)$ where the acoustic resistance (that is, air resistance) due to the separation slit 41 is defined as Rg and the acoustic compliance of the back space S2 is defined as Cb. Therefore, in order to reduce the low frequency roll-off frequency, the acoustic resistance Rg or the acoustic compliance Cb of the back space S2 may be increased.

Further, in the present embodiment, since the recessed structure is formed in the support substrate 11, the acoustic compliance can be increased by increasing the space of the back space S2. Therefore, in the piezoelectric device of the present embodiment, the detection sensitivity in the low frequency band can be improved by reducing the low frequency roll-off frequency, and the detection accuracy can be improved.

Further, the sensitivity in such a piezoelectric device is defined as $1/\{(1/Cm)+(1/Cb)\}$, where Cm is the acoustic compliance of the piezoelectric element 1 and Cb is the acoustic compliance of the back space S2. Therefore, in order to increase the sensitivity, the acoustic compliance Cb may be increased, and the acoustic compliance Cb is proportional to the size of the space of the back space S2.

Further, in the present embodiment, since the support substrate 11 has a recessed structure, the capacity can be increased by increasing the space of the back space S2. Therefore, in the piezoelectric device of the present embodiment, the detection accuracy can be improved by increasing the sensitivity.

Figure 15:
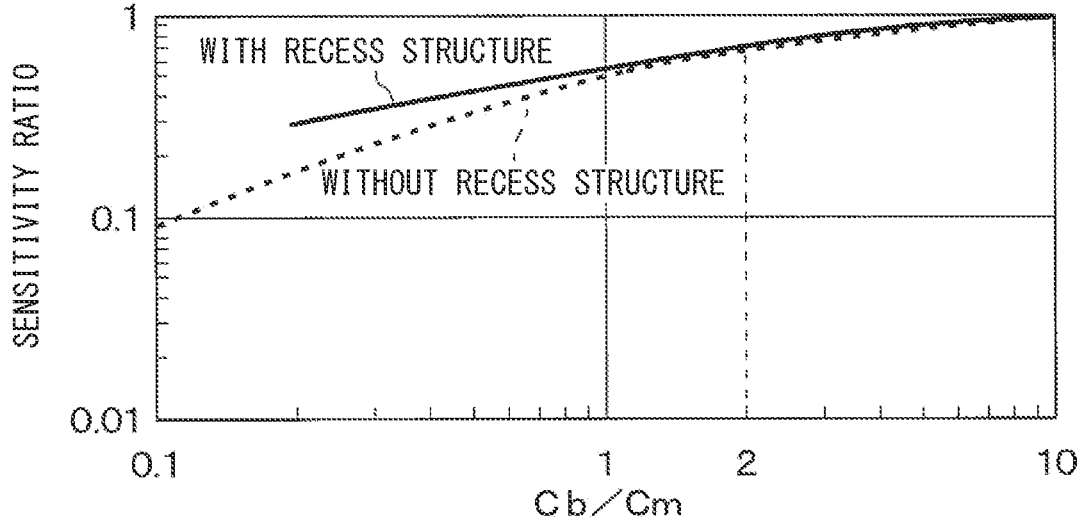
FIG. 15 is a diagram showing the relationship between Cb/Cm and the sensitivity ratio.

Specifically, as shown in FIG. 15, it is possible to suppress a decrease in the sensitivity ratio by increasing the acoustic compliance Cb of the back space S2. In this case, the sensitivity ratio sharply decreases when Cb/Cm is 2 or less, but the decrease in the sensitivity ratio can be moderated by forming the recessed structure. That is, forming the recessed structure on the support substrate 11 in this way is particularly effective for a piezoelectric device having a Cb/Cm of 2 or less. Note that FIG. 15 is based on the case where Cb/Cm is extremely large.

Further, the support substrate 11 is configured such that the side surface 11c has a first taper portion 11f and a second taper portion 11g. Therefore, for example, the adhesive area between the other surface 11b of the support substrate 11 and the printed circuit board 131 can be improved as compared with the case where the side surface 11c includes only the second taper portion 11g. That is, according to the present embodiment, it is possible to improve the detection accuracy while suppressing the deterioration of the adhesiveness to the printed circuit board 131. The configuration that the side surface 11c includes only the second taper portion 11g means that the second taper portion 11g is formed up to the first opening portion 11d.

Further, the side surface 11c of the support substrate 11 is formed by anisotropic wet etching to form a (111) surface, which suppresses variation in shape. Therefore, it is possible to suppress the variation in the stress generated in the vibration region 22, and it is possible to suppress the variation in the detection accuracy.

In the present embodiment, the first opening 11d and the second opening 11e have been described as having a rectangular shape, alternatively, the shapes of the first opening 11d and the second opening 11e may be changed as appropriate. For example, one surface 11a and the other surface 11b of the support substrate 11 may be a (110) surface, and the first opening 11d and the second opening 11e may be octagonal.

Tenth Embodiment

A tenth embodiment will be described. This embodiment is a modification of the ninth embodiment in which the method of arranging the piezoelectric element 1 in the piezoelectric device is changed. Descriptions of the same configurations and processes as those of the ninth embodiment will not be repeated hereinafter.

Figure 16:
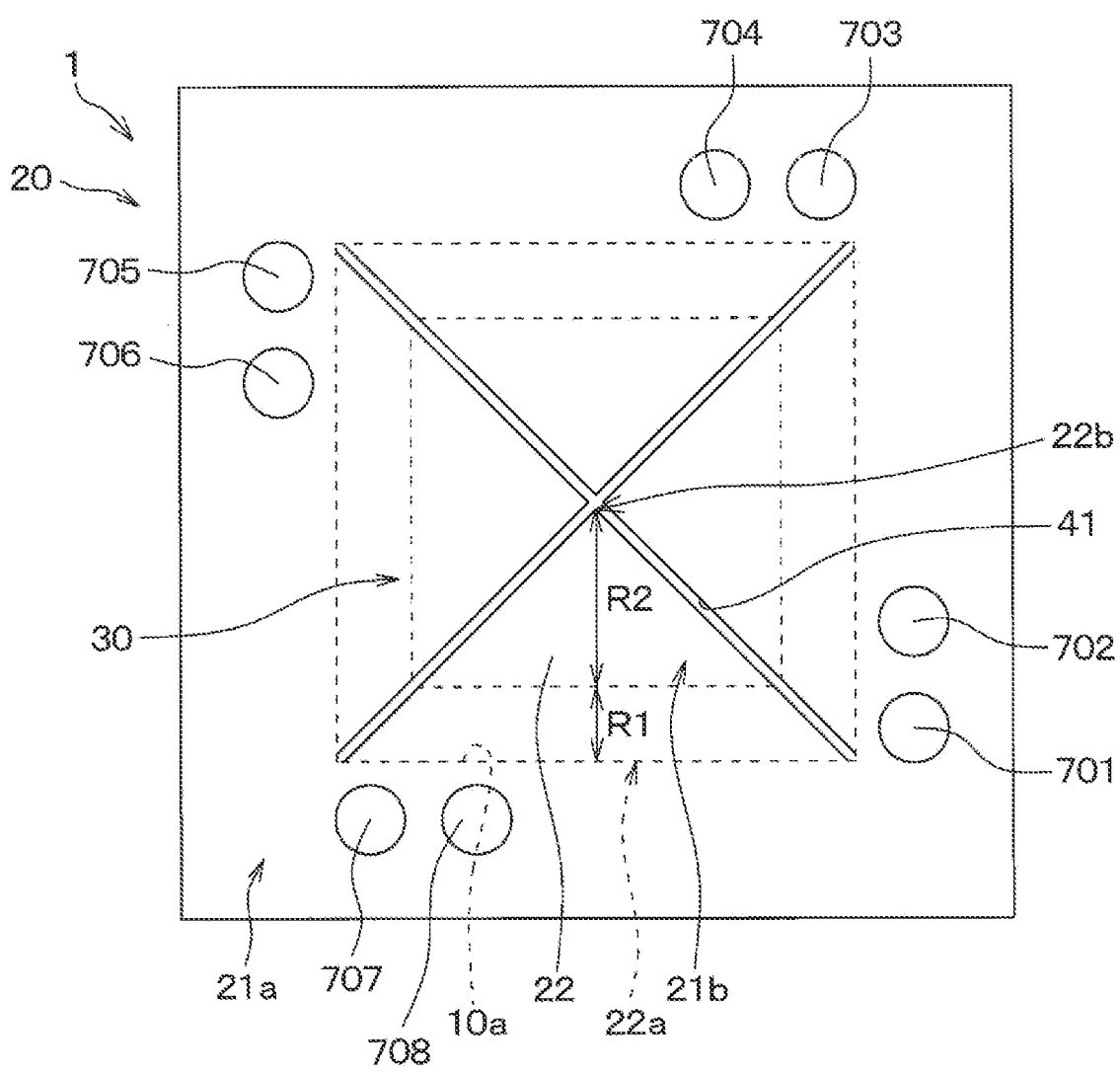
FIG. 16 is a plan view of a piezoelectric element according to a tenth embodiment.

In the present embodiment, as shown in FIG. 16, the piezoelectric element 1 is configured by forming eight pad portions 701 to 708 on the upper piezoelectric film 52. Specifically, the two pad portions are connection pad portions 701 and 702 that are electrically connected to the sensing unit 30. The connection pad portions 701 and 702 correspond to the pad portions 71*c* and 72*c* in the first embodiment. The remaining six pad portions are dummy pad portions 703 to 708 that are not electrically connected to the sensing portion 30.

The eight pad portions 701 to 708 are arranged so as to be symmetrical with respect to the center of the piezoelectric element 1 when viewed from the normal direction. That is, the eight pad portions 701 to 708 are arranged symmetrically with respect to the center of the surface parallel to the surface direction of one surface 11*a* of the support substrate 11. In other words, the eight pad portions 701 to 708 are arranged symmetrically with respect to the center of the plane parallel to the plane direction of the printed circuit board 131 in the piezoelectric element 1 when the piezoelectric element 1 is mounted on the printed circuit board 131. Further, the connection pad portions 701 and 702 are arranged so as to be close to each other.

Figure 17:
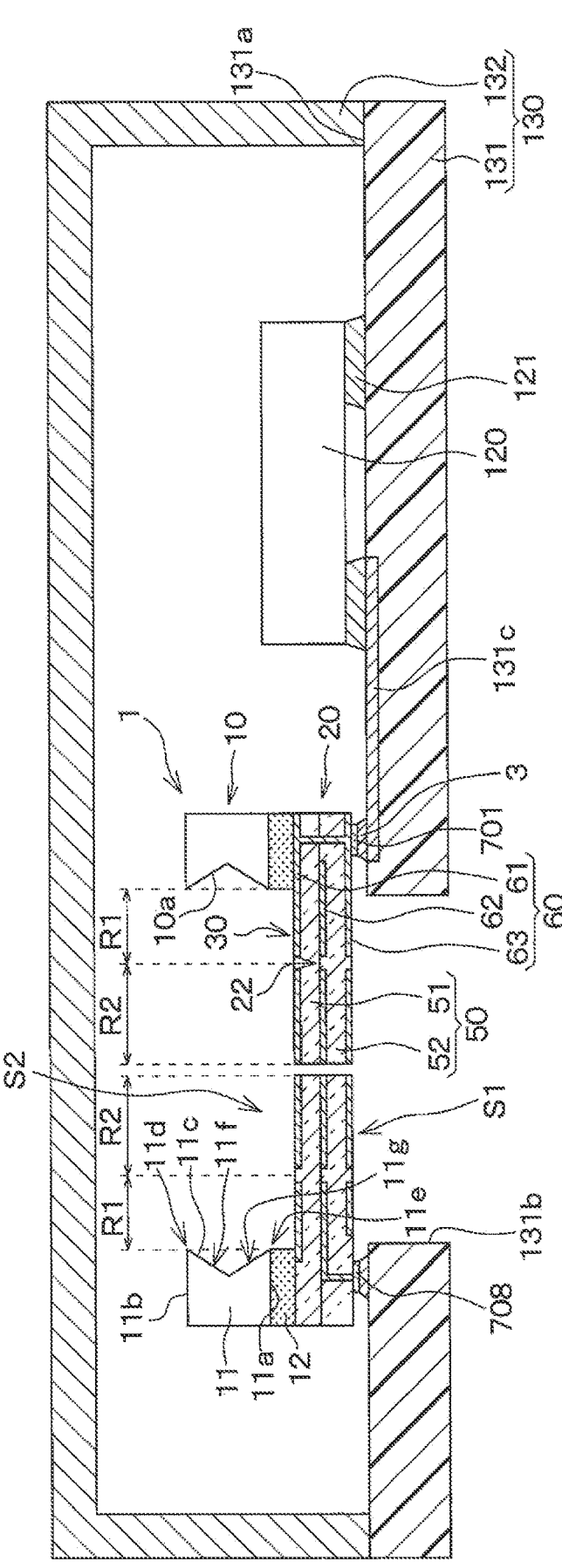
FIG. 17 is a cross-sectional view of a piezoelectric device according to the tenth embodiment.

The above is the configuration of the piezoelectric element 1 in this embodiment. As shown in FIG. 17, the piezoelectric device 1 is configured by flip-chip mounting the piezoelectric element 1 on the printed circuit board 131. Specifically, in the piezoelectric element 1, each pad portion 701 to 708 is connected to the printed circuit board 131 via a bonding member 3 made of a conductive member such as solder. Further, the piezoelectric element 1 is arranged on the printed circuit board 131 so that the connection pad portions 701 and 702 are located on the circuit board 120 side. The piezoelectric element 1 is electrically connected to the circuit board 120 via the wiring portions 131*c* formed on the printed circuit board 131 in which the connection pad portions 701 and 702 are arranged.

The wiring portion 131*c* of the present embodiment is formed so as to connect the pad portions 701 and 702 and the circuit board 120 in the shortest distance. Further, in the present embodiment, all the pad portions 701 to 708 are electrically connected to the printed circuit board 131. That is, all the pad portions 701 to 708 are prevented from being in a floating state.

Further, in the present embodiment, the through hole 131*b* is formed in the printed circuit board 131. Therefore, in the present embodiment, the sound pressure is detected by applying the sound pressure to the sensing unit 30 through the through hole 131*b*. Therefore, in the present embodiment, in the casing 130, the space between the portion where the through hole 131*b* is formed and the sensing portion 30 provides the pressure receiving surface space S1, and the space opposite to the pressure receiving surface space S1 with the sensing portion 30 interposed therebetween provides the back space S2.

As described above, the back space S2 includes a space located on the opposite side of the pressure receiving surface space S1 with the sensing unit 30 interposed therebetween, and can be said to be a continuous space with the space without passing through the separation slit 41. Therefore, in the piezoelectric device as shown in FIG. 17, the space located on the opposite side of the pressure receiving surface space S1 with the sensing unit 30 interposed therebetween, and the space including the space around the piezoelectric element 1 continuous with the space without passing through the separation slit 41 provide the back space S2.

According to the present embodiment described above, it is possible to suppress a decrease in detection accuracy by reducing the parasitic capacitance.

Figure 18:
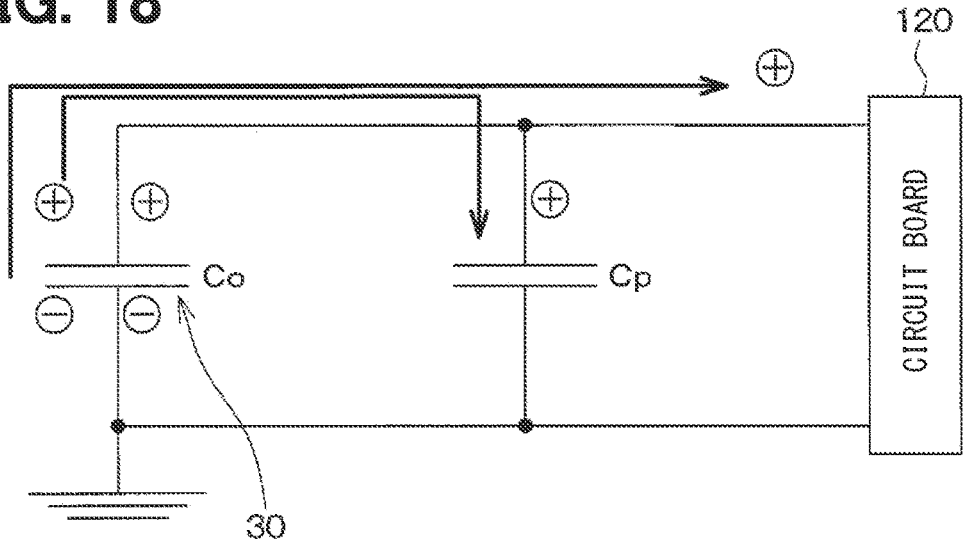
FIG. 18 is a circuit diagram showing a connection relationship between a sensing unit, a parasitic capacitance, and a circuit board.

That is, as shown in FIG. 18, in the piezoelectric device, the total capacitance of the sensing unit 30 is defined as Co and the parasitic capacitance configured between the piezoelectric element 1 and the circuit board 120 is defined as Cp, and the parasitic capacitance Cp is arranged between the circuit board 120 and the capacitance Co. When the parasitic capacitance Cp is large, the ratio of the electric charge flowing from the sensing unit 30 to the parasitic capacitance Cp becomes large, and the detection accuracy decreases. The parasitic capacitance Cp is the sum of the capacitance of the portion connecting the piezoelectric element 1 (that is, the sensing unit 30) and the circuit board 120, the capacitance generated inside the circuit board 120, and the like.

Therefore, the piezoelectric element 1 of the present embodiment is flip-chip mounted on the printed circuit board 131 and connected to the circuit board 120 via the wiring portion 131*c* formed on the printed circuit board 131. The piezoelectric element 1 is arranged on the printed circuit board 131 so that the connection pad portions 701 and 702 are disposed on the circuit board 120 side. Therefore, as compared with the case where the piezoelectric element 1 and the circuit board 120 are connected by the bonding wire 133, the wiring portion 131*c* connecting the piezoelectric element 1 and the circuit board 120 can be easily shortened. Therefore, it is possible to suppress a decrease in detection accuracy by reducing the parasitic capacitance Cp.

Further, in the present embodiment, the piezoelectric element 1 is flip-chip mounted on the printed circuit board 131 to form a through hole 131*b* in the printed circuit board 131. Therefore, as compared with the case where the through hole 132*a* is formed in the lid portion 132 as in the ninth embodiment, the pressure receiving surface space S1 can be made smaller and the air spring in the pressure receiving surface space S1 can be made larger. Therefore, it is possible to suppress the dispersion of the sound pressure induced from the through hole 132*a*, and it is possible to improve the detection accuracy by improving the detection sensitivity. In this embodiment, the through hole 132*a* may be formed in the lid portion 132 as in the ninth embodiment. Even with such a piezoelectric device, it may be difficult to reduce the pressure receiving surface space S1, but it is possible to reduce the parasitic capacitance Cp.

Further, in the present embodiment, the pad portions 701 to 708 are arranged symmetrically with respect to the center of the piezoelectric element 1. Therefore, when the piezoelectric element 1 is flip-chip mounted, it is possible to prevent the piezoelectric element 1 from tilting with respect to the printed circuit board 131.

Since the dummy pad portions 703 to 708 are not connected to the sensing portion 30, they may be bonded to the printed circuit board 131 with an adhesive or the like. Here, by connecting the dummy pad portions 703 to 708 to the printed circuit board 131 with a bonding member 3 such as solder, the dummy pad portions 703 to 708 can also be maintained at a predetermined potential. Therefore, it is possible to suppress the generation of unnecessary noise as compared with the case where the dummy pad portions 703 to 708 are in the floating state. Further, by arranging the same material between each pad portion 701 to 708 and the printed circuit board 131, the piezoelectric element 1 can be made difficult to tilt. Therefore, it may be preferable to arrange the same bonding member 3 between the dummy pad portions 703 to 708 and the printed circuit board 131. Further, the piezoelectric element 1 may be prevented from tilting by arranging an underfill material or the like instead of arranging the dummy pad portions 703 to 708.

Further, in the present embodiment, the piezoelectric element 1 can be suppressed from tilting, alternatively, for example, the dummy pad portions 703 to 708 may not be arranged. Even with such a piezoelectric device, the piezoelectric element 1 may tend to tilt, but the parasitic capacitance Rp can be reduced.

Eleventh Embodiment

An eleventh embodiment will be described. In this embodiment, the shape of the intermediate electrode film 62 is changed from that of the first embodiment. The remaining configuration is similar to that according to the first embodiment and will thus not be described repeatedly.

Figure 19:
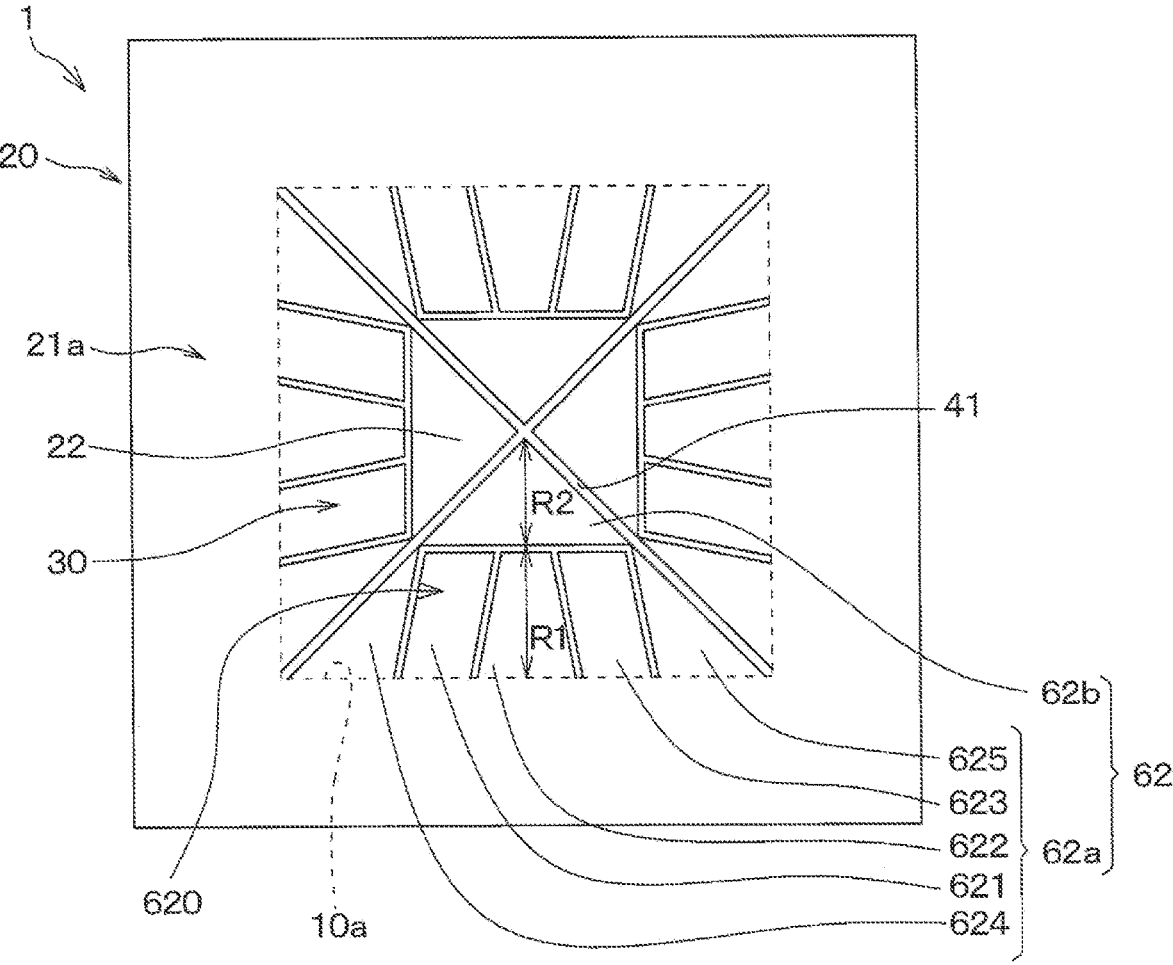
FIG. 19 is a plan view showing the shape of the intermediate electrode film in an eleventh embodiment.

In the present embodiment, as shown in FIG. 19, the intermediate electrode film 62 is divided into a first intermediate electrode film 62a formed in the first region R1 and a second intermediate electrode film 62b formed in the second region R2. The first intermediate electrode film 62a is further divided into a plurality of charge regions 620 and dummy regions 624 and 625. In this embodiment, the plurality of charge regions 620 are three charge regions 621 to 623. Therefore, in each vibration region 22, the piezoelectric element 1 is in a state in which a capacitance is configured between the plurality of charge regions 620 and the lower electrode film 61 and the upper electrode film 63 facing the charge regions 620.

Although FIG. 19 shows the shape of the intermediate electrode film 62 located in the vibration region 22, the intermediate electrode film 62 is appropriately extended to the support region 21a as well. Further, in the present embodiment, the intermediate electrode film 62 divided into a plurality of charge regions 621 to 623 corresponds to the improvement unit.

The plurality of charge regions 621 to 623 have the same area. That is, the dummy regions 624 and 625 are configured so that the charge regions 621 to 623 have the same area. Although not shown in particular, the plurality of charge regions 621 to 623 are connected in series to each other via a wiring or the like (not shown) in a portion located on the support region 21a. Therefore, in each vibration region 22, a plurality of capacitances are connected in series. On the other hand, the dummy regions 624 and 625 are not connected to the charge regions 621 to 623 and are in a floating state.

Although not particularly shown, the lower electrode film 61 and the upper electrode film 63 are formed so as to face the first intermediate electrode film 62a and the second intermediate electrode film 62b, respectively.

According to the present embodiment described above, the first intermediate electrode film 62a is divided into a plurality of charge regions 621 to 623. The plurality of charge regions 621 to 623 are connected in series. Therefore, in one first region R1, a plurality of capacitances are connected in series, and the detection sensitivity can be improved by increasing the capacitances. Further, the plurality of charge regions 621 to 623 have the same area. Therefore, the plurality of capacitances configured in one first region R1 are equal to each other. Therefore, it is possible to suppress the generation of noise between each capacitance and suppress the deterioration of the detection accuracy.

In the present embodiment, an example of dividing the first intermediate electrode film 62a into three charge regions 621 to 623 has been described, alternatively, the charge regions 621 to 623 may be two or four or more.

Further, in the present embodiment, an example of dividing the first intermediate electrode film 62a into a plurality of charge regions 621 to 623 has been described, alternatively, the lower electrode film 61 and the upper electrode film 63 may be divided into a plurality of charge regions and dummy regions. The same effect can be obtained by dividing the lower electrode film 61 and the upper electrode film 63 into a plurality of charge regions and dummy regions. Here, as described above, the intermediate electrode film 62 is arranged between the lower electrode film 61 and the upper electrode film 63, and when the intermediate electrode film 62 is divided, only the intermediate electrode film 62 needs to be divided. Therefore, the configuration can be simplified.

Modification of Eleventh Embodiment

Figure 20:
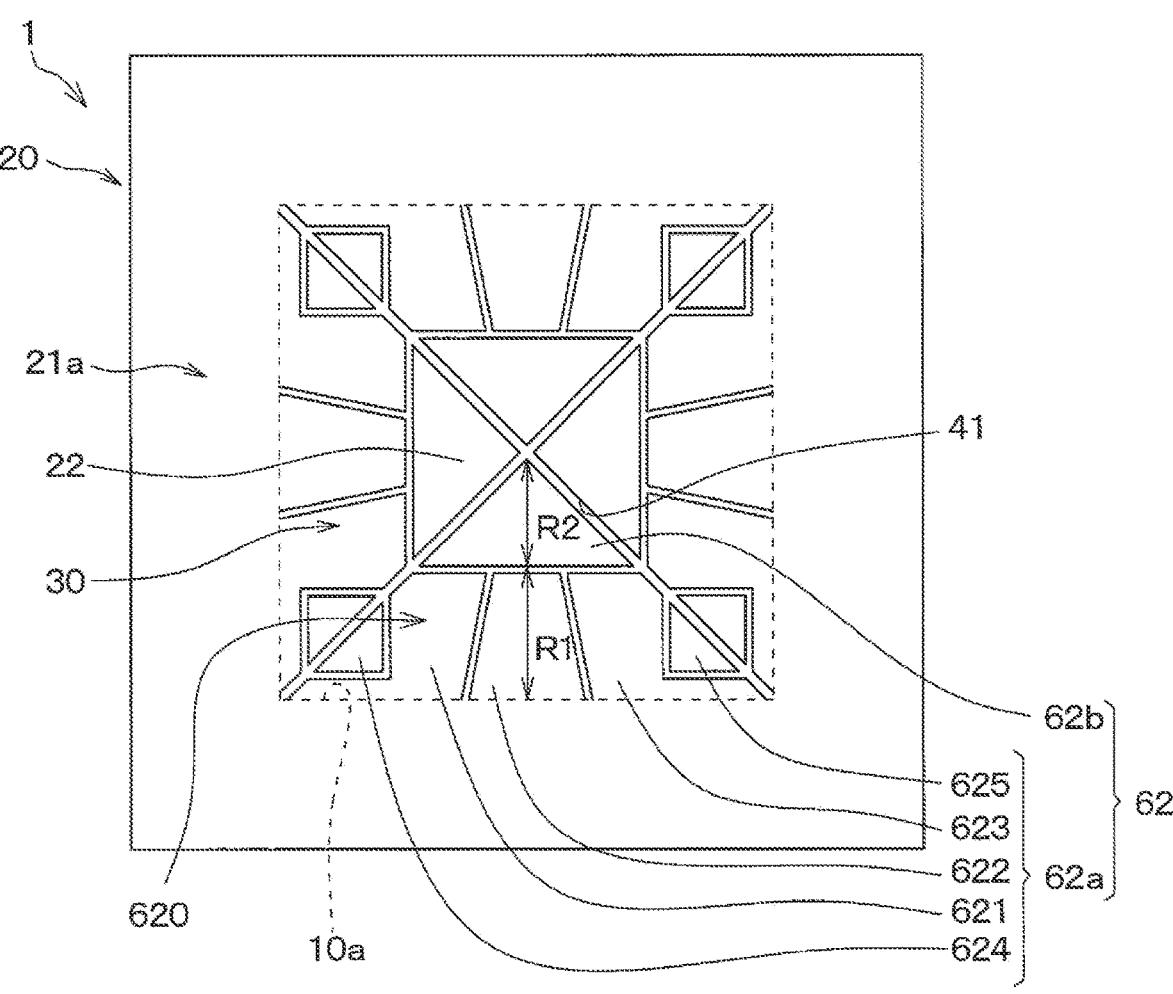
FIG. 20 is a plan view showing the shape of the intermediate electrode film in the modified example of the eleventh embodiment.

The modification of the eleventh embodiment will be described below. In the eleventh embodiment, as shown in FIG. 20, the charge regions 621 and 623 may not have a rectangular shape. That is, the positions and shapes of the dummy regions 624 and 625 can be appropriately changed as long as the three charge regions 621 to 623 are equal to each other. Further, when the areas of the three charge regions 621 to 623 are equal to each other, the dummy regions 624 and 625 may not be formed.

Twelfth Embodiment

A twelfth embodiment will be described. This embodiment defines how to partition the first region R1 and the second region R2 with respect to the first embodiment. The remaining configuration is similar to that according to the first embodiment and will thus not be described repeatedly.

Figure 21:
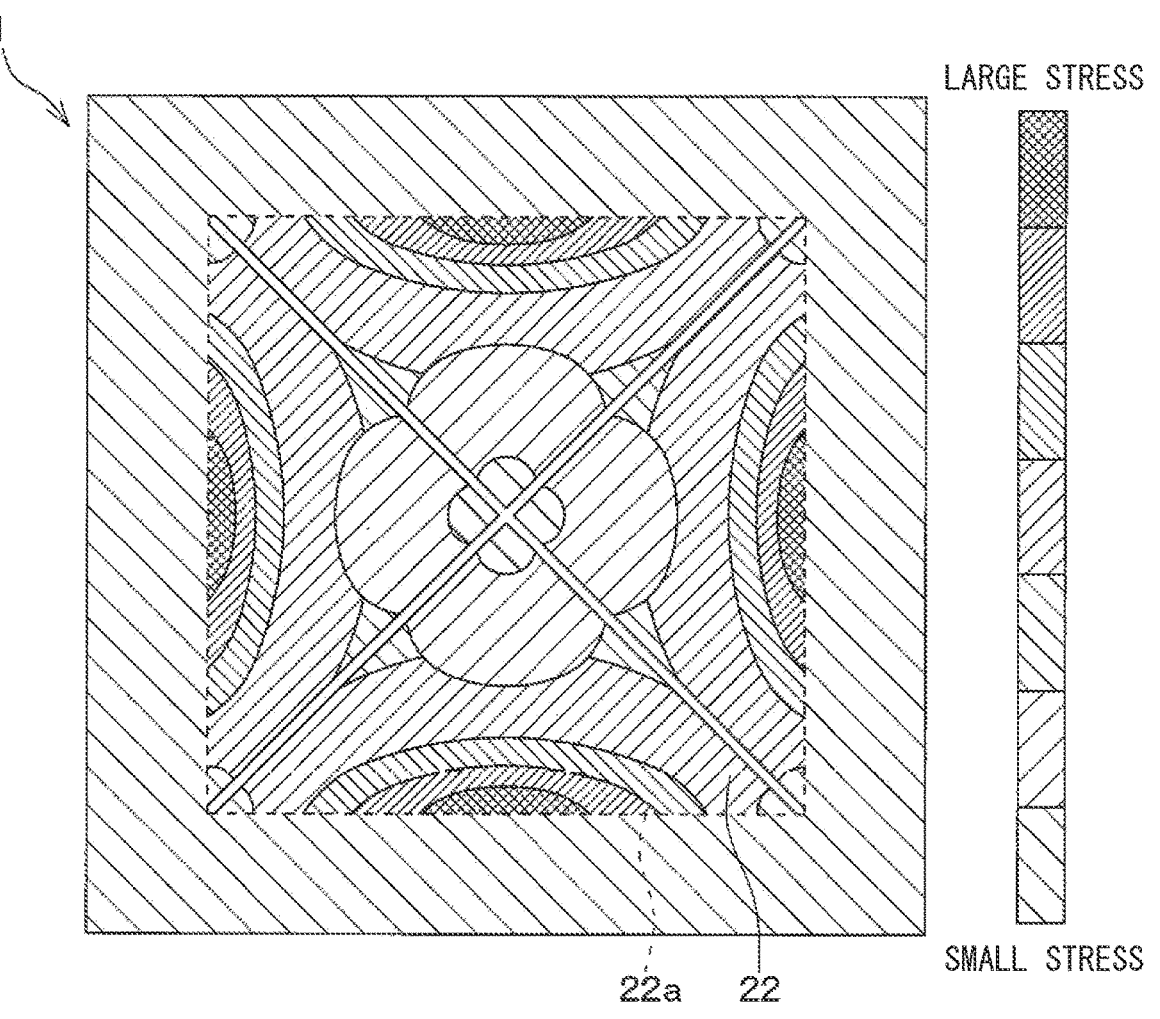
FIG. 21 is a diagram showing a stress distribution of a piezoelectric element according to a twelfth embodiment.
Figure 22:
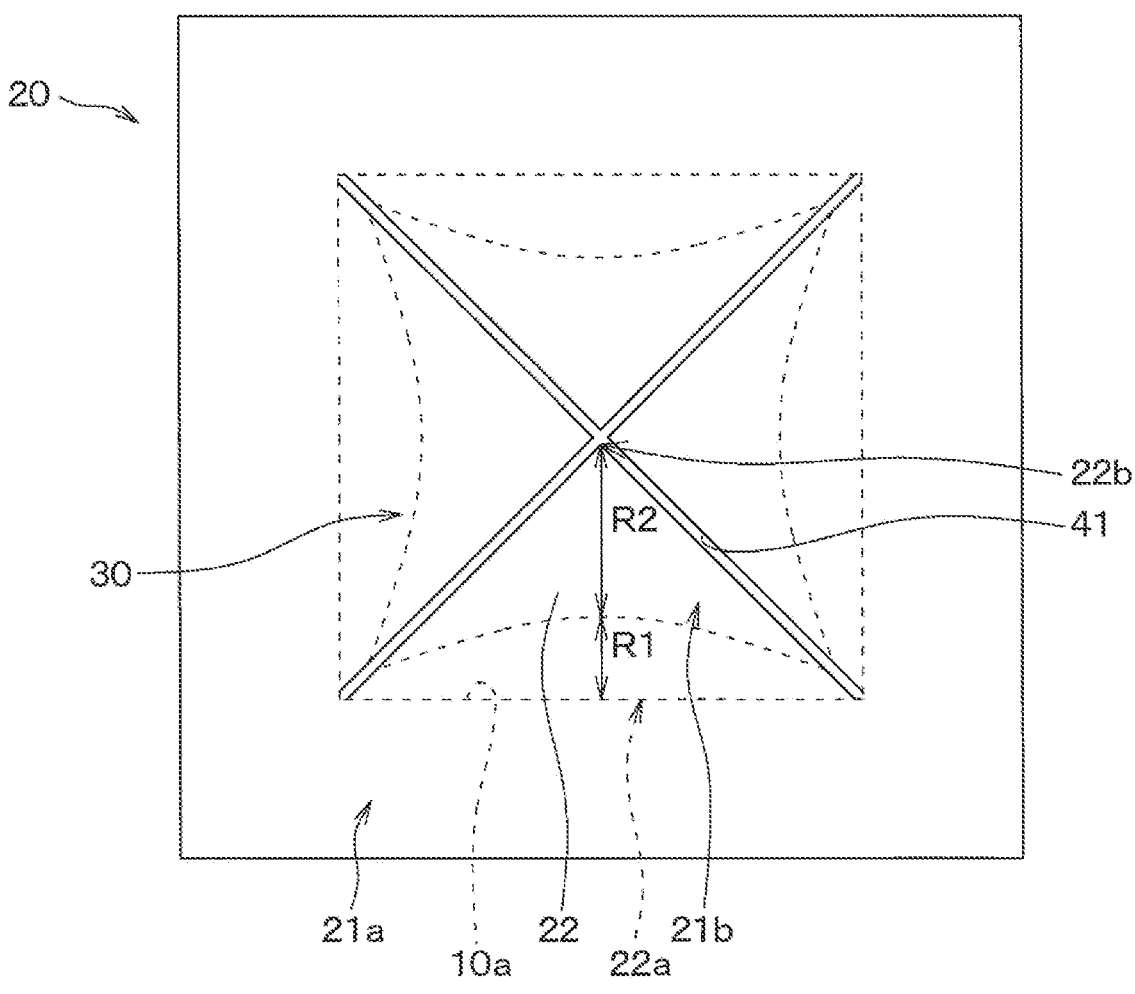
FIG. 22 is a plan view of a piezoelectric element according to the twelfth embodiment.

First, in the piezoelectric element 1 as described above, when sound pressure is applied to the sensing unit 30, the stress distribution is as shown in FIG. 21. Specifically, the stress may tend to be highest in the vicinity of the central portion on the one end portion 22a side, and gradually decreases toward the other end portion 22b side. Therefore, in the present embodiment, as shown in FIG. 22, the first region R1 and the second region R2 are partitioned based on the stress distribution.

Figure 23:
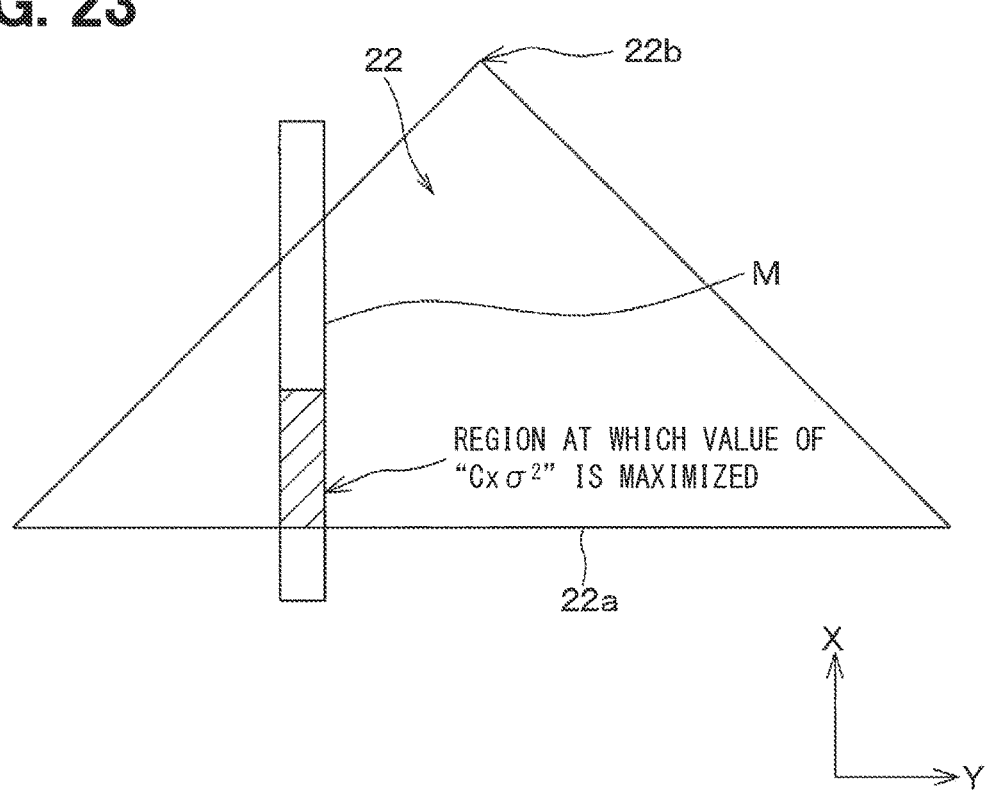
FIG. 23 is a diagram for explaining the concept of electrostatic energy in the vibration region.

Hereinafter, a method of partitioning the first region R1 and the second region R2 in the present embodiment will be described. The method of partitioning in this embodiment may be particularly effective when the sensitivity output is expressed by voltage. First, in order to improve the sensitivity of the piezoelectric element 1, the electrostatic energy E generated in the first region R1 may be increased. Here, as shown in FIG. 23, the direction along the one end portion 22a in the vibration region 22 is defined as the Y direction, and the direction orthogonal to the Y direction is defined as the X direction. Then, in the minute virtual region M in which the vibration region 22 is divided into a plurality of parts along the X direction, the capacitance of the virtual region M is C, and the average value of the stress generated in the virtual region M is σ. Further, the electrostatic energy E is represented by $\frac{1}{2} \times C \times V^2$, where V is the voltage generated in the virtual region M. The generated voltage V is proportional to the generated stress σ.

Figure 24:
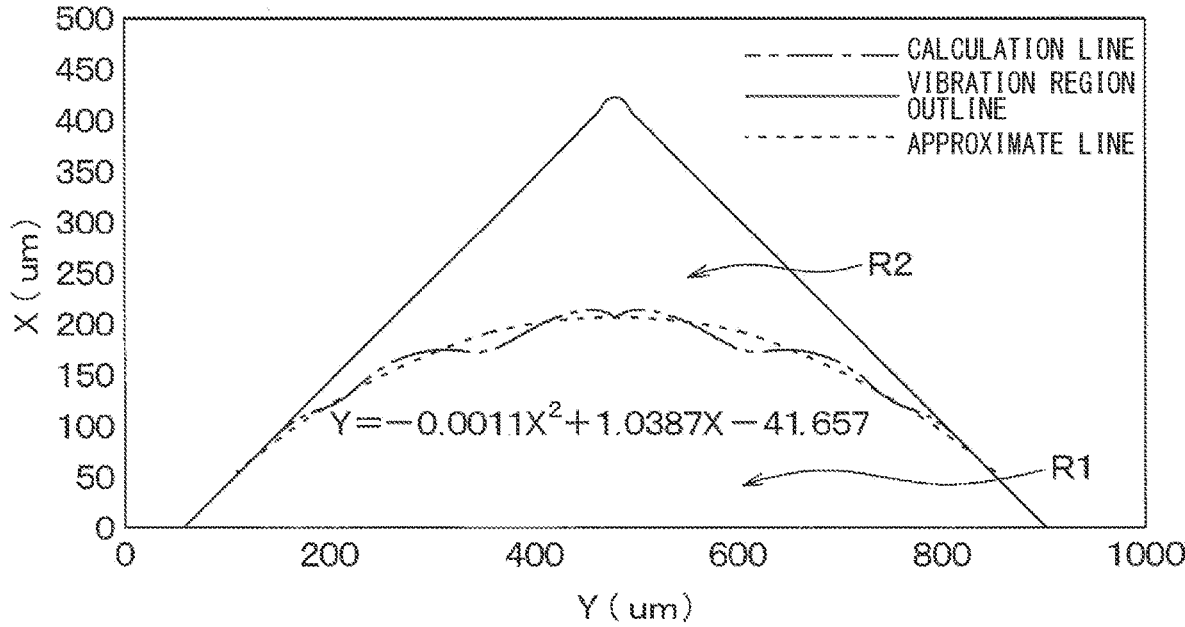
FIG. 24 is a schematic diagram in which a vibration region is divided into a first region and a second region based on FIG. 23.

Therefore, in the present embodiment, as shown in FIGS. 23 and 24, the area where $C \times \sigma^2$ of each virtual area M is maximized is calculated, and the boundary line connecting the areas where $C \times \sigma^2$ of each virtual area M is maximum is used to partition the first region R1 and the second region R2. In this case, as shown in FIG. 24, the first region R1 and the second region R2 may be partitioned by using the calculation line connecting the calculated values as the boundary line, or he first region R1 and the second region R2 may be partitioned by using the approximate line based on the calculation line as the boundary line.

In this embodiment, the method of partitioning the first region R1 and the second region R2 corresponds to the improvement unit. Further, FIG. 24 shows an example in which the length of one end portion 22a in the vibration region 22 along the Y direction is 850 μm, and the length from one end portion 22a to the other end portion 22b is 425 μm. In this case, the approximate equation is expressed by the following equation 1.

$$Y=-0.0011X^2+1.0387X-41.657 \qquad \text{(Equation 1)}$$

According to the present embodiment described above, the first region R1 and the second region R2 are partitioned so that the electrostatic energy E of the first region R1 is high. Therefore, the detection sensitivity can be improved and the detection accuracy can be improved.

Modified Example of Twelfth Embodiment

Figure 25:
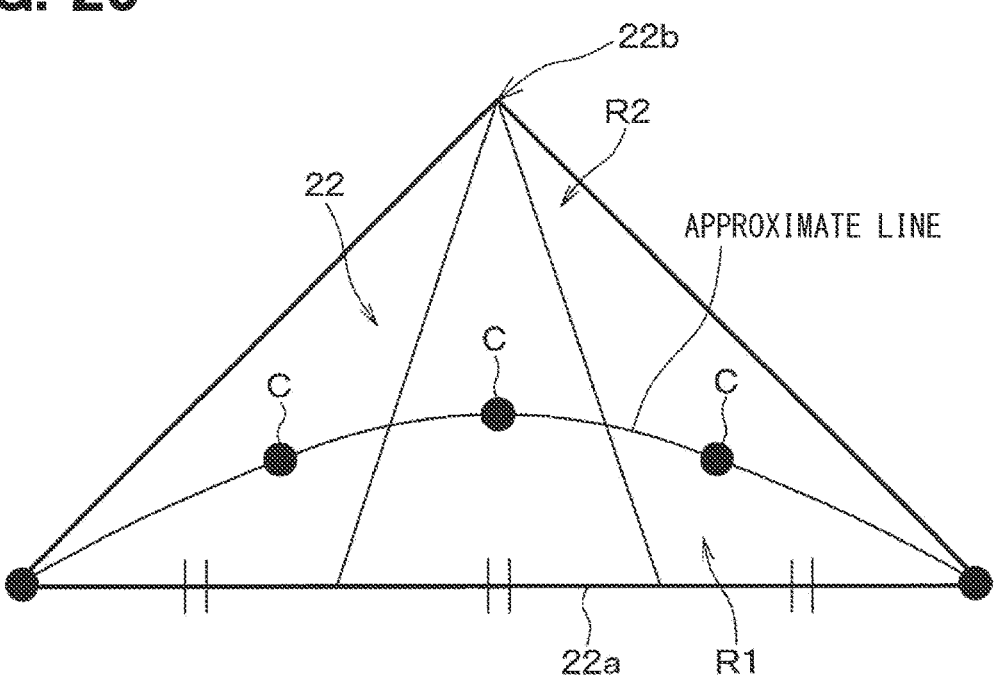
FIG. 25 is a schematic diagram in which a vibration region is divided into a first region and a second region according to a modified example of the twelfth embodiment.

The modification of the twelfth embodiment will be described below. The first region R1 and the second region R2 may be divided as shown in FIG. 25. That is, since the vibration region 22 has a planar triangular shape, the triangle is divided so as to divide one end portion 22a into three equal parts, and the first region R1 and the second region R2 may be divided by the boundary line connecting each center of gravity position C of the three triangles and both ends of the one end portion 22a. Even when the first region R1 and the second region R2 are partitioned in this way, the first region R1 and the second region R2 are partitioned in a region close to the approximate line of the twelfth embodiment to include the region where the electrostatic energy E becomes high. Therefore, the detection sensitivity can be improved and the detection accuracy can be improved.

Further, in the twelfth embodiment, the example in which the vibration region 22 has a planar triangular shape has been described, alternatively, the shape of the vibration region 22 can be changed as appropriate. For example, the vibration region 22 may have a planar rectangular shape or a planar fan shape. Even in the vibration region 22 as described above, the same effect as that of the twelfth embodiment can be obtained by partitioning the first region R1 and the second region R2 by the same method as that of the twelfth embodiment.

Thirteenth Embodiment

A thirteenth embodiment will be described. This embodiment defines how to partition the first region R1 and the second region R2 with respect to the twelfth embodiment. Descriptions of the same configurations and processes as those of the twelfth embodiment will not be repeated hereinafter.

Figure 26:
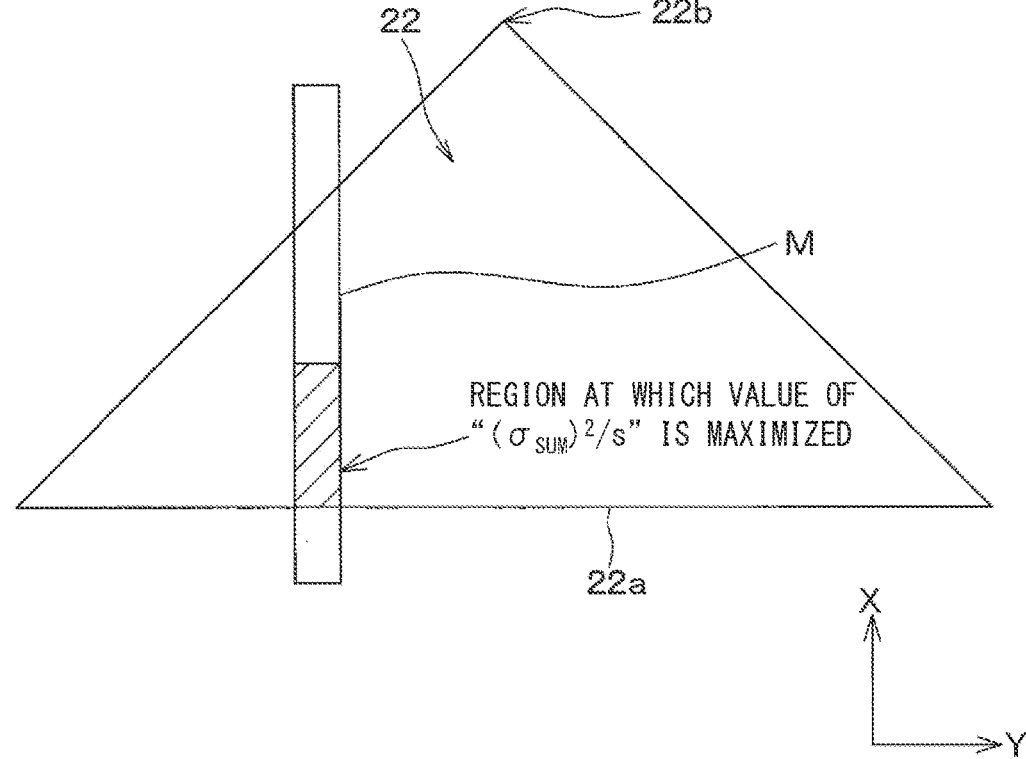
FIG. 26 is a diagram for explaining the concept of electrostatic energy in the vibration region of a thirteenth embodiment.
Figure 27:
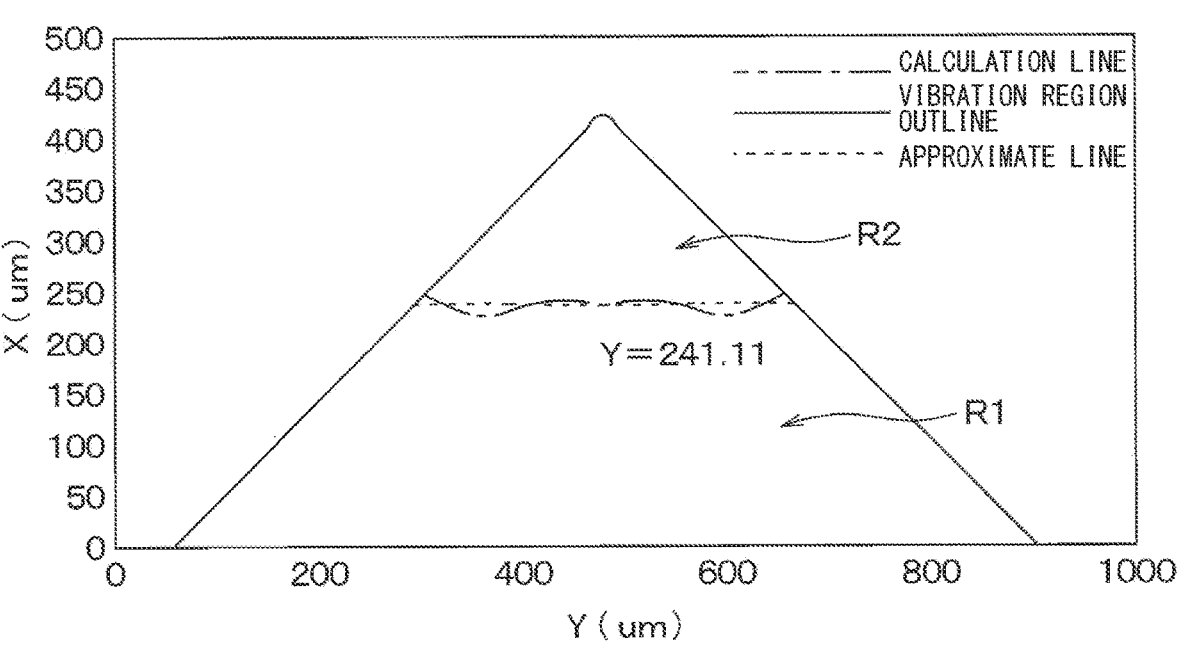
FIG. 27 is a schematic diagram in which a vibration region is divided into a first region and a second region based on FIG. 26.

Hereinafter, a method of partitioning the first region R1 and the second region R2 in the present embodiment will be described. The method of partitioning in this embodiment may be particularly effective when the sensitivity output is expressed by electric charge. In this embodiment, the area of the virtual area M is defined as S, and the sum of the stresses generated in the virtual area M is defined as σsum, as compared to the twelfth embodiment. Then, $\frac{1}{2} \times C \times V^2$ is proportional to $S \times (\sigma sum/S)^2$. That is, $\frac{1}{2} \times C \times V^2$ is proportional to the generated stress per unit area. Therefore, in the present embodiment, as shown in FIGS. 26 and 27, the area where $C \times \sigma^2$ of each virtual area M is maximized is calculated, and the boundary line connecting the areas where $C \times \sigma^2$ of each virtual area M is maximum is used to partition the first region R1 and the second region R2. In this case, as shown in FIG. 27, the first region R1 and the second region R2 may be partitioned by using the calculation line connecting the calculated values as the boundary line, or he first region R1 and the second region R2 may be partitioned by using the approximate line based on the calculation line as the boundary line. Further, FIG. 27 shows an example in which the length of one end portion 22a in the vibration region 22 along the Y direction is 850 μm, and the length from one end portion 22a to the other end portion 22b is 425 μm. In this case, the approximate equation is expressed by the following equation 2.

$$Y=241.11 \qquad \text{(Equation 2)}$$

In this way, even when the first region R1 and the second region R2 are partitioned based on the generated stress per unit area, the same effect as that of the twelfth embodiment can be obtained.

Fourteenth Embodiment

A fourteenth embodiment will be described. In this embodiment, each vibration region 22 is connected in parallel to each other to be bent with respect to the first embodiment. The remaining configuration is similar to that according to the first embodiment and will thus not be described repeatedly.

Figure 28:
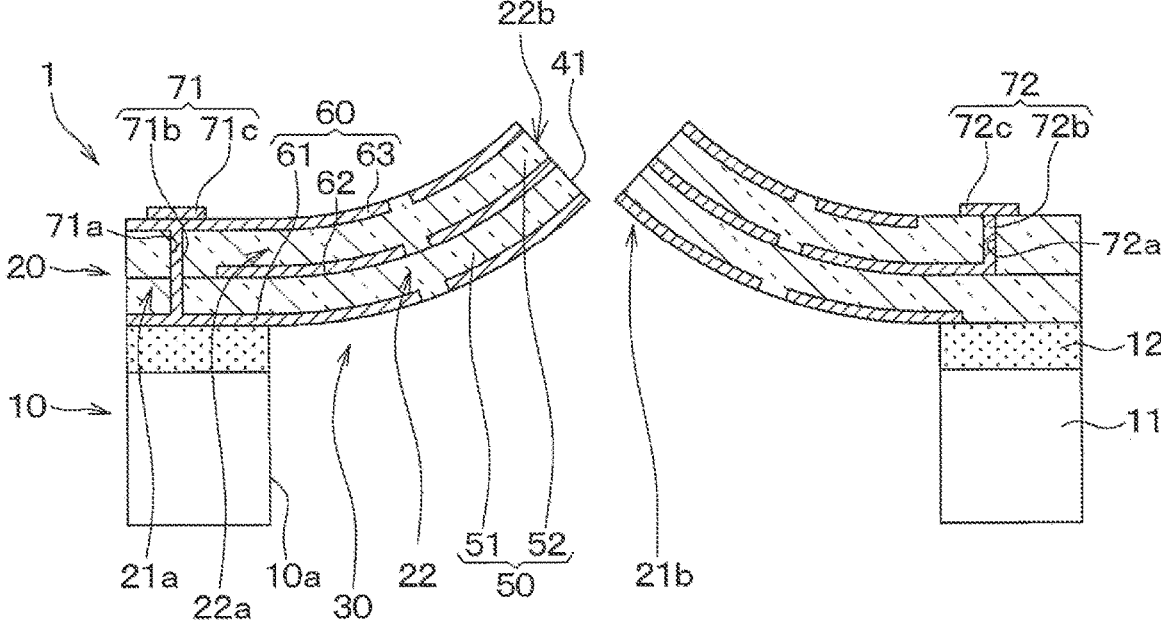
FIG. 28 is a cross-sectional view of a piezoelectric element according to a fourteenth embodiment.

In the present embodiment, as shown in FIG. 28, the piezoelectric element 1 is in a state where the other end portion 22b (that is, the free end) in each vibration region 22 is warped. In the present embodiment, the other end portion 22b in each vibration region 22 is in a state the portion 22b is disposed along the side opposite to the support substrate 11 side. The amount of warpage in each vibration region 22 is the same, and is configured to warp at least the thickness of the piezoelectric film 50 or more, for example.

Figure 29:
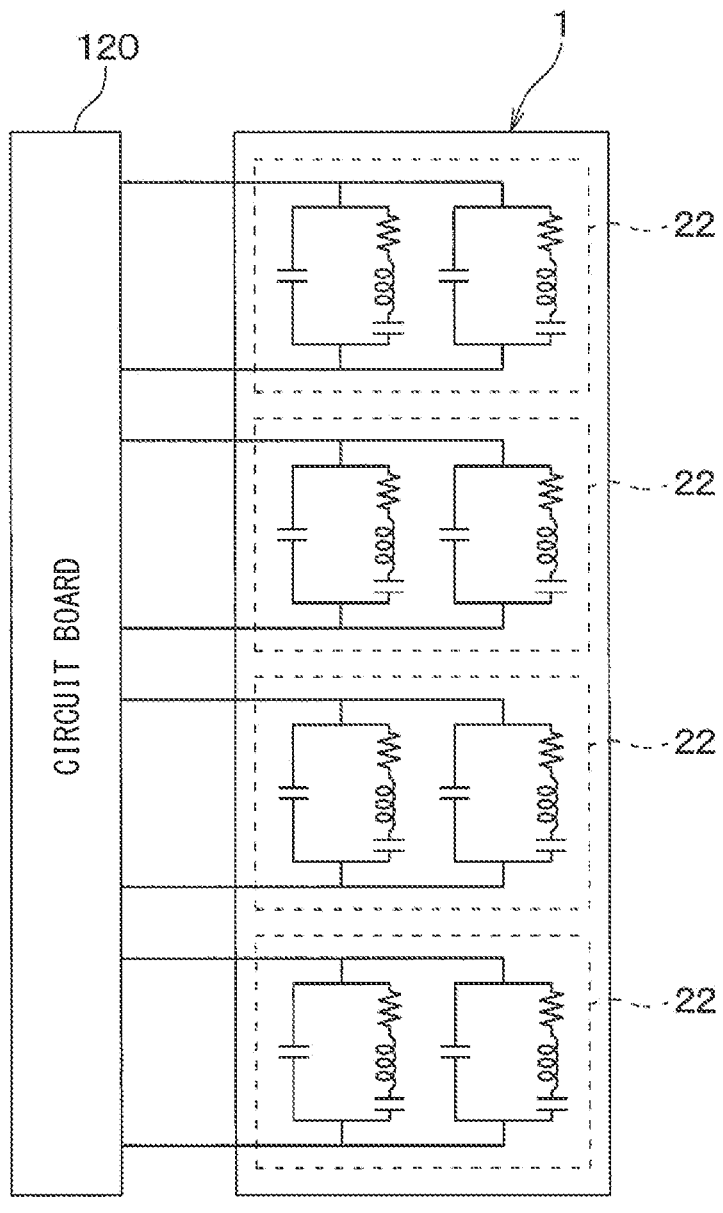
FIG. 29 is a circuit diagram when a piezoelectric device is configured.

Further, each vibration region 22 has a bimorph structure in which the lower piezoelectric film 51 and the upper piezoelectric film 52 are stacked as described above, and can be regarded as the circuit configuration shown in FIG. 29. When the piezoelectric device is configured, each electrode film 60 in each vibration region 22 is connected in parallel to the circuit board 120. That is, in the present embodiment, the pressure detection signal is output to the circuit board 120 from each vibration region 22. In this embodiment, the vibration region 22 has a warpage shape, and the pressure detection signal is output from each vibration region 22 to the circuit board 120, which corresponds to the improvement unit.

The above is the configuration of the piezoelectric element 1 in this embodiment. The piezoelectric element 1 is manufactured as follows. That is, when the piezoelectric film 50 is formed on the insulation film 12 by a sputtering method or the like, a predetermined voltage is applied to the piezoelectric film 50 through the support substrate 11, and a predetermined residual stress is generated to be applied to the formed piezoelectric film 50. After that, the piezoelectric element 1 shown in FIG. 28 is manufactured by forming a separation slit 41 to separate each vibration region 22 and bending the other end portion 22b of each vibration region 22 by residual stress.

Figure 30A:
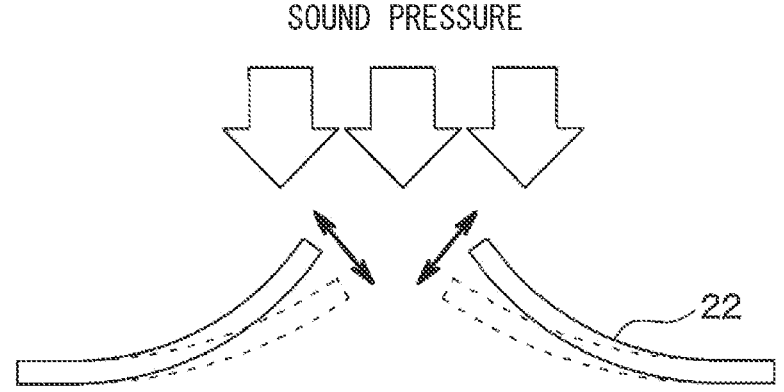
FIG. 30A is a schematic diagram when sound pressure is applied to a vibration region.
Figure 30B:
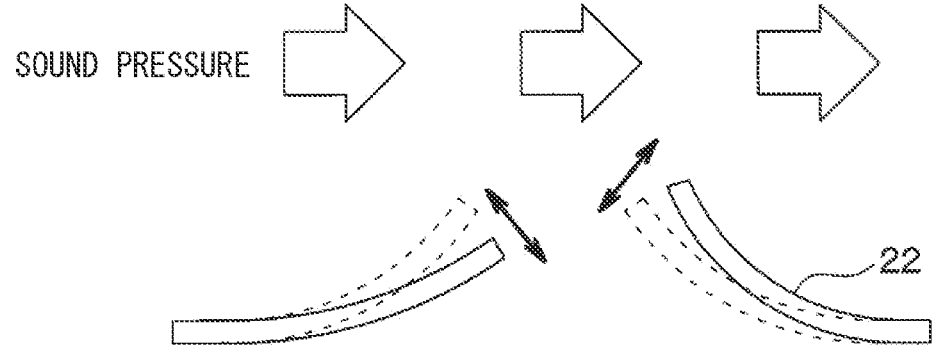
FIG. 30B is a schematic diagram when sound pressure is applied to a vibration region.

Such a piezoelectric element 1 outputs a pressure detection signal from each vibration region 22 as described above. At this time, for example, as shown in FIG. 30A, when the sound pressure is applied to each vibration region 22 from a direction corresponding to the normal direction, the deformation of each vibration region 22 becomes the same and the pressure detection signals output from the vibration regions 22 are also equal to each other. On the other hand, for example, as shown in FIG. 30B, when the sound pressure is applied to each vibration region 22 from a direction intersecting the normal direction, the deformation of each vibration region 22 is different, and the pressure detection signals output from the vibration regions 22 are different. That is, a pressure detection signal corresponding to the direction in which the sound pressure is applied is output from each vibration region 22. Therefore, in the piezoelectric element 1 of the present embodiment, the direction in which the sound pressure is applied can also be detected. That is, the piezoelectric element 1 of the present embodiment is configured to have directivity.

At this time, in the present embodiment, the vibration region 22 is in a warped state. Therefore, in each vibration region 22, the difference in deformation depending on the direction in which the sound pressure is applied may tend to be large. Therefore, it is possible to improve the sensitivity regarding directivity.

According to the present embodiment described above, the piezoelectric element 1 is arranged in a state in which each vibration region 22 is warped. When connected to the circuit board 120, each vibration region 22 is connected in parallel with the circuit board 120. Therefore, it is possible to further improve the sensitivity regarding directivity while providing directivity.

Modified Example of Fourteenth Embodiment

Figure 31:
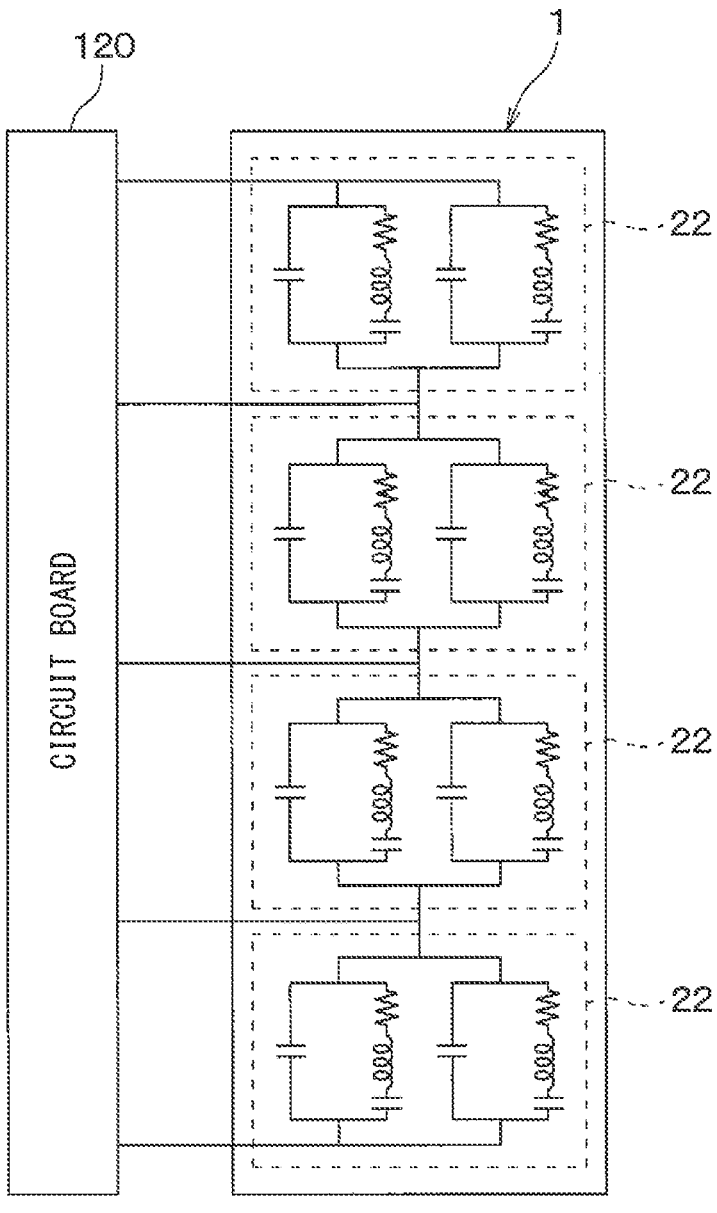
FIG. 31 is a circuit diagram in the case where the piezoelectric device in the modified example of the fourteenth embodiment is configured.

The modification of the fourteenth embodiment will be described below. In the fourteenth embodiment, as shown in FIG. 31, each vibration region 22 may be connected in parallel to the circuit board 120 and also connected in series with each other.

Fifteenth Embodiment

A fifteenth embodiment will be described. In this embodiment, a reflection film is formed in the vibration region 22 as compared with the first embodiment. The remaining configuration is similar to that according to the first embodiment and will thus not be described repeatedly.

Figure 32:
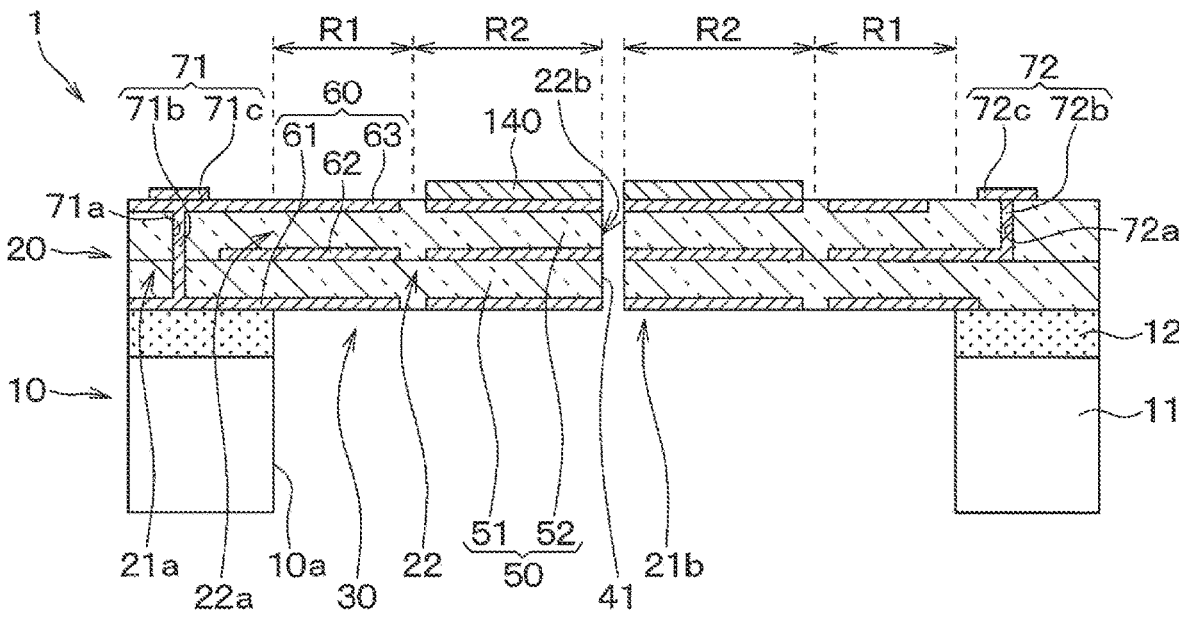
FIG. 32 is a cross-sectional view of a piezoelectric element according to a fifteenth embodiment.

In the present embodiment, as shown in FIG. 32, in each vibration region 22, a reflection film 140 having a higher reflectance than the piezoelectric film 50, the electrode film 60, and the pad portions 71c and 72c is formed on the outermost layer. In the present embodiment, the reflection film 140 is formed on the upper electrode film 63. In other words, a high reflectance means a low absorption rate. Further, in the present embodiment, the reflection film 140 is made of a material having a Young's modulus smaller than that of the piezoelectric film 50, and is made of, for example, an aluminum single-layer film or a multilayer film. The reflection film 140 is formed in the second region R2. In this embodiment, the reflection film 140 corresponds to the improvement unit.

The above is the configuration of the piezoelectric element 1 in this embodiment. Next, the method of manufacturing the piezoelectric element 1 in the present embodiment will be described.

When the piezoelectric element 1 is manufactured, an insulation film 12, a piezoelectric film 50, an electrode film 60, a reflection film 140, and the like are formed in this order on the support substrate 11 and appropriately patterned. Then, after forming the recess portion 10a, the separation slit 41 is formed.

Figure 33:
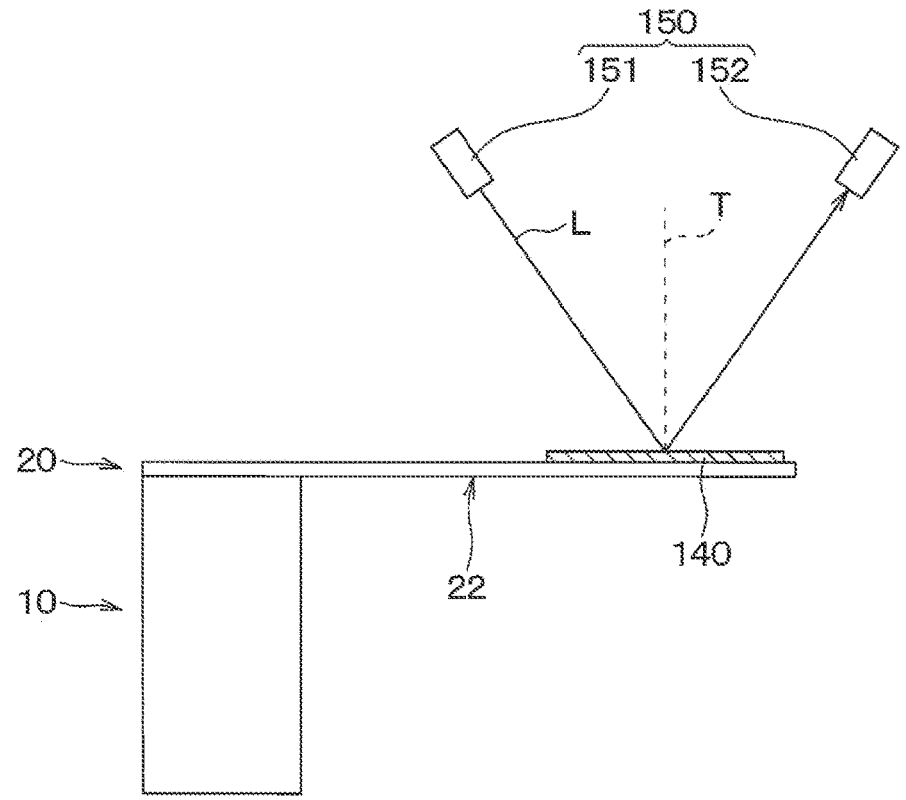
FIG. 33 is a cross-sectional view showing a manufacturing process of a piezoelectric element.

After that, in the present embodiment, a determination of a good or bad quality is made. Specifically, as shown in FIG. 33, a detection device 150 including a laser light source 151 for irradiating the laser beam L and a detector 152 for detecting the intensity of the received laser beam L is prepared. The detector 152 has a control unit (not shown) that makes a determination based on a threshold value, and the control unit includes a microcomputer and the like having a CPU and a memory equipped with a non-transitory tangible storage medium such as a ROM, a RAM, a flash memory, and a HDD. CPU is an abbreviation for Central Processing Unit, ROM is an abbreviation for Read Only Memory, RAM is an abbreviation for Random Access Memory, and HDD is an abbreviation for Hard Disk Drive. The storage medium such as the ROM is a non-transitory tangible storage medium.

In the memory, the intensity when the laser beam L is received under a condition that the vibration region 22 is not warped is stored as a threshold value. Then, the control unit compares the intensity of the laser beam L received by the detector 152 with the threshold value and makes a determination of a good or bad quality.

Figure 34:
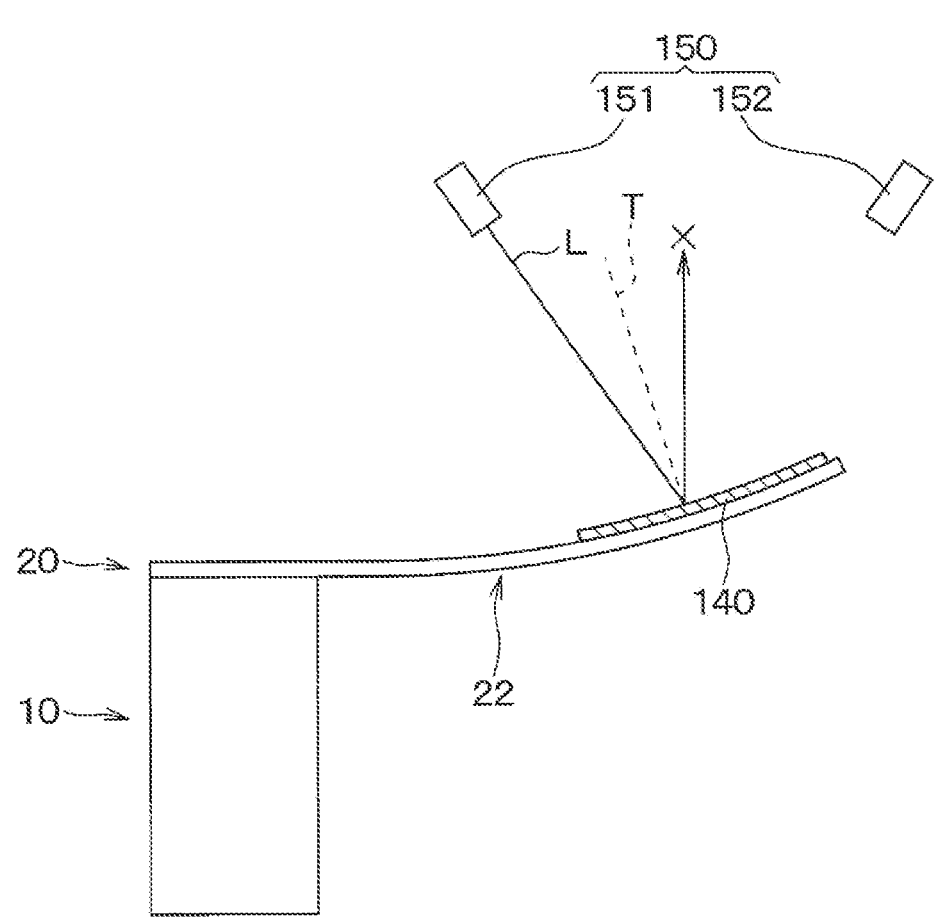
FIG. 34 is a cross-sectional view showing a manufacturing process of a piezoelectric element.

Specifically, the surface along the normal direction with respect to the reflection film 140 arranged in the vibration region 22 is set as the reference surface T, and the laser beam L is irradiated to the reflection film 140 from the direction inclined with respect to the reference surface T. Then, the laser beam L reflected is detected by the detector 152. After that, the detector 152 compares the intensity of the detected laser beam L with the threshold value to make a determination of a good or bad quality. For example, when the intensity of the detected laser beam L is less than 50% of the threshold value, the detector 152 makes a quality determination to determine that the state of the vibration region 22 is abnormal. In this case, for example, as shown in FIG. 34, even when the warp of the vibration region 22 is large and the laser beam L is not detected by the detector 152, it is determined that the state of the vibration region 22 is abnormal. It may be preferable to select a laser beam L having the largest reflectance. For example, when the reflection film 140 is made of aluminum, it may be preferable to use a wavelength in the visible light region of 1 μm or less. When the reflection film 140 is made of another metal film, it may be preferable to use a wavelength in the infrared region.

According to the present embodiment described above, since the reflection film 140 is arranged in the vibration region 22, it is possible to determine the quality of the vibration region 22. Therefore, it is possible to manufacture the piezoelectric element 1 that can suppress the deterioration of the detection accuracy. Further, in the present embodiment, since the quality determination is performed by irradiating the reflection film 140 with the laser beam L, the quality determination can be performed without contact.

Further, the reflection film 140 is made of a material having a Young's modulus smaller than that of the piezoelectric film 50. Therefore, it is possible to suppress the reflection film 140 from inhibiting the deformation of the piezoelectric film 50, and it is possible to suppress the deterioration of the detection accuracy.

Further, the reflection film 140 is arranged in the second region R2. Therefore, it is possible to suppress the influence of the reflection film 140 on the first region R1 in the vibration region 22 where the stress may tend to be large.

This embodiment can also be applied to the fourteenth embodiment. In this case, the threshold value used for the determination may be set to the strength when the amount of warpage of the vibration region 22 becomes a predetermined value.

Sixteenth Embodiment

A sixteenth embodiment will be described. In this embodiment, self-diagnosis is performed when the piezoelectric device is configured as in the ninth embodiment. Descriptions of the same configurations and processes as those of the ninth embodiment will not be repeated hereinafter.

Figure 35:
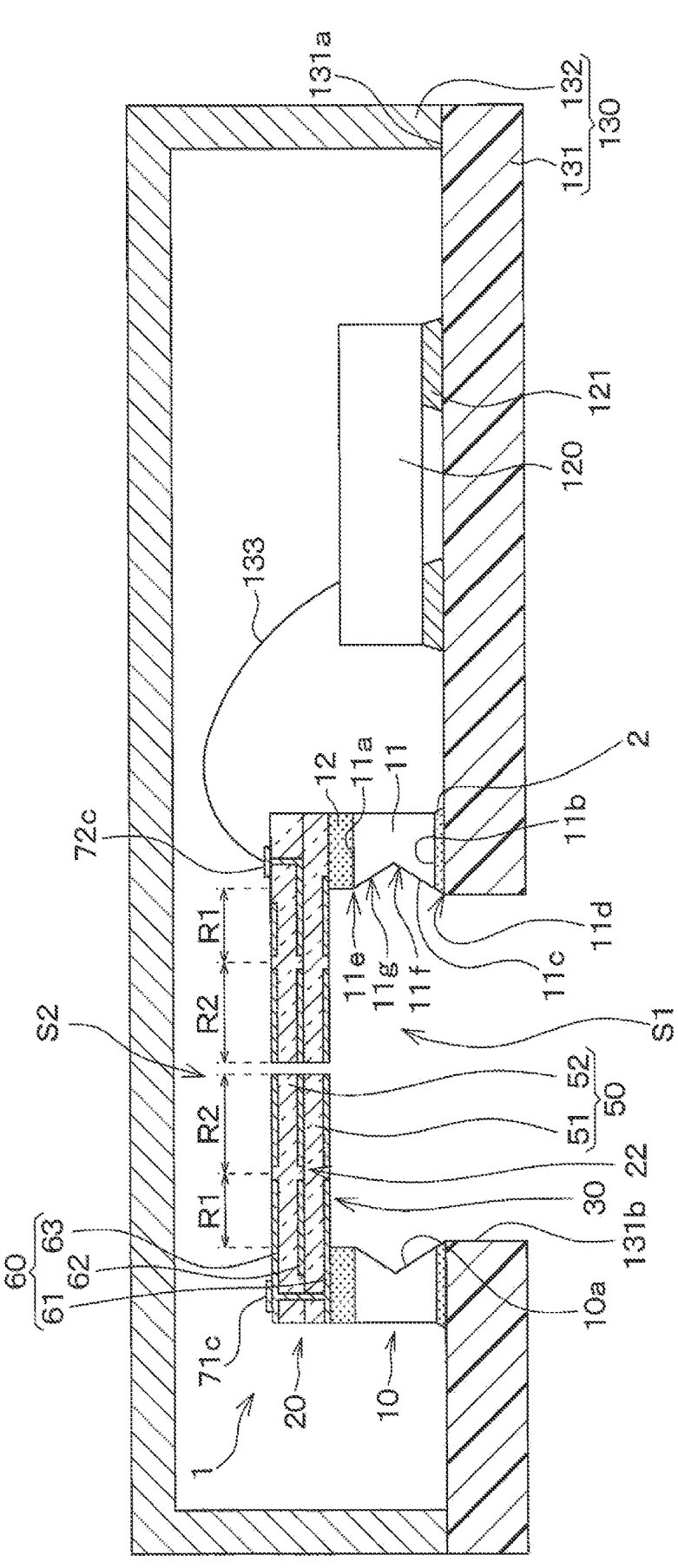
FIG. 35 is a cross-sectional view of a piezoelectric device according to a sixteenth embodiment.

In the piezoelectric device of the present embodiment, as shown in FIG. 35, in the piezoelectric element 1, the other surface 11b of the support substrate 11 is mounted on one surface 131a of the printed circuit board 131 via the bonding member 2. Then, in the present embodiment, the through hole 131b is formed in the printed circuit board 131 as in the piezoelectric device described with reference to FIG. 17 of the tenth embodiment. Therefore, in the present embodiment, the sound pressure is detected by applying the sound pressure to the sensing unit 30 through the through hole 131b. Then, in the present embodiment, the space between the portion where the through hole 131b is formed and the sensing portion 30 in the casing 130 is the pressure receiving surface space S1. Further, the back space S2 includes a space located on the opposite side of the pressure receiving surface space S1 with the sensing unit 30 interposed therebetween, and is continuous with the space without passing through the separation slit 41.

In this embodiment, the piezoelectric device configured as shown in FIG. 35 will be described as an example, alternatively, the following configuration may also be applied to the piezoelectric device configured as in the ninth embodiment and the tenth embodiment.

Figure 36:
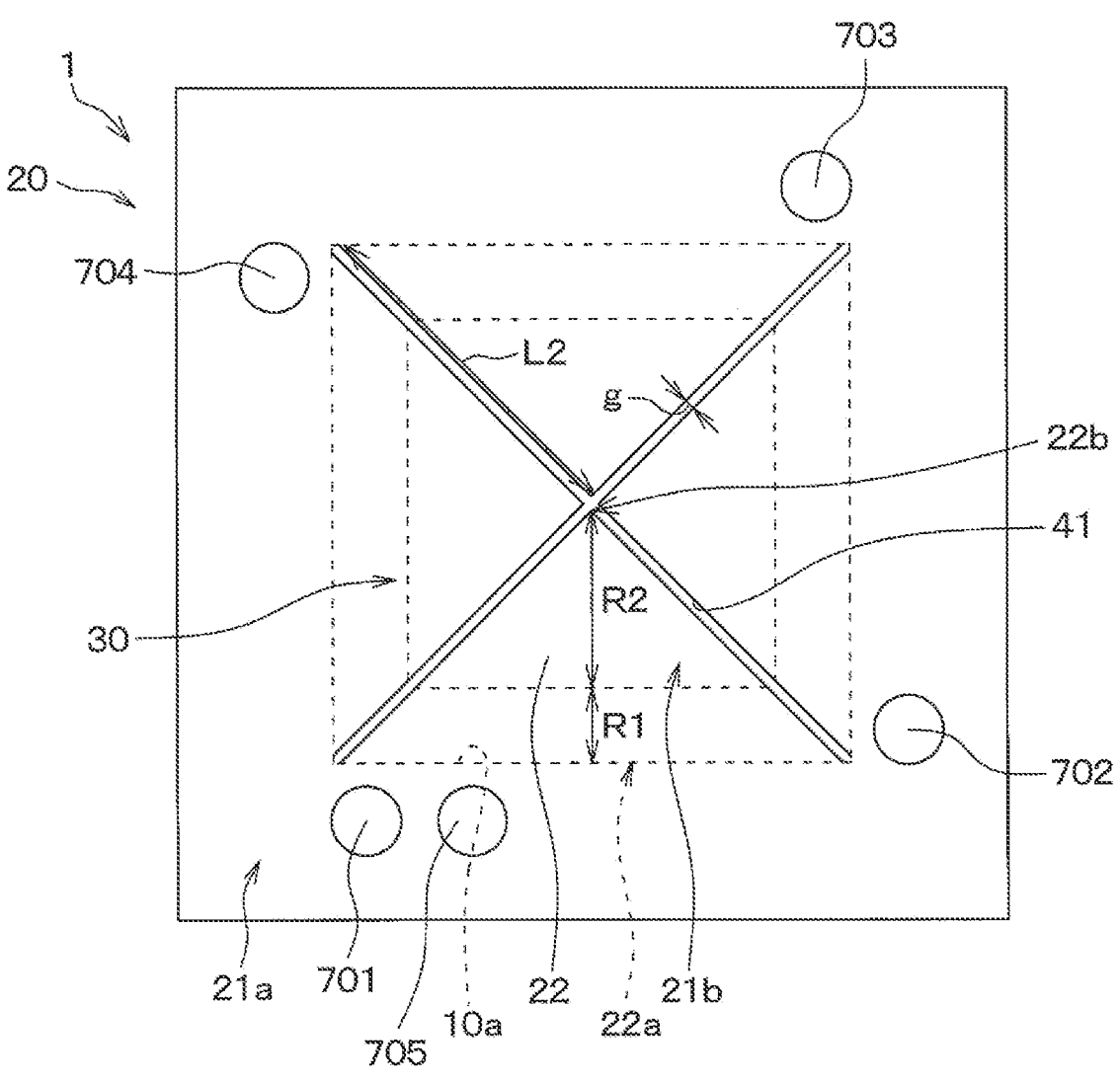
FIG. 36 is a plan view of a piezoelectric element according to to sixteenth embodiment.
Figure 37:
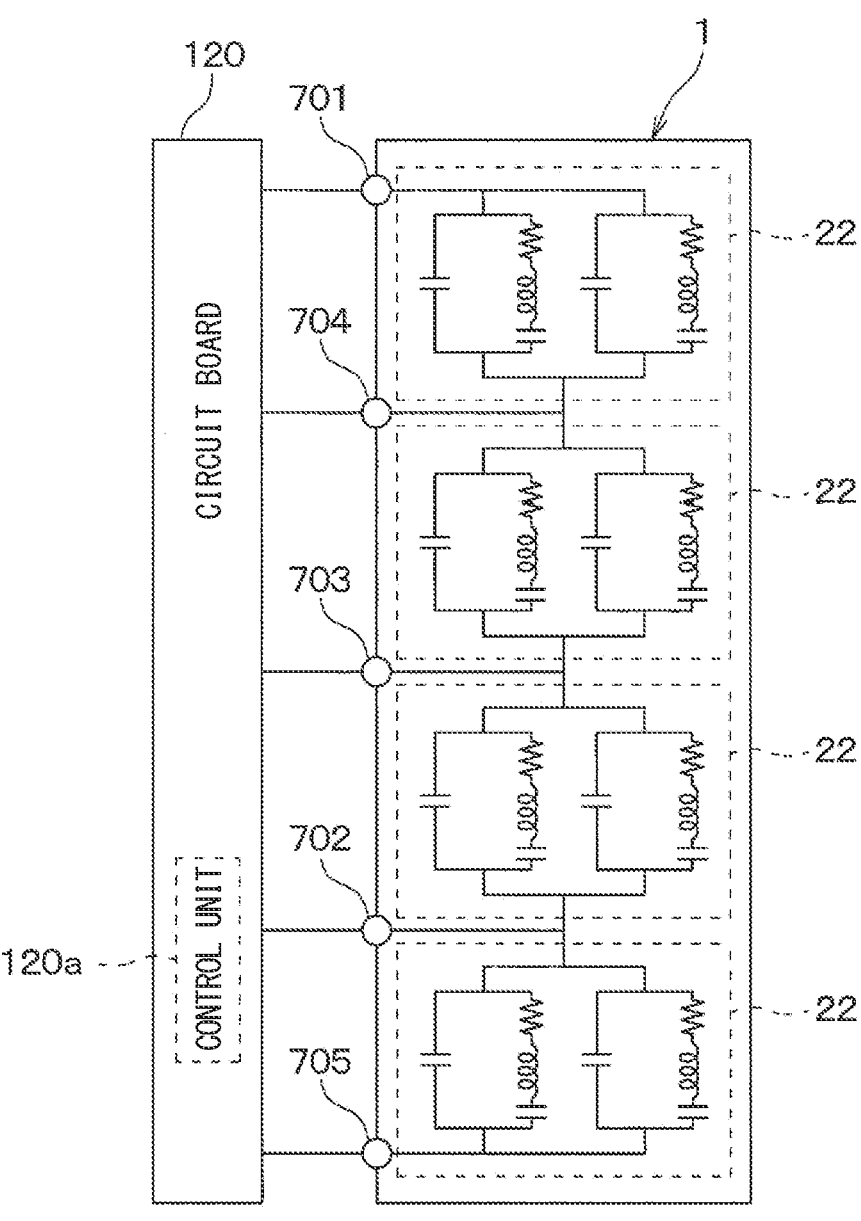
FIG. 37 is a circuit diagram of a piezoelectric device according to a sixteenth embodiment.

As shown in FIGS. 36 and 37, the piezoelectric element 1 of the present embodiment has first to fifth pad portions 701 to 705 that are electrically connected to each vibration region 22. The first to fifth pad portions 701 to 705 correspond to the pad portions 71c and 72c in the first embodiment. Then, in the piezoelectric element 1, each vibration region 22 is connected in parallel to the circuit board 120 via the first to fifth pad portions 701 to 705, as in FIG. 31 described in the modified example of the fourteenth embodiment, and is connected in series with each other.

The circuit board 120 performs predetermined signal processing, and in the present embodiment, the control unit 120a is arranged. The control unit 120a may be arranged separately from the circuit board 120.

Similar to the control unit of the fifteenth embodiment, the control unit 120a is a microcomputer or the like including a CPU, a memory having a non-transitory tangible storage medium such as a ROM, a RAM, a flash memory, and an HDD. Then, the control unit 120a of the present embodiment performs a self-diagnosis of the piezoelectric device.

Figure 38:
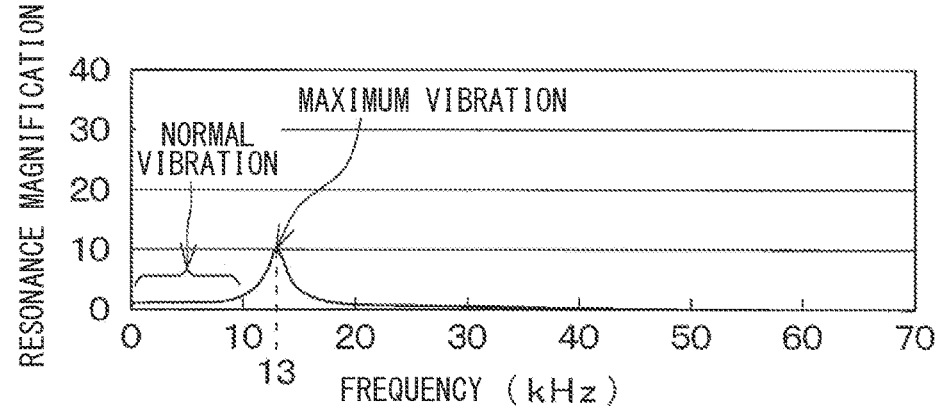
FIG. 38 is a diagram showing a relationship between a frequency and a resonance magnification in a vibration region.

Specifically, the control unit 120a of the present embodiment determines the abnormality of the piezoelectric element 1. Specifically, the control unit 120a vibrates each vibration region 22 by applying a predetermined voltage between the first pad unit 701 and the fifth pad unit 705 for the abnormality determination signal. More specifically, the control unit 120a normally vibrates each vibration region 22 at a frequency of sound pressure that can be applied to the vibration region 22 in actual sound pressure detection. In the present embodiment, as shown in FIG. 38, the vibration region 22 is formed so that the resonance frequency is 13 kHz, and it is assumed that the frequency of the sound pressure that can be applied to the piezoelectric element 1 is several kHz.

Therefore, the control unit 120a applies a predetermined voltage between the first pad unit 701 and the fifth pad unit 705 so that each vibration region 22 normally vibrates at several kHz. In this embodiment, it is assumed that the resonance frequency is 13 kHz and the frequency of the sound pressure that can be applied to the piezoelectric element 1 is several kHz. Therefore, the control unit 120a applies a predetermined voltage between the first pad unit 701 and the fifth pad unit 705 so as to normally vibrate at a frequency lower than the resonance frequency.

As a result, when each vibration region 22 is normal, a partial voltage corresponding to a predetermined voltage is applied from the second to fourth pad portions 702 to 704. On the other hand, when an abnormality such as a short circuit occurs between the vibration regions 22, the voltage output from the second to fourth pad portions 702 to 704 changes. Further, when an abnormality such as a disconnection occurs between the vibration regions 22, no voltage is output from the second to fourth pad portions 702 to 704. Therefore, the control unit 120a compares the voltages of the second to fourth pad units 702 to 704 with a predetermined threshold range to determine the abnormality.

Further, the control unit 120a of the present embodiment performs a self-diagnosis for estimating the pressure in the back space S2. Then, the control unit 120a corrects the pressure detection signal output from the piezoelectric element 1 based on the estimated pressure.

That is, in the above-mentioned piezoelectric device, the way of vibration of the vibration region 22 changes due to the fluctuation of the pressure in the back space S2. Specifically, the pressure in the back space S2 varies depending on the ambient temperature, humidity, altitude (i.e., location) and the like to be used. The higher the pressure in the back space S2, the more difficult it is for the vibration region 22 to vibrate, and the lower the pressure in the back space S2, the easier it is to vibrate. That is, in the above-mentioned piezoelectric device, the detection sensitivity may change depending on the usage environment. Therefore, in the present embodiment, the pressure in the back space S2 is estimated, and the pressure detection signal output from the piezoelectric element 1 is corrected based on the estimated pressure.

Specifically, the control unit 120a applies a pressure estimation signal to the piezoelectric element 1 to estimate and vibrate each vibration region 22 in order to estimate the pressure in the back space S2. In this case, the control unit 120a vibrates each vibration region 22 at the maximum vibration at the resonance frequency so that the vibration of each vibration region 22 becomes large. Then, the control unit 120a executes the following operations based on the difference between the voltage of the second to fourth pad units 702 to 704 when the pressure estimation signal is applied and the voltage of the second to fourth pad units 702 to 704 when the abnormality determination signal is applied. That is, the control unit 120a calculates the Q value as the resonance magnification and performs self-diagnosis to estimate the pressure in the back space S2 from the Q value.

When calculating the Q value, the specific calculation method may be changed as appropriate. For example, based on one of the differences between the voltage of the second to fourth pad portions 702 to 704 when the pressure estimation signal is applied and the voltage of the second to fourth pad portions 702 to 704 when the abnormality determination signal is applied, the Q value may be calculated.

Further, the Q value may be calculated based on the average of the differences between the voltage of the second to fourth pad portions 702 to 704 when the pressure estimation signal is applied and the voltage of the second to fourth pad portions 702 to 704 when the abnormality determination signal is applied.

Then, when detecting the sound pressure, the control unit 120a corrects the pressure detection signal output from the piezoelectric element 1 based on the estimated pressure in the back space S2. Specifically, the control unit 120a multiplies the pressure detection signal by a correction coefficient corresponding to the pressure in the back space S2, based on the case where the pressure in the back space S2 is atmospheric pressure, as a reference. For example, when the pressure in the back space S2 is larger than the atmospheric pressure, the vibration region 22 is less likely to vibrate, so that the control unit 120a corrects by multiplying the pressure detection signal by a value larger than 1 as a correction coefficient. On the other hand, when the pressure in the back space S2 is smaller than the atmospheric pressure, the vibration region 22 tends to vibrate easily, so that the control unit 120a corrects by multiplying the pressure detection signal by a value smaller than 1 as a correction coefficient. As a result, the pressure detection signal becomes a value corresponding to the pressure in the back space S2 (that is, the ease of vibration of the vibration region 22). The correction coefficient is derived in advance by an experiment or the like, and is stored in the control unit 120a in association with the pressure in the back space S2.

According to the present embodiment described above, since the self-diagnosis is performed, the detection accuracy can be improved. Specifically, since the abnormality determination of the piezoelectric element 1 is performed, the detection accuracy can be improved by stopping the detection of the sound pressure when there is an abnormality. Further, since the pressure in the back space S2 is estimated, the detection accuracy can be improved by performing the correction based on the estimated pressure.

Modified Example of Sixteenth Embodiment

The modification of the sixteenth embodiment will be described below. In the sixteenth embodiment, the control unit 120a may perform only one of the abnormality determination and the estimation of the pressure in the back space S2 as the self-diagnosis. Further, in the sixteenth embodiment, when estimating the pressure of the back space S2, the control unit 120a does not have to vibrate each vibration region 22 at the resonance frequency as long as the vibration is different from the normal vibration. Here, by vibrating each vibration region 22 at the maximum vibration at the resonance frequency, the difference from the normal vibration can be increased, and the estimation accuracy of the pressure in the back space S2 can be improved.

Seventeenth Embodiment

A seventeenth embodiment will be described. This embodiment defines the film thicknesses of the lower electrode film 61, the intermediate electrode film 62, and the upper electrode film 63 with respect to the first embodiment. Descriptions of the same configurations and processes as those of the ninth embodiment will not be repeated hereinafter.

Figure 39:
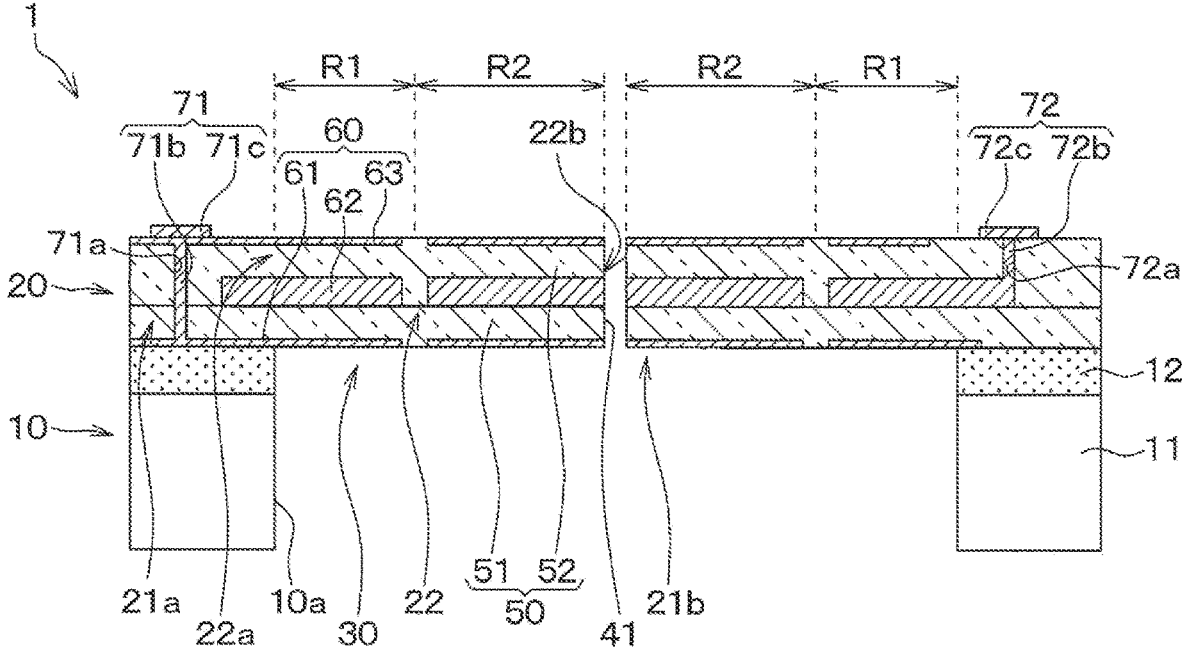
FIG. 39 is a cross-sectional view of a piezoelectric element according to a seventeenth embodiment.

As shown in FIG. 39, the piezoelectric element 1 in the present embodiment has the same configuration as that of the first embodiment. Here, in the present embodiment, the stress increasing slit 42 is not formed in the piezoelectric element 1.

In the present embodiment, the film thickness of the lower electrode film 61 and the film thickness of the upper electrode film 63 are thinner than the film thickness of the intermediate electrode film 62. For example, in the present embodiment, the film thickness of the lower electrode film 61 and the film thickness of the upper electrode film 63 are 25 nm, and the film thickness of the intermediate electrode film 62 is 100 nm. The film thickness of the lower piezoelectric film 51 between the lower electrode film 61 and the intermediate electrode film 62 and the film thickness of the upper layer piezoelectric film 52 between the intermediate electrode film 62 and the upper electrode film 63 are the same in the first implementations described above, and for example, 50 μm.

Further, the lower electrode film 61 and the upper electrode film 63 have the same rigidity. In the present embodiment, the lower electrode film 61 and the upper electrode film 63 are made of the same material, and the rigidity is made equal by making the film thickness equal.

In this embodiment, each of the lower electrode film 61, the intermediate electrode film 62, and the upper electrode film 63 arranged in the first region R1 and the second region R2 has the above configuration. Here, at least portions of the lower electrode film 61, the intermediate electrode film 62, and the upper electrode film 63 formed in the first region R1 may have the above described configuration. Further, in the present embodiment, the configurations of the lower electrode film 61, the intermediate electrode film 62, and the upper electrode film 63 correspond to the improvement unit.

As described above, in the present embodiment, the film thickness of the lower electrode film 61 and the film thickness of the upper electrode film 63 are thinner than the film thickness of the intermediate electrode film 62, and the rigidity of the lower electrode film 61 and the rigidity of the upper electrode film 63 are equalized. Therefore, the detection accuracy can be improved by improving the sensitivity.

Figure 40:
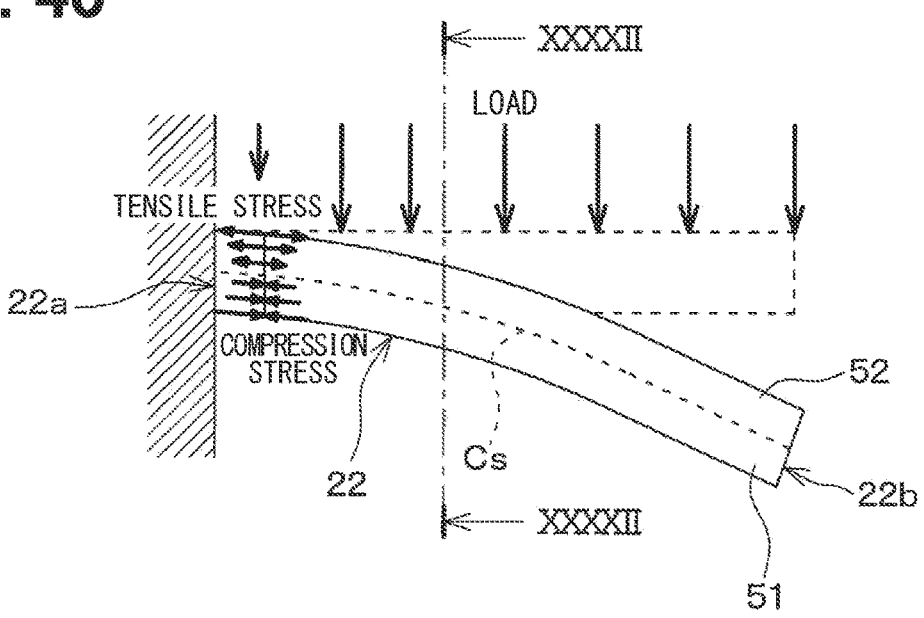
FIG. 40 is a schematic diagram when a load is applied to a vibration region.

That is, in each vibration region 22, the one end portion 22a is a fixed end and the other end portion 22b is a free end as described above. Therefore, as shown in FIG. 40, for example, in each vibration region 22, when a load (that is, sound pressure) is applied from the upper electrode film 63 side to the lower electrode film 61 side, the compression stress is applied to the lower piezoelectric film 51 side, and the tensile stress is applied to the upper piezoelectric film 52 side. The center portion of each vibration region 22 in the thickness direction is a neutral surface Cs to which neither the compression stress nor the tensile stress is applied.

Figure 41:
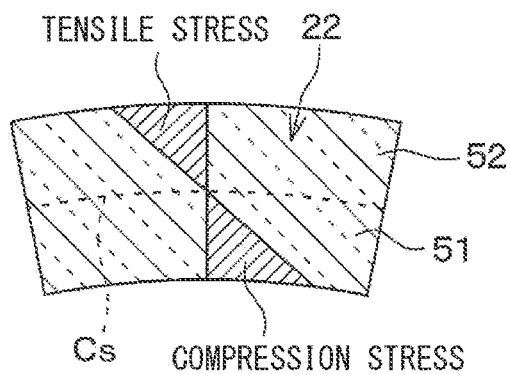
FIG. 41 is a schematic diagram showing stress on the side surface corresponding to FIG. 40.
Figure 42:
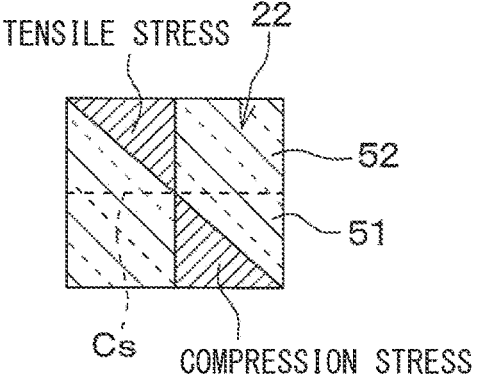
FIG. 42 is a schematic diagram showing stress in a cross section along the line XXXXII-XXXXII in FIG. 40.

In this case, as shown in FIGS. 41 and 42, the compression stress applied to the lower piezoelectric film 51 increases as the distance from the neutral plane Cs increases. Similarly, the tensile stress applied to the upper piezoelectric film 52 increases as the distance from the neutral surface Cs increases. Therefore, the lower piezoelectric film 51 and the upper piezoelectric film 52 are formed so as to include a position away from the neutral surface Cs, so that a portion having a large stress can be included. That is, the lower piezoelectric film 51 and the upper piezoelectric film 52 are formed so as to include a position away from the neutral surface Cs, so that a portion in which an electric charge is likely to be generated can be included. Here, when the film thickness of the lower piezoelectric film 51 is simply increased to include a position away from the neutral surface Cs, the distance between the lower electrode film 61 and the intermediate electrode film 62 becomes wider, so that the capacitance between the lower electrode film 61 and the intermediate electrode film 62 is reduced. Similarly, when the film thickness of the upper piezoelectric film 52 is simply increased to include a position away from the neutral surface Cs, the distance between the intermediate electrode film 62 and the upper electrode film 63 becomes wider, so that the capacitance between the intermediate electrode film 62 and the upper electrode film 63 is reduced.

Therefore, as in the present embodiment, by making the lower electrode film 61 thinner while making the intermediate electrode film 62 thicker, the lower piezoelectric film 51 can be formed to include a portion away from the neutral surface Cs without changing the film thickness of the lower piezoelectric film 51. Similarly, by making the upper electrode film 63 thinner while making the intermediate electrode film 62 thicker, the upper piezoelectric film 52 can be formed to include a portion away from the neutral surface Cs without changing the film thickness of the upper piezoelectric film 52. Therefore, the electric charge generated in the lower piezoelectric film 51 and the upper piezoelectric film 52 can be increased, and the detection accuracy can be improved by improving the sensitivity.

Further, the lower electrode film 61 and the upper electrode film 63 are made of molybdenum, copper, platinum, platinum, titanium or the like, and have Young's modulus larger than that of the scandium aluminum nitride and the like constituting the lower piezoelectric film 51 and the upper piezoelectric film 52. Therefore, the thicker the lower electrode film 61 and the upper electrode film 63, the more easily the deformation of the lower piezoelectric film 51 and the upper piezoelectric film 52 is inhibited. Therefore, as in the present embodiment, by making the film thicknesses of the lower electrode film 61 and the upper electrode film 63 thinner than the film thickness of the intermediate electrode film 62, it is possible to suppress the inhibition of deformation of the lower piezoelectric film 51 and the upper piezoelectric film 52, compared with a case where the film thicknesses of the lower electrode film 61 and the upper electrode film 63 are equal to the film thickness of the intermediate electrode film 62. Therefore, it is possible to suppress the decrease in sensitivity and improve the detection accuracy.

Further, the lower electrode film 61 and the upper electrode film 63 have the same rigidity. Therefore, it is possible to prevent the lower piezoelectric film 51 and the upper piezoelectric film 52 from being deformed differently when sound pressure is applied, and it is possible to suppress the overall deformation from being deteriorated.

Modified Example of Seventeenth Embodiment

The modification of the seventeenth embodiment will be described below. In the seventeenth embodiment, the lower electrode film 61 and the upper electrode film 63 may be configured as follows as long as the film thickness thereof is thinner than the intermediate electrode film 62, and the rigidity is equal to that of the intermediate electrode film 62. That is, the lower electrode film 61 and the upper electrode film 63 may be made of different materials and may be configured so that the rigidity becomes equal by adjusting the film thickness.

Eighteenth Embodiment

An eighteenth embodiment will be described. This embodiment defines the number of charge regions 620 based on the parasitic capacitance Cp with respect to the eleventh embodiment. Descriptions of the same configurations and processes as those of the eleventh embodiment will not be repeated hereinafter.

In the piezoelectric element 1 of the present embodiment, as in the eleventh embodiment, the first intermediate electrode film 62a is divided into a plurality of charge regions 620, and each charge region 620 is connected in series. Further, each charge region 620 has the same area and is connected in series with each other.

Here, the sensitivity (that is, the output voltage) of the piezoelectric element 1 is defined as $\Delta V$, the total capacitance of the sensing unit 30 is defined as Co, the parasitic capacitance is defined as Cp, and the acoustic-electricity conversion coefficient when converting the sound pressure into a voltage is defined as $\lceil$, and the number of charge regions 620 is defined ss n. The following equation 3 is established.

$$\Delta V = \lceil \times \{Co/(Co+Cp)\} \qquad \text{(Equation 3)}$$

The parasitic capacitance Cp is the sum of the capacitance of the portion connecting the piezoelectric element 1 (that is, the sensing unit 30) and the circuit board 120, the capacitance generated inside the circuit board 120, and the like. Further, the capacitance Co of the sensing unit 30 is proportional to $1/n^2$ because each charge region 620 is connected in series.

Figure 43A:
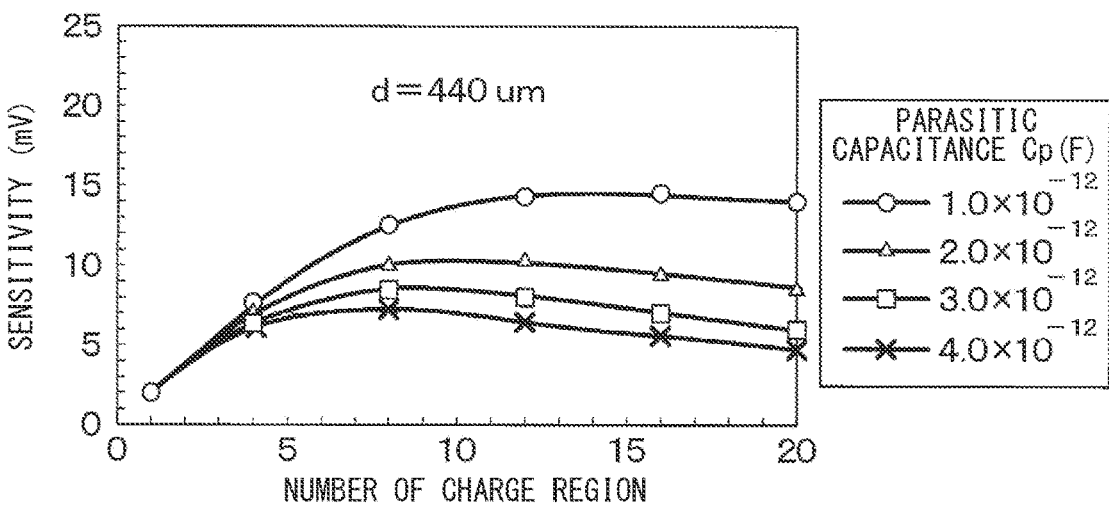
FIG. 43A is a diagram showing the relationship between the number of electrode regions and sensitivity when the length of the vibration region in the eighteenth embodiment is 440 μm.
Figure 43B:
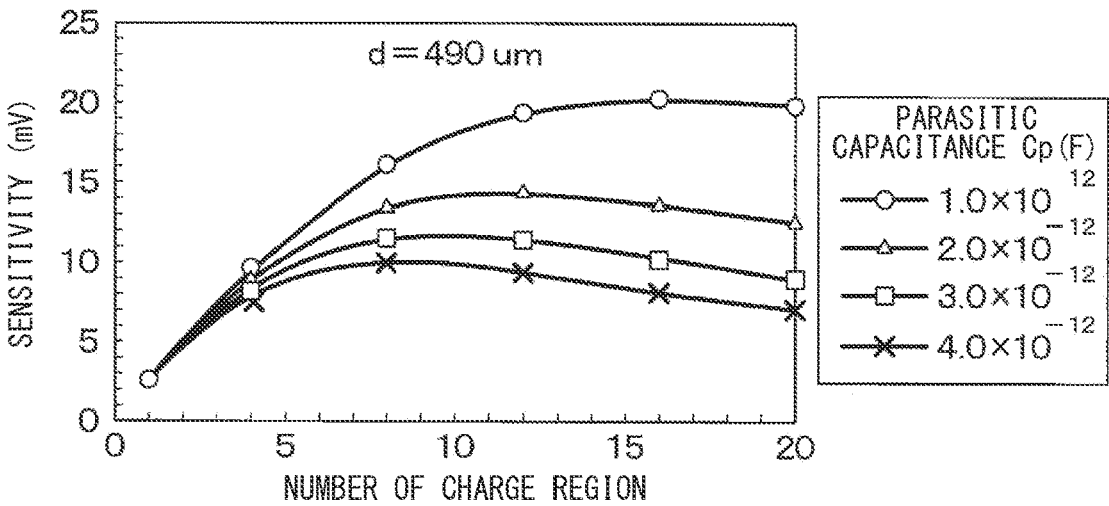
FIG. 43B is a diagram showing the relationship between the number of electrode regions and sensitivity when the length of the vibration region in the eighteenth embodiment is 490 μm.
Figure 43C:
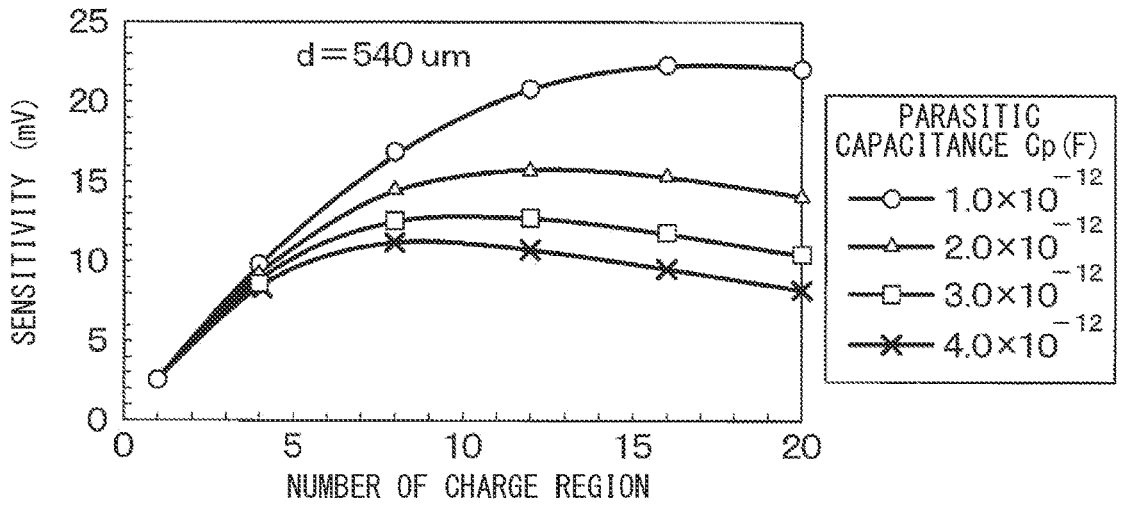
FIG. 43C is a diagram showing the relationship between the number of electrode regions and sensitivity when the length of the vibration region in the eighteenth embodiment is 540 μm.

Therefore, as shown in FIGS. 43A to 43C, the length from the one end portion 22a to the other end portion 22b in the vibration region 22 is defined as the length d, the sensitivity is changed according to the length d, the number of charge regions 620, and the parasitic capacitance Cp. At present, it may be desired to increase the sensitivity, and the range from the maximum sensitivity to about 90% may be practical. Therefore, in the present embodiment, the number of charge regions 620 is set so as to set the maximum sensitivity to be 90% or more. For example, as shown in FIG. 43B, when the length d from one end portion 22a to the other end portion 22b in the vibration region 22 is 490 μm and the parasitic capacitance Cp is $2.0 \times 10^{-12}$ F, and the number of the charge regions 620 is 8 to 16, the sensitivity can be lowered. That is, the sensitivity can be lowered by setting the number of the charge regions 620 in each vibration region 22 in a range between 2 and 4.

In the present embodiment described above, the number of charge regions 620 is defined to set the maximum sensitivity to be 90% or more. Therefore, the detection accuracy can be improved by improving the sensitivity.

Nineteenth Embodiment

A nineteenth embodiment will be described. In this embodiment, the acoustic compliance Cf of the pressure receiving surface space S1, the acoustic compliance Cb of the back space S2, the acoustic resistance Rg of the separation slit 41, and the like are adjusted when the piezoelectric device is configured as in the ninth embodiment. Descriptions of the same configurations and processes as those of the ninth embodiment will not be repeated hereinafter.

Figure 44:
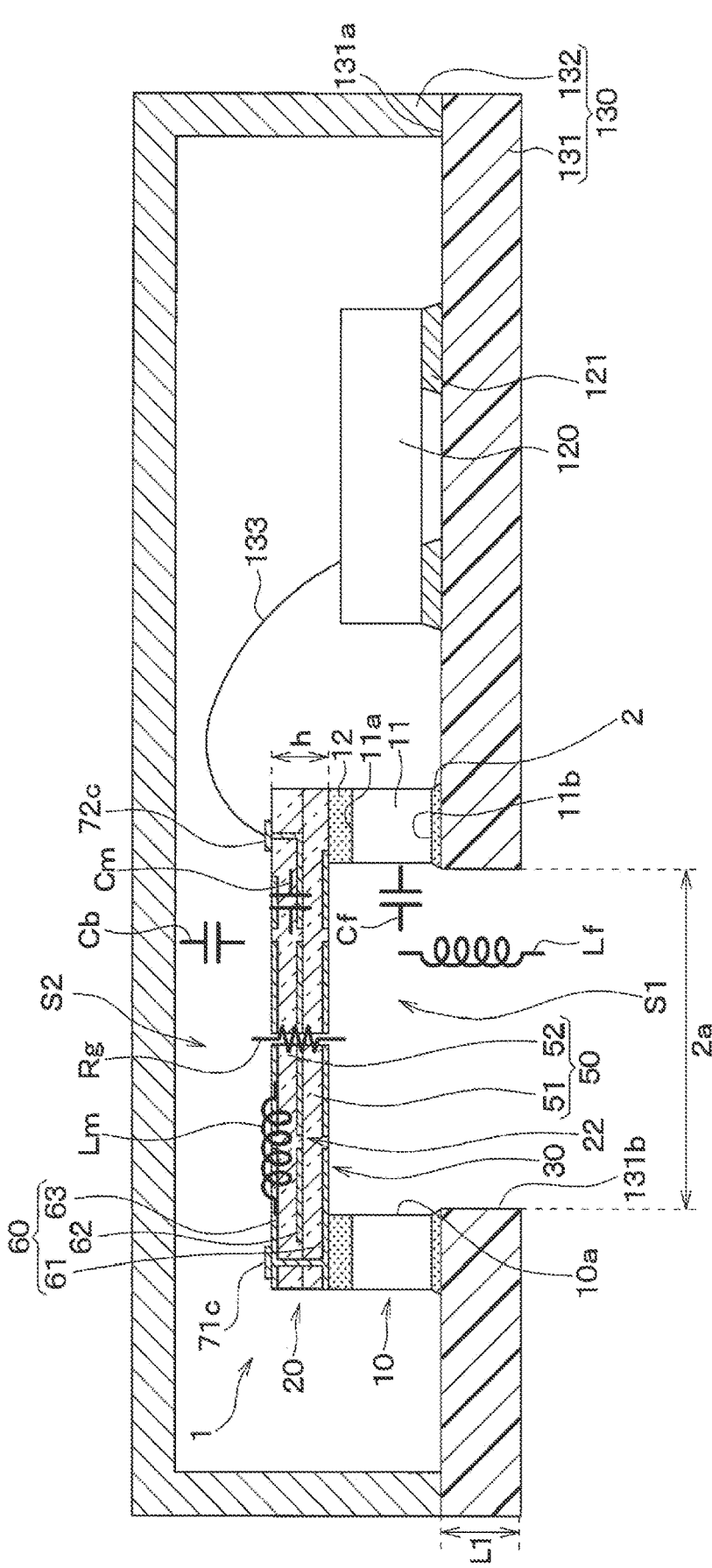
FIG. 44 is a cross-sectional view of a piezoelectric device according to a nineteenth embodiment.

As shown in FIG. 44, the piezoelectric device of the present embodiment is configured such that the other surface 11b of the support substrate 11 in the piezoelectric element 1 is mounted on one surface 131a of the printed circuit board 131 via the bonding member 2. Then, in the present embodiment, the through hole 131b is formed in the printed circuit board 131 as in the piezoelectric device described with reference to FIG. 17 of the tenth embodiment. Therefore, in the present embodiment, the sound pressure is detected by applying the sound pressure to the sensing unit 30 through the through hole 131*b*. Then, in the present embodiment, the space between the portion where the through hole 131*b* is formed and the sensing portion 30 in the casing 130 is the pressure receiving surface space S1. Further, the back space S2 includes a space located on the opposite side of the pressure receiving surface space S1 with the sensing unit 30 interposed therebetween, and is continuous with the space without passing through the separation slit 41.

In this embodiment, the recessed structure is not formed on the support substrate 11 of the piezoelectric element 1, but the recessed structure may be formed on the support substrate 11. Further, although the piezoelectric element 1 of the present embodiment does not have the stress increasing slit 42 as in the first embodiment, the stress increasing slit 42 or the like may be formed. Hereinafter, the piezoelectric device configured as shown in FIG. 44 will be described as an example, but the following configuration can also be applied to the piezoelectric device using the piezoelectric element 1 of each of the above embodiments.

First, the sensitivity of the piezoelectric device depends on the low frequency roll-off frequency, the resonance frequency of the piezoelectric element 1, and the Helmholtz frequency. Specifically, the low frequency roll-off frequency is defined as fr, and the low frequency roll-off frequency fr is expressed by the following equation 4. The resonance frequency of the piezoelectric element 1 is defined as fmb, the resonance frequency fmb is expressed by the following equation 5. The Helmholtz frequency is defined as fh, the Helmholtz frequency fh is expressed by the following equation 6.

$$fr = \frac{1}{2\pi \times Rg \times Cb} \quad \text{(Equation 4)}$$

$$fmb = \frac{1}{2\pi \times \left\{ Lm \times \dfrac{1}{\left(\dfrac{1}{Cb} + \dfrac{1}{Cm}\right)} \right\}^{0.5}} \quad \text{(Equation 5)}$$

$$fh = \frac{1}{2\pi \times (Lf \times Cf)^{0.5}} \quad \text{(Equation 6)}$$

In addition, Lm in the equation 5 is a constant proportional to the total mass in each vibration region 22 of the piezoelectric element 1. Lf in Equation 6 is the inertance of the through hole 132*a*.

The inertance Lf of the through hole 132*a* is represented by the following equation 7. Further, the acoustic compliance Cf of the pressure receiving surface space S1 is expressed by the following equation 8. The acoustic compliance Cb of the back space S2 is expressed by the following equation 9. The acoustic resistance Rg of the separation slit 41 is expressed by the following equation 10.

$$Lf = \rho0 \times \frac{(L1 + 1.7 \times a)}{(\pi \times a^2)} \quad \text{(Equation 7)}$$

$$Cf = \frac{Vf}{\rho0 \times c^2} \quad \text{(Equation 8)}$$

$$Cb = \frac{Vb}{\rho0 \times c^2} \quad \text{(Equation 9)}$$

-continued $$Rg = \frac{3 \times \mu \times h}{\sqrt{2} \times g^3 \times L2} \quad \text{(Equation 10)}$$

In Equations 7 to 10, $\rho0$ is the air density, a is the radius of the through hole 132*a*, and L1 is the thickness of the printed circuit board 131 (that is, the length of the through hole 132*a*). Further, Vf is the volume of the pressure receiving surface space S1, Vb is the volume of the back space S2, and c is the speed of sound. $\mu$ is the frictional resistance of air, h is the thickness of the vibration region 22, g is the width of the separation slit 41, and L2 is the length of the separation slit 41 in each vibration region 22. The width g of the separation slit 41 is the distance between the portions where the side surfaces of the vibration regions 22 face each other, and is, for example, the width of the portions shown in FIG. 36. The length L2 of the separation slit 41 is, for example, the length of the portion shown in FIG. 36.

Figure 45:
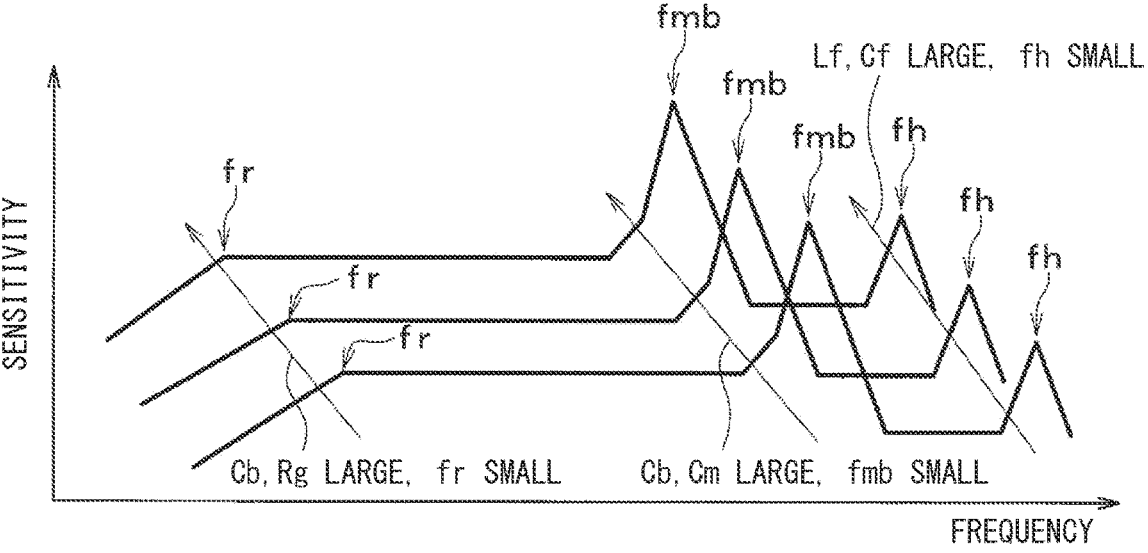
FIG. 45 is a diagram showing the relationship between frequency and sensitivity.

As shown in FIG. 45, the piezoelectric device of the present embodiment is configured such that the frequency increases in the order of the low frequency roll-off frequency fr, the resonance frequency fmb of the piezoelectric element 1, and the Helmholtz frequency fh. Specifically, each frequency has a value based on the acoustic compliance Cf of the pressure receiving surface space S1, the acoustic compliance Cb of the back space S2, and the acoustic resistance Rg of the separation slit 41, as shown in the above equations 4 to 6. Therefore, the values of each frequency are adjusted by adjusting the acoustic compliance Cf of the pressure receiving surface space S1, the acoustic compliance Cb of the back space S2, and the acoustic resistance Rg of the separation slit 41.

More specifically, the low frequency roll-off frequency fr becomes smaller as the acoustic compliance Cb and the acoustic resistance Rg are increased. The resonance frequency fmb of the piezoelectric element 1 becomes smaller as the acoustic compliance Cm and the acoustic compliance Cb are increased. In the present embodiment, the resonance frequency fmb of the piezoelectric element 1 is adjusted by adjusting the acoustic compliance Cb. The Helmholtz frequency fh becomes smaller as the inertance Lf and the acoustic compliance Cf are increased. In this embodiment, the Helmholtz frequency fh is adjusted by adjusting the acoustic compliance Cf. As a result, the piezoelectric device is generally used for detecting the sound pressure of the frequency between the low frequency roll-off frequency fr and the resonance frequency fmb, so that the frequency at which sensitivity can be maintained is increased, compared with the case where the Helmholtz frequency fh is made smaller than the resonance frequency fmb of the piezoelectric element 1.

Further, in the present embodiment, the acoustic compliance Cf, the acoustic compliance Cb, and the acoustic resistance Rg are adjusted so that the low frequency roll-off frequency is 20 Hz or less and the Helmholtz frequency is 20 kHz. That is, in the present embodiment, the low frequency roll-off frequency fr and the Helmholtz frequency fh are set to values outside the audible range. Therefore, in the piezoelectric device of the present embodiment, it is possible to increase the frequency at which the sensitivity in the audible range can be maintained. The resonance frequency fmb of the piezoelectric element 1 is, for example, 13 kHz.

Here, in order to reduce the low frequency roll-off frequency to 20 Hz or less, the following may be performed. That is, the acoustic resistance Rg that affects the low frequency roll-off frequency fr is expressed by the above equation 10. Therefore, in order to set the low frequency roll-off frequency to 20 Hz or less, the above equation 4 may be set to 20 Hz or less, and the acoustic resistance Rg should satisfy Rg≥1/(40n×Cb). Therefore, the width g of the separation slit 41 may be formed so as to satisfy the following equation 11.

$$g^3 \leqq \frac{3 \times \mu \times h \times 40\pi \times Cb}{\sqrt{2} \cdot L2} \qquad \text{(Equation 11)}$$

Figure 46:
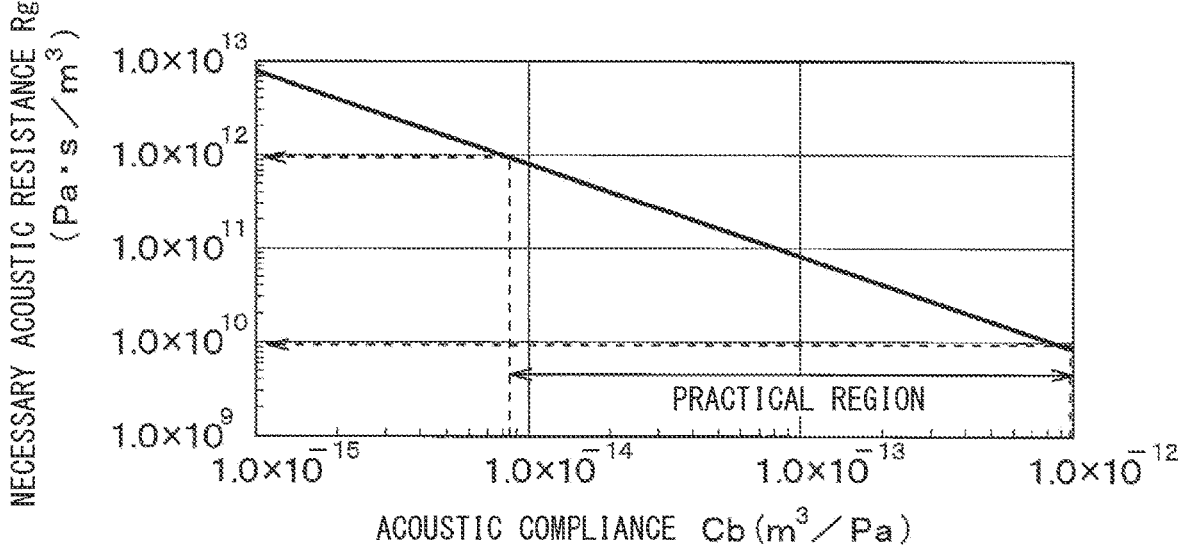
FIG. 46 is a diagram showing the relationship between acoustic compliance in the back space and required acoustic resistance.
Figure 47:
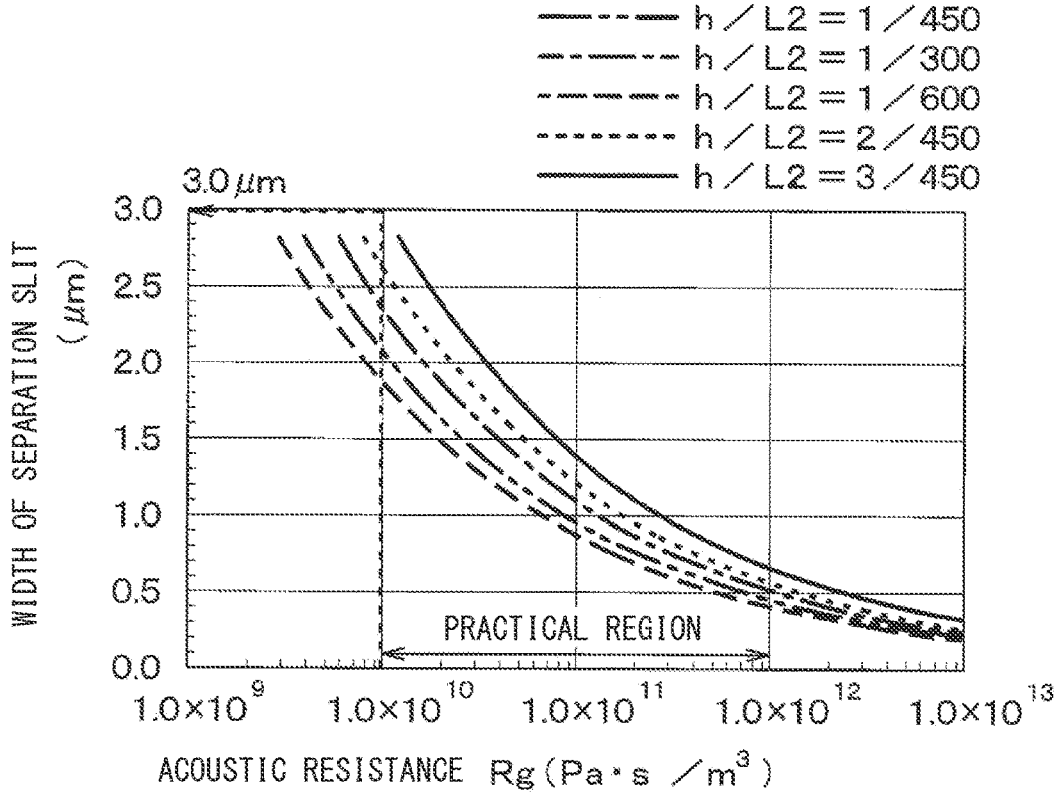
FIG. 47 is a diagram showing the relationship between acoustic resistance and the width of a separation slit.

Then, the acoustic resistance Rg required to set the low frequency roll-off frequency fr to 20 Hz or less is shown in FIG. 46 in relation to the acoustic compliance Cb of the back space S2. In this case, the relationship between the realistic thickness h of the vibration region 22 and the length L2 of the separation slit 41 and the width g of the separation slit 41 is shown in FIG. 47. Therefore, as shown in FIG. 47, when the width g of the separation slit 41 is 3 μm or less, the low frequency roll-off frequency can be set to 20 Hz or less.

Figure 48:
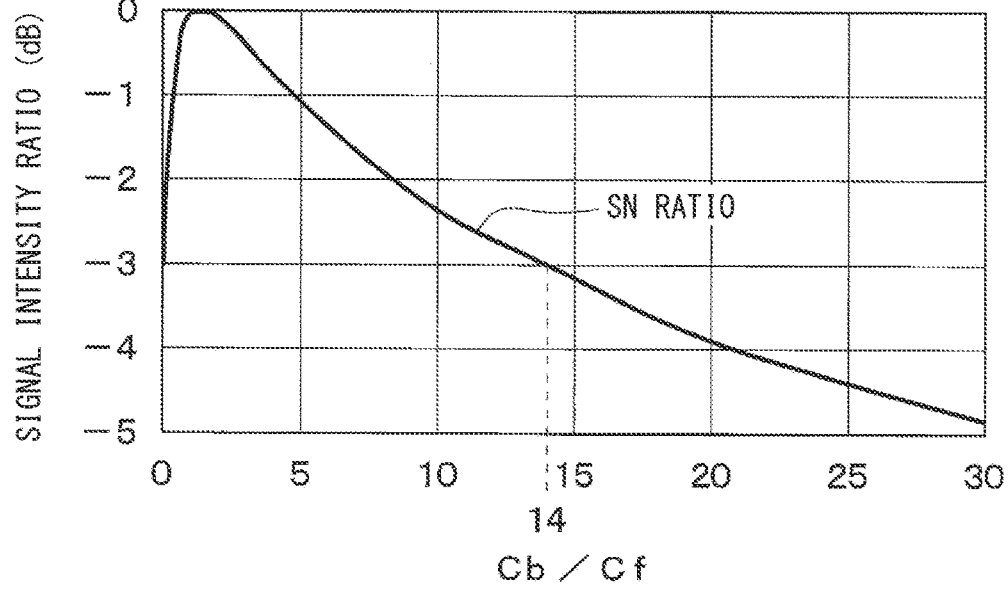
FIG. 48 is a diagram showing the relationship between the ratio of the acoustic compliance of the back space to the acoustic compliance of the pressure receiving surface space and the signal intensity ratio.

Further, in the above-mentioned piezoelectric device, when sound pressure is introduced into the pressure receiving surface space S1, the larger the volume of the back space S2, the higher the sensitivity may tend to be, and the SN ratio, which is the ratio of the signal and noise, may tend to increase. In this case, as shown in FIG. 48, the signal intensity ratio (dB) is −3*d*B or less, which is generally noisy with respect to the reference, when Cb/Cf, which is the ratio of the acoustic compliance Cb to the acoustic compliance Cf, is 14 or less. The reference here is based on the SN ratio when the signal is the largest. Further, −3 dB or less with respect to the reference is a range in which it is difficult for human hearing to perceive a change. Therefore, in this embodiment, Cb/Cf is set to 14 or less. This makes it possible to reduce noise.

Further, in the piezoelectric device as described above, the detection is performed by vibrating the vibration region 22. Further, in the above-mentioned piezoelectric device, even in a state where sound pressure is not introduced into the pressure receiving surface space S1, air molecules collide with the vibration region 22 from the pressure receiving surface space S1 side and the back space S2 side due to Brownian motion. In this case, if the collision of the air molecules from the pressure receiving surface space S1 side and the collision of the air molecules from the back space S2 side are different, the vibration region 22 vibrates unnecessarily and causes noise.

Therefore, in order to reduce noise related to unnecessary vibration, it may be preferable to make the volume of the pressure receiving surface space S1 equal to the volume of the back space S2. This makes it possible to reduce noise related to unnecessary vibration.

As described above, in the present embodiment, the acoustic compliance Cf, the acoustic compliance Cb, and the acoustic resistance Rg are adjusted so that the low frequency roll-off frequency fr, the resonance frequency fmb of the piezoelectric element 1, and the Helmholtz frequency fh increase in this order. Therefore, the frequency at which the sensitivity can be maintained can be increased as compared with the case where the Helmholtz frequency fh is smaller than the resonance frequency fmb of the piezoelectric element 1.

Further, in the present embodiment, the low frequency roll-off frequency fr is set to 20 Hz or less, and the Helmholtz frequency fh is set to 20 kHz or more. Therefore, the sensitivity in the audible range can be maintained. In this case, since the width g of the separation slit 41 is 3 μm or less, the low frequency roll-off frequency fr can be set to 20 Hz or less.

Further, in the present embodiment, the ratio of Cb/Cf is set to 14 or less. Therefore, noise can be reduced.

Further, in the present embodiment, by making the volume of the pressure receiving surface space S1 equal to the volume of the back space S2, it is possible to reduce noise related to unnecessary vibration.

OTHER EMBODIMENTS

Although the present disclosure has been described in accordance with embodiments, it is understood that the present disclosure is not limited to such embodiments or structures. The present disclosure encompasses various modifications and variations within the scope of equivalents. In addition, various combinations and configurations, as well as other combinations and configurations that include only one element, more, or less, are within the scope and spirit of the present disclosure.

For example, in each of the above embodiments, the vibration unit 20 may be configured to have at least one layer of the piezoelectric film 50 and at least one layer of the electrode film 60.

Further, in each of the above embodiments, the floating region 21*b* of the vibration unit 20 may be divided into three or less vibrating regions 22 instead of being divided into four vibrating regions 22. Alternatively, the region 21*b* may be divided into five or more vibration regions 22.

Then, in each of the above embodiments, the sensing unit 30 may include only one vibration region 22. That is, for example, in the first embodiment, the four sensing units 30 may be configured by the four vibration regions 22 provided by one floating region 21*b*. In this case, in the seventh embodiment, the configuration has only one floating region 21*b*, and a plurality of vibration regions 22 are configured in the floating region 21*b*, so that the resonance frequencies of the respective vibration regions 22 are different.

Further, in the first embodiment, the separation slit 41 may be formed so as to reach the corner portion of the floating region 21*b* without forming the stress increasing slit 42, and the corner portion C1 may be configured by recessing the separation slit 41 in the first region R1 inward.

Further, in the third embodiment, the one end portion 22*a* of the vibration region 22 may have a shape having a portion expanding on the opposite side to the other end portion 22*b* side with respect to the virtual line K1, and may be formed not to have an arc shape. Similarly, in the fourth embodiment, the one end portion 22*a* of the vibration region 22 may have a shape having a portion expanding on the opposite side to the other end portion 22*b* side with respect to the virtual line K2, and may be formed not to have an arc shape.

Further, in the fifth embodiment, the hard film 82 may be uniformly formed between the first region R1 side and the other end portion 22*b* side in the second region R2, or may be formed more densely in the first region R1 side than the other end portion 22*b* side. Further, in the fifth embodiment, the hole portion 81 in which the hard film 82 is embedded may not be formed so as to penetrate the upper electrode film 63, the upper piezoelectric film 52, the intermediate electrode film 62, and the lower piezoelectric film 51. For example, the hole portion 81 may be formed so as to penetrate only the upper electrode film 63 and the upper piezoelectric film 52. That is, the depth of the hard film 82 formed in the second region R2 may be appropriately changed. Further, in the fifth embodiment, the hard film 82 may not be made of the same material as the first and second electrode portions 71 and 72, and the material thereof may be not particularly limited as long as the material has a Young's modulus higher than that of the piezoelectric film 50.

Further, in the sixth embodiment, the stress increasing slit 42 may not be formed. Even with such a piezoelectric element 1, it is possible to suppress a decrease in detection accuracy. Further, in the sixth embodiment, the temperature detection element 91 and the heat generating element 92 may be arranged in the portion where the lower electrode film 61 is formed, or may be arranged in the portion where the upper electrode film 63 is formed. Further, in the sixth embodiment, the temperature detection element 91 and the heat generation element 92 may be formed in the first region R1. Further, as described in the seventh embodiment and the like, the stress increasing slit 42 is not formed in each of the seventh and subsequent embodiments. Here, the stress increasing slit 42 may be appropriately formed in each embodiment. Further, in the sixteenth embodiment, the detection accuracy can be improved by operating the control unit 120*a*. Therefore, in the sixteenth embodiment, the improvement unit may not be formed on the piezoelectric element 1.

Further, in the seventh embodiment, when the resonance frequency of each vibration region 22 in each sensing unit 30 is different, the configuration of the vibration region 22 may be appropriately changed. For example, the resonance frequency of each vibration region 22 in each sensing unit 30 may be different depending on the film thickness and the material.

When the film thickness and the material of each vibration region 22 in each sensing unit 30 are different, for example, a mask is appropriately arranged when forming the piezoelectric film 50 constituting the vibration region 22, so that the film thickness and the material may be changed. Further, for example, the film thickness and the material are made different by adjusting the film thickness by etching or the like after forming the piezoelectric film 50, or by forming another piezoelectric film 50 on the etched portion again. Here, when another piezoelectric film 50 is formed again on the etched portion, for example, by tapering the side surface of the etched portion, it may be preferable because it is difficult to form a void between the etched portion and another piezoelectric film 50 to be newly formed. In this way, when the film thickness and the material are different, it is possible to easily select the optimum one according to the intended use. Further, the film thickness and the material of each vibration region 22 may be changed while having different lengths between the one end portion 22*a* and the other end portion 22*b*.

In addition, each of the above embodiments can be combined as appropriate. For example, the first embodiment may be appropriately combined with each of the above embodiments so that the corner portion C1 is formed in a portion of the first region R1 floating from the support member 10. The second embodiment may be appropriately combined with each of the above embodiments so that the corner portion C2 is formed at one end portion of the first region R1. The third embodiment may be appropriately combined with each of the above embodiments so that the open end of the recess portion 10*a* has a circular shape. The fourth embodiment is appropriately combined with each of the above embodiments, the open end of the recess portion 10*a* is formed into a circular shape, a separation slit 41 is formed in the floating region 21*b*, and the separation slit 41 is terminated in the floating region 21*b*. The fifth embodiment may be appropriately combined with each of the above embodiments, and the hard film 82 may be arranged in the second region R2. The sixth embodiment may be appropriately combined with each of the above embodiments, and the temperature detection element 91 and the heat generating element 92 may be arranged. The seventh embodiment may be appropriately combined with each of the above embodiments to include a plurality of sensing units 30. The eighth embodiment may be appropriately combined with each of the above embodiments so that the protection film 100 is provided on the side surface of the recess portion 10*a*. The ninth embodiment may be appropriately combined with each of the above embodiments to form a recessed structure on the side surface 11*c* of the support substrate 11. The tenth embodiment may be combined with each of the above embodiments so that the piezoelectric element 1 is flip-chip mounted on the printed circuit board 131. The eleventh embodiment may be appropriately combined with each of the above embodiments to change the shape of the intermediate electrode film 62. The twelfth and thirteenth embodiments may be combined with each of the above embodiments, and the method of partitioning the first region R1 and the second region R2 may be changed. The fourteenth embodiment may be combined with each of the above embodiments so that each vibration region 22 is connected in parallel to the circuit board 120 while warping each vibration region 22. The fifteenth embodiment may be combined with each of the above embodiments to include a reflection film 140. The sixteenth embodiment may be combined with each of the above embodiments to perform self-diagnosis when the piezoelectric device is configured. By combining the seventeenth embodiment with each embodiment, the lower electrode film 61 and the upper electrode film 63 are thinner than the intermediate electrode film 62, and the rigidity of the lower electrode film 61 and the rigidity of the upper layer electrode film 63 are made equal to each other. The eighteenth embodiment may be combined with each embodiment and the number of charge regions 620 may be adjusted to set the maximum sensitivity to be 90% or more. The nineteenth embodiment may be combined with each embodiment and so that the low frequency roll-off frequency fr, the resonance frequency fmb of the piezoelectric element 1, and the Helmholtz frequency fh are adjusted to increase in this order. Then, the combination of the above embodiments can be further combined. In addition, in each of the above-mentioned embodiments and combinations of each embodiment, it is possible to make a configuration excluding a part of the configuration requirements as necessary. For example, as described above, the stress increasing slit 42 may not be formed in the sixth embodiment or the like.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A piezoelectric element comprising:
   a vibration unit that outputs a pressure detection signal according to a pressure; and a support member, wherein:

the vibration unit is arranged on the support member;

the vibration unit includes a piezoelectric film and an electrode film that is connected to the piezoelectric film and is configured to extract an electric charge generated by a deformation of the piezoelectric film;

the vibration unit further includes a support region supported by the support member and a plurality of vibration regions connected to the support region and separated from the support member;

the vibration unit is configured to output the pressure detection signal based on the electric charge;

each of the plurality of vibration regions has one end portion, which is a boundary with the support region and is a fixed end, and an other end portion, which is a free end;

a part of each of the plurality of vibration regions on a one end portion side is defined as a first region;

another part of each of the plurality of vibration regions on an other end portion side is defined as a second region;

the electrode film is disposed in the first region; and the piezoelectric element further comprising: an improvement unit for improving a detection accuracy of the pressure detection signal, wherein:

the plurality of vibration regions include a deformation promoting structure that promotes a deformation of the first region as the improvement unit, the plurality of vibration regions are divided from each other by a separation slit in the piezoelectric film and the electrode film, the separation slit extends radially from the free end to an end on a support region side, each vibration region of the plurality of vibration regions includes at least a stress increasing slit in the piezoelectric film and the electrode film, the stress increasing slit connects to the end of the separation slit on the support region side, the stress increasing slit extends at an angle from the separation slit and ends at the one end portion on the support region side to divide each vibration region;

the deformation promoting structure is a corner portion having sides defined by the separation slit and the stress increasing slit; and the corner portion is in the first region, and a vertex of the corner portion is disposed at an intersection of the separation slit and the stress increasing slit.

2. The piezoelectric element according to claim 1, wherein:

the deformation promoting structure is configured by the one end portion of the first region having a shape of the corner portion.

3. The piezoelectric element according to claim 1, wherein:

the corner portion has a curved shape with a curvature.

4. The piezoelectric element according to claim 1, wherein:

a separated part of each vibration region of the plurality of vibration regions has an outline with two ends on the support region side;

the two ends are terminated at the separated part, respectively; and the deformation promoting structure is a shape of the one end portion of each vibration region of the plurality of vibration regions, which expands to an opposite side of the other end portion with respect to a virtual line connecting the two ends.

5. The piezoelectric element according to claim 1, wherein:

the second region includes a hole portion and a hard film arranged in the hole portion as the deformation promoting structure that has a Young's modulus higher than the piezoelectric film.

6. The piezoelectric element according to claim 5, wherein:

the hard film is arranged more densely on the other end portion side than on a first region side.

7. The piezoelectric element according to claim 5, wherein:

the hard film is made of a same material as the electrode film.

8. A piezoelectric device comprising:

the piezoelectric element according to claim 1 having the vibration unit that outputs the pressure detection signal according to the pressure; and a casing having: a mount member on which the piezoelectric element is mounted; a lid portion fixed to the mount member while accommodating the piezoelectric element; and a through hole that communicates with an outside of the piezoelectric device to introduce the pressure.

9. The piezoelectric device according to claim 8, further comprising:

a circuit board mounted on the mount member, wherein:

the piezoelectric element has a connection pad portion electrically connected to the electrode film on the piezoelectric film, and is flip-chip mounted on the mount member;

the connection pad portion is electrically connected to the circuit board via a wiring portion disposed on the mount member; and the connection pad portion is arranged on a circuit board side.

10. The piezoelectric device according to claim 9, wherein:

the piezoelectric element has a dummy pad portion which is disposed on the piezoelectric film in a floating state; and the connection pad portion and the dummy pad portion are arranged symmetrically with respect to a center of a surface of the piezoelectric element parallel to a surface direction of the mount member.

11. The piezoelectric device according to claim 8, wherein:

a space inside the casing different from a pressure receiving surface space located between the through hole and the vibration unit is defined as a back space;

an acoustic compliance of the piezoelectric element is defined as $Cm$;

a capacity of the back space is defined as $Cb$; and a value of $Cb/Cm$ is 2 or less.

12. The piezoelectric device according to claim 8, wherein:

the vibration unit has the separation slit for partitioning the plurality of vibration regions;

a space inside the casing located between the through hole and the vibration unit is defined as a pressure receiving surface space;

a space inside the casing different from the pressure receiving surface space is defined as a back space; and an acoustic compliance of the piezoelectric element, an acoustic compliance of the pressure receiving surface space, an acoustic compliance of the back space, and an acoustic resistance of the separation slit are adjusted to have a low frequency roll-off frequency, a resonance frequency of the piezoelectric element, and a Helmholtz frequency, which are increased in this order.

13. The piezoelectric device according to claim 12, wherein:

the low frequency roll-off frequency is 20 Hz or less; and the Helmholtz frequency is 20 kHz or more.

14. The piezoelectric device according to claim 13, wherein:

the separation slit has a width of 3 μm or less.

15. The piezoelectric device according to claim 8, wherein:

an acoustic compliance of a pressure receiving surface space is defined as Cf;

an acoustic compliance of a back space is defined as Cb; and a value of Cb/Cf is 14 or less.

16. The piezoelectric device according to claim 8, wherein:

a space inside the casing located between the through hole and the vibration unit is defined as a pressure receiving surface space;

a space inside the casing different from a pressure receiving surface space is defined as a back space; and a volume of the pressure receiving surface space and a volume of the back space are equal to each other.

17. The piezoelectric device according to claim 8, further comprising:

a control unit that performs a predetermined processing;

in the piezoelectric element, the plurality of vibration regions are connected in parallel to the control unit, and the plurality of vibration regions are connected in series; and the control unit performs self-diagnosis of the piezoelectric element by applying a predetermined voltage to vibrate the plurality of vibration regions.

18. The piezoelectric device according to claim 17, wherein:

as the self-diagnosis, the control unit executes an abnormality determination of the piezoelectric element based on a voltage between the plurality of vibration regions connected in series by vibrating the plurality of vibration regions so as to be a normal vibration based on the pressure that is to be applied to the piezoelectric element.

19. The piezoelectric device according to claim 17, wherein:

a space inside the casing different from another space located between the through hole and the vibration unit is defined as a back space;

the control unit, as the self-diagnosis, calculates a resonance magnification by calculating a difference between a voltage between the plurality of vibration regions when the plurality of vibration regions are vibrated so as to be a normal vibration based on the pressure that is to be applied to the piezoelectric element and a voltage between the plurality of vibration regions when the plurality of vibration regions are vibrated so as to be an estimation vibration different from the normal vibration, estimates a pressure in the back space based on the resonance magnification, and corrects the pressure detection signal based on an estimated pressure in the back space.

20. The piezoelectric device according to claim 19, wherein:

the control unit vibrates the plurality of vibration regions at a resonance frequency as the estimation vibration.

21. The piezoelectric element according to claim 1, wherein:

the stress increasing slit extends in a direction normal to a direction of the separation slit.

22. The piezoelectric element according to claim 1, further comprising:

a plurality of the separation slits dividing the plurality of vibration regions from each other, and each vibration region of the plurality of vibration regions includes two of the corner portions.

23. The piezoelectric element according to claim 1, wherein each vibration region of the plurality of vibration regions has a shape in which the one end portion at the boundary with the support region has a planar arc shape.

24. The piezoelectric element according to claim 1, wherein each vibration region of the plurality of vibration regions has a shape in which the one end portion at the boundary with the support region protrudes from a virtual straight line in a direction away from the free end of each vibration region, and has two of the separation slits, wherein the virtual straight line connects the separation slits where the separation slits end at the one end portion.

\* \* \* \* \*